US012735635B2

(12) United States Patent
Sim et al.

(10) Patent No.: US 12,735,635 B2
(45) Date of Patent: Sep. 15, 2026

(54) LIGHT EMITTING DEVICE

(71) Applicant: Samsung Display Co., Ltd., Yongin-si (KR)

(72) Inventors: Mun-Ki Sim, Seoul (KR); Taeil Kim, Hwaseong-si (KR); Sun Young Pak, Suwon-si (KR); Junha Park, Gwacheon-si (KR); Jang Yeol Baek, Yongin-si (KR); Kyoung Sunwoo, Hwaseong-si (KR); Chanseok Oh, Seoul (KR); Minjung Jung, Gangwon-do (KR)

(73) Assignee: Samsung Display Co., Ltd., Yongin-si (KR)

( * ) Notice: Subject to any disclaimer, the term of this patent is extended or adjusted under 35 U.S.C. 154(b) by 1057 days.

(21) Appl. No.: 17/703,060

(22) Filed: Mar. 24, 2022

(65) Prior Publication Data

US 2023/0019844 A1 Jan. 19, 2023

(30) Foreign Application Priority Data

Jun. 17, 2021 (KR) ........................ 10-2021-0078849

(51) Int. Cl.
*C09K 11/06* (2006.01)
*C07F 5/02* (2006.01)
(Continued)

(52) U.S. Cl.
CPC .............. *C09K 11/06* (2013.01); *C07F 5/027* (2013.01); *H10K 85/658* (2023.02);
(Continued)

(58) Field of Classification Search
CPC ............ C09K 11/06; C09K 2211/1018; C09K 2211/1007; C09K 2211/1011;
(Continued)

(56) References Cited

U.S. PATENT DOCUMENTS

2012/0235123 A1* 9/2012 Lee .................... H10K 85/6572 546/159
2014/0117329 A1* 5/2014 Lee ...................... H10K 85/654 548/440

(Continued)

FOREIGN PATENT DOCUMENTS

CN 112174992 A * 1/2021 ................ C07F 5/02
KR 10-2016-0119683 10/2016

(Continued)

OTHER PUBLICATIONS

English translation of CN 112174992 A obtained from Google Patents (Year: 2021).*

(Continued)

*Primary Examiner* — Braelyn R Watson
(74) *Attorney, Agent, or Firm* — Womble Bond Dickinson (US) LLP

(57) ABSTRACT

A light emitting device includes a first electrode, a hole transport region disposed on the first electrode, an emission layer disposed on the hole transport region, an electron transport region disposed on the emission layer, and a second electrode disposed on the electron transport region. The emission layer includes a fused polycyclic compound represented by Formula 1.

(Continued)

[Formula 1]

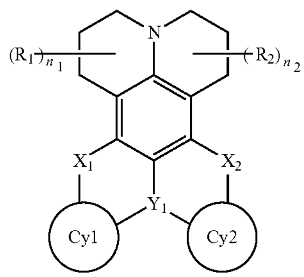

22 Claims, 6 Drawing Sheets

(51) Int. Cl.

| | |
|---|---|
| ***H10K 50/11*** | (2023.01) |
| ***H10K 85/60*** | (2023.01) |
| ***H10K 101/20*** | (2023.01) |
| *H10K 101/10* | (2023.01) |

(52) U.S. Cl.
CPC ...... *C09K 2211/1018* (2013.01); *H10K 50/11* (2023.02); *H10K 2101/10* (2023.02); *H10K 2101/20* (2023.02)

(58) Field of Classification Search
CPC .... C09K 2211/1029; C09K 2211/1048; C09K 2211/1055; C09K 2211/1066; C09K 2211/107; C09K 2211/1085; C07F 5/027; C07F 5/02; H10K 85/322; H10K 85/658; H10K 50/11; H10K 2101/10; H10K 2101/20; H10K 50/156; H10K 85/636; H10K 50/12; H10K 85/633; H10K 50/15; H01L 51/008
See application file for complete search history.

(56) References Cited

U.S. PATENT DOCUMENTS

| | | | | |
|---|---|---|---|---|
| 2016/0268516 | A1* | 9/2016 | Tanaka | H10K 85/653 |
| 2019/0214579 | A1* | 7/2019 | Seda | C07F 5/02 |
| 2019/0393419 | A1* | 12/2019 | Hatakeyama | H10K 85/636 |
| 2020/0190115 | A1 | 6/2020 | Hatakeyama et al. | |
| 2020/0403160 | A1 | 12/2020 | Sakamoto et al. | |

FOREIGN PATENT DOCUMENTS

| | | |
|---|---|---|
| KR | 10-2053569 | 12/2019 |
| KR | 10-2020-0143438 | 12/2020 |
| KR | 10-2020-0145888 | 12/2020 |
| WO | 2018/212169 | 3/2020 |

OTHER PUBLICATIONS

Tu, Chunyun, and WanZhen Liang. "NB-Type Electronic Asymmetric Compounds as Potential Blue-Color TADF Emitters: Steric Hindrance, Substitution Effect, and Electronic Characteristics." ACS omega 2.7 (2017): 3098-3109.) (Year: 2017).*

Helmenstine, Anne Marie, The Visible Spectrum: Wavelengths and Colors, ThoughtCo, 2020. (Year: 2020).*

Sanju Hwang et al., "Conformation-dependent degradation of thermally activated delayed fluorescence materials bearing cycloamino donors", Communications Chemistry, May 1, 2020, pp. 1-11, vol. 3, No. 53.

Yasuhiro Kondo et al., "Narrowband deep-blue organic light-emitting diode featuring an organoboron-based emitter", Nature Photonics, Jul. 15, 2019, https://doi.org/10.1038/s41566-019-0476-5.

* cited by examiner

LIGHT EMITTING DEVICE

CROSS-REFERENCE TO RELATED APPLICATION(S)

This application claims priority to and benefits of Korean Patent Application No. 10-2021-0078849 under 35 U.S.C. § 119, filed on Jun. 17, 2021 in the Korean Intellectual Property Office, the entire contents of which are incorporated herein by reference.

BACKGROUND

1. Technical Field

The disclosure relates to a light emitting device including a novel fused polycyclic compound used as a light emitting material.

2. Description of the Related Art

Active development continues for an organic electroluminescence display as an image display. In contrast to a liquid crystal display, the organic electroluminescence display is a so-called self-luminescent display in which holes and electrons respectively injected from a first electrode and a second electrode recombine in an emission layer so that a light emitting material including an organic compound in the emission layer emits light to achieve display.

In the application of an organic electroluminescence device to an image display, there is a demand for decreasing driving voltage and for increasing emission efficiency and the life of the organic electroluminescence device, and continuous development is required on materials for an organic electroluminescence device which stably achieves such characteristics.

In order to accomplish an organic electroluminescence device with high efficiency, techniques on phosphorescence emission which uses energy in a triplet state and techniques on delayed fluorescence emission which uses the generating phenomenon of singlet excitons by the collision of triplet excitons (triplet-triplet annihilation, TTA) are being developed, and development on a material for thermally activated delayed fluorescence (TADF) using delayed fluorescence phenomenon is being conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a light emitting device showing improved emission efficiency.

The disclosure also provides a fused polycyclic compound which is capable of improving the emission efficiency of a light emitting device.

An embodiment provides a light emitting device which may include a first electrode, a hole transport region disposed on the first electrode, an emission layer disposed on the hole transport region, an electron transport region disposed on the emission layer, and a second electrode disposed on the electron transport region, wherein the emission layer may include a fused polycyclic compound represented by Formula 1, and the hole transport region may include a compound represented by Formula H-a.

[Formula 1]

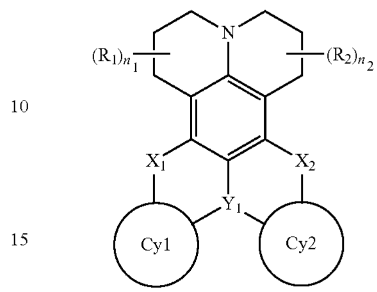

In Formula 1, $X_1$ and $X_2$ may each independently be $N(R_3)$, O, or S, $Y_1$ may be B, $R_1$ and $R_2$ may each independently be a hydrogen atom, a deuterium atom, a halogen atom, a cyano group, a substituted or unsubstituted amine group, a substituted or unsubstituted alkyl group of 1 to 30 carbon atoms, a substituted or unsubstituted aryl group of 6 to 60 ring-forming carbon atoms, or a substituted or unsubstituted heteroaryl group of 2 to 60 ring-forming carbon atoms, or may be combined with an adjacent group to form a ring, $R_3$ may be a hydrogen atom, a deuterium atom, a halogen atom, a substituted or unsubstituted alkyl group of 1 to 30 carbon atoms, a substituted or unsubstituted aryl group of 6 to 60 ring-forming carbon atoms, or a substituted or unsubstituted heteroaryl group of 2 to 60 ring-forming carbon atoms, or may be combined with an adjacent group to form a ring, $n_1$ and $n_2$ may each independently be an integer from 0 to 6, and Cy1 and Cy2 may each independently be a substituted or unsubstituted aromatic hydrocarbon ring of 6 to 60 ring-forming carbon atoms, or a substituted or unsubstituted aromatic heterocycle of 2 to 60 ring-forming carbon atoms, or may be combined with an adjacent group to form a ring.

[Formula H-a]

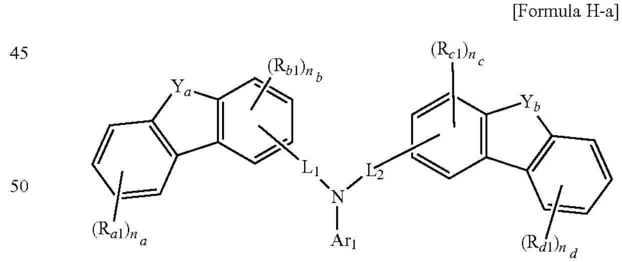

In Formula H-a, $Y_a$ and $Y_b$ may each independently be $C(R_{e1})(R_{f1})$, $N(R_{g1})$, O, or S, $Ar_1$ may be a substituted or unsubstituted aryl group of 6 to 30 ring-forming carbon atoms, or a substituted or unsubstituted heteroaryl group of 2 to 30 ring-forming carbon atoms, $L_1$ and $L_2$ may each independently be a direct linkage, a substituted or unsubstituted arylene group of 6 to 30 ring-forming carbon atoms, or a substituted or unsubstituted heteroarylene group of 2 to 30 ring-forming carbon atoms, $R_{a1}$ to $R_{g1}$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring, $n_a$ and $n_d$ may each independently be an integer from 0 to 4, and $n_b$ and $n_c$ may each independently be an integer from 0 to 3.

In an embodiment, Cy1 and Cy2 may each independently be a group represented by Formula 2 or Formula 3.

[Formula 2]

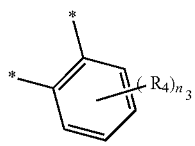

In Formula 2, $R_4$ may be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring, $n_3$ may be an integer from 0 to 4, and ——* indicates positions connected with $X_1$ and $Y_1$ of Formula 1, or indicates positions connected with $X_2$ and $Y_1$ of Formula 1, respectively.

[Formula 3]

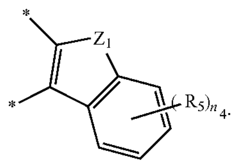

In Formula 3, $Z_1$ may be $N(R_6)$, O, or S, $R_5$ may be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring, $R_6$ may be a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, $n_4$ may be an integer from 0 to 4, and ——* indicates positions connected with $X_1$ and $Y_1$ of Formula 1, or indicates positions connected with $X_2$ and $Y_1$ of Formula 1, respectively.

In an embodiment, if Cy1 and Cy2 are each a group represented by Formula 2, then Cy1 and Cy2 may each independently be a group represented by any one of Formula 2-1 to Formula 2-3.

[Formula 2-1]

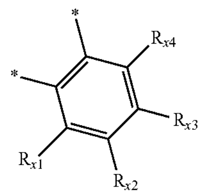

In Formula 2-1, $R_{x1}$ to $R_{x4}$ may each independently be a hydrogen atom, a deuterium atom, a halogen atom, a substituted or unsubstituted alkyl group of 1 to 10 carbon atoms, a substituted or unsubstituted phenyl group, a substituted or unsubstituted carbazole group, or a substituted or unsubstituted amine group, or may be combined with an adjacent group to form a ring, and ——* indicates positions connected with $X_1$ and $Y_1$ of Formula 1, or indicates positions connected with $X_2$ and $Y_1$ of Formula 1, respectively.

[Formula 2-2]

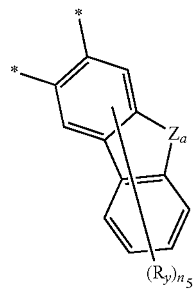

In Formula 2-2, $Z_a$ may be $C(R_7)(R_8)$, $N(R_9)$, O, or S, $R_y$, $R_7$, and $R_8$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring, $R_9$ may be a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, $n_5$ may be an integer from 0 to 6, and ——* indicates positions connected with $X_1$ and $Y_1$ of Formula 1, or indicates positions connected with $X_2$ and $Y_1$ of Formula 1, respectively.

[Formula 2-3]

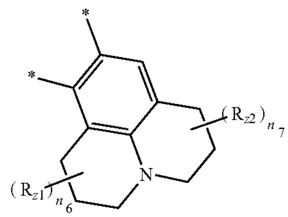

In Formula 2-3, $R_{z1}$ and $R_{z2}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring, $n_6$ and $n_7$ may each independently be an integer from 0 to 6, and —* indicates positions connected with $X_1$ and $Y_1$ of Formula 1, or indicates positions connected with $X_2$ and $Y_1$ of Formula 1, respectively.

In an embodiment, the emission layer may emit delayed fluorescence.

In an embodiment, the emission layer may be a delayed fluorescence emission layer including a host and a dopant, and the dopant may include the fused polycyclic compound.

In an embodiment, the host may include a compound represented by Formula E-2a or Formula E-2b.

[Formula E-2a]

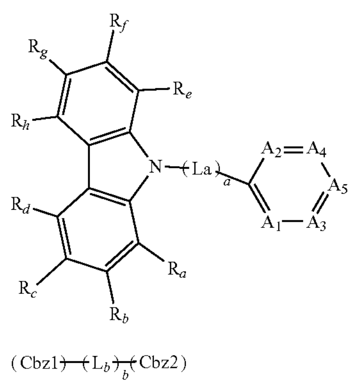

[Formula E-2b]

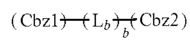

In Formula E-2a, a may be an integer from 0 to 10, $L_a$ may be a direct linkage, a substituted or unsubstituted arylene group of 6 to 30 ring-forming carbon atoms, or a substituted or unsubstituted heteroarylene group of 2 to 30 ring-forming carbon atoms. In Formula E-2a, $A_1$ to $A_5$ may each independently be N or $C(R_i)$, $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring, two or three of $A_1$ to $A_5$ may be N, and the remainder of $A_1$ to $A_5$ may be $C(R_i)$.

In Formula E-2b, Cbz1 and Cbz2 may each independently be an unsubstituted carbazole group, or a carbazole group substituted with an aryl group of 6 to 30 ring-forming carbon atoms, $L_b$ may be a direct linkage, a substituted or unsubstituted arylene group of 6 to 30 ring-forming carbon atoms, or a substituted or unsubstituted heteroarylene group of 2 to 30 ring-forming carbon atoms, and b may be an integer from 0 to 10.

In an embodiment, the emission layer may emit light having a central wavelength in a range of about 430 nm to about 490 nm.

In an embodiment, the fused polycyclic compound represented by Formula 1 may be represented by any one of Formula 4-1 to Formula 4-3.

[Formula 4-1]

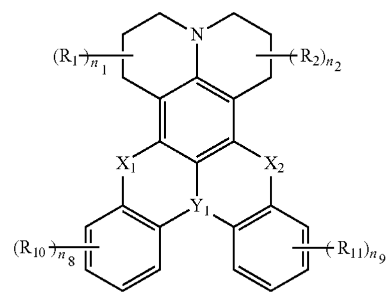
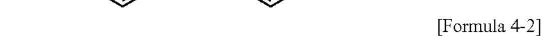

[Formula 4-2]

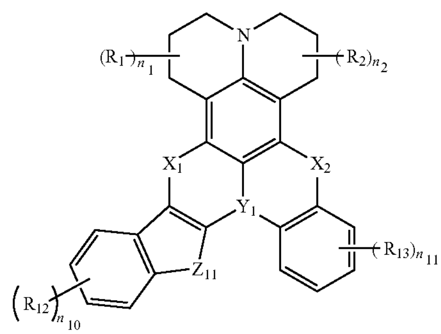

[Formula 4-3]

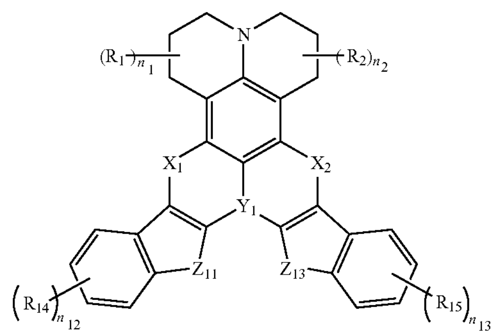

In Formula 4-1 to Formula 4-3, $Z_1$ to $Z_{13}$ may each independently be $N(R_{16})$, O, or S $R_{10}$ to $R_{15}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring, $R_{16}$ may be a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and $n_8$ to $n_{13}$ may each independently be an integer from 0 to 4.

In Formula 4-1 to Formula 4-3, $X_1$, $X_2$, $Y_1$, $R_1$, $R_2$, $n_1$, and $n_2$ may be the same as defined in Formula 1.

In an embodiment, the fused polycyclic compound represented by Formula 1 may be represented by any one of Formula 5-1 to Formula 5-3.

[Formula 5-1]

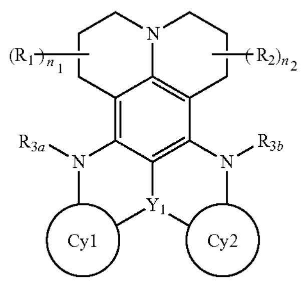

[Formula 5-2]

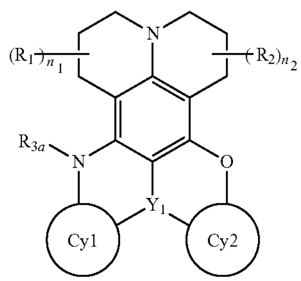

[Formula 5-3]

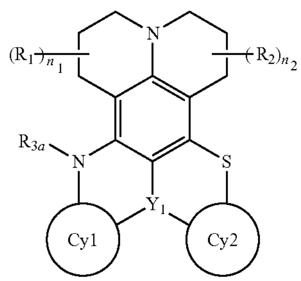

In Formula 5-1 to Formula 5-3, $R_{3a}$ and $R_{3b}$ may each independently be a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In Formula 5-1 to Formula 5-3, Cy1, Cy2, $Y_1$, $R_1$, $R_2$, $n_1$, and $n_2$ may be the same as defined in Formula 1.

In an embodiment, the fused polycyclic compound represented by Formula 1 may be represented by any one of Formula 6-1 to Formula 6-3.

[Formula 6-1]

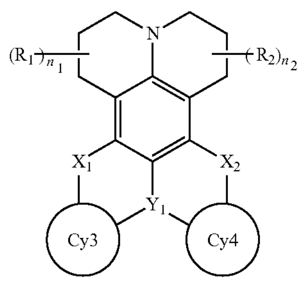

-continued

[Formula 6-2]

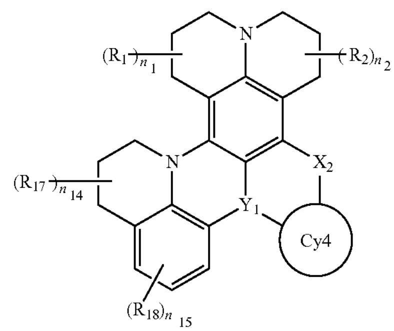

[Formula 6-3]

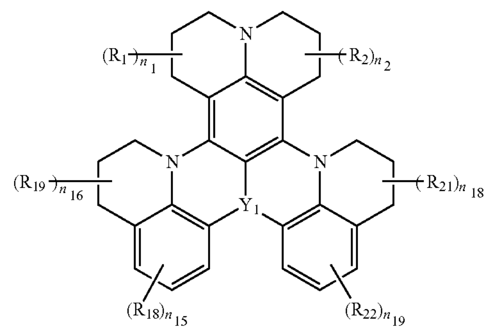

In Formula 6-1 to Formula 6-3, Cy3 and Cy4 may each independently be a substituted or unsubstituted aromatic hydrocarbon ring of 6 to 30 ring-forming carbon atoms, or a substituted or unsubstituted aromatic heterocycle of 2 to 30 ring-forming carbon atoms, $R_{17}$ to $R_{22}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring, $n_{14}$, $n_{16}$, and $n_{18}$ may each independently be an integer from 0 to 6, and $n_{15}$, $n_{17}$, and $n_{19}$ may each independently be an integer from 0 to 3.

In Formula 6-1 to Formula 6-3, $X_1$, $X_2$, $Y_1$, $R_1$, $R_2$, $n_1$, and $n_2$ may be the same as defined in Formula 1.

In an embodiment, in Formula 1, if $X_1$ and $X_2$ are each $N(R_3)$, then $R_3$ may be a substituted or unsubstituted alkyl group of 1 to 10 carbon atoms, a substituted or unsubstituted phenyl group, a substituted or unsubstituted biphenyl group, a substituted or unsubstituted terphenyl group, a substituted or unsubstituted fluorenyl group, a substituted or unsubstituted naphthyl group, or a substituted or unsubstituted tetrahydronaphthyl group.

In an embodiment, the fused polycyclic compound may include at least one selected from Compound Group 1, which is explained below.

Another embodiment provides a light emitting device which may include a first electrode, a second electrode facing the first electrode, and an emission layer disposed between the first electrode and the second electrode, wherein the emission layer may include a host and a delayed fluorescence dopant, the host may include a compound represented by Formula E-2a or Formula E-2b, and the delayed fluorescence dopant may include a fused polycyclic compound represented by Formula 1.

In an embodiment, the light emitting device may further include a hole transport layer disposed between the first electrode and the emission layer, wherein the hole transport region may include a compound represented by Formula H-a.

In an embodiment, Cy1 and Cy2 may each independently be a group represented by Formula 2 or Formula 3.

In an embodiment, in Formula 1, if Cy1 and Cy2 are each a group represented by Formula 2, then Cy1 and Cy2 may each independently be a group represented by any one of Formula 2-1 to Formula 2-3.

In an embodiment, the fused polycyclic compound represented by Formula 1 may be represented by any one of Formula 4-1 to Formula 4-3.

In an embodiment, the fused polycyclic compound represented by Formula 1 may be represented by any one of Formula 5-1 to Formula 5-3.

In an embodiment, the fused polycyclic compound represented by Formula 1 may be represented by any one of Formula 6-1 to Formula 6-3.

In an embodiment, the fused polycyclic compound may include at least one selected from Compound Group 1, which is explained below.

BRIEF DESCRIPTION OF THE DRAWINGS

The accompanying drawings are included to provide a further understanding of the embodiments, and are incorporated in and constitute a part of this specification. The drawings illustrate embodiments of the disclosure and principles thereof. The above and other aspects and features of the disclosure will become more apparent by describing in detail embodiments thereof with reference to the attached drawings, in which.

DETAILED DESCRIPTION OF THE EMBODIMENTS

Figure 1:
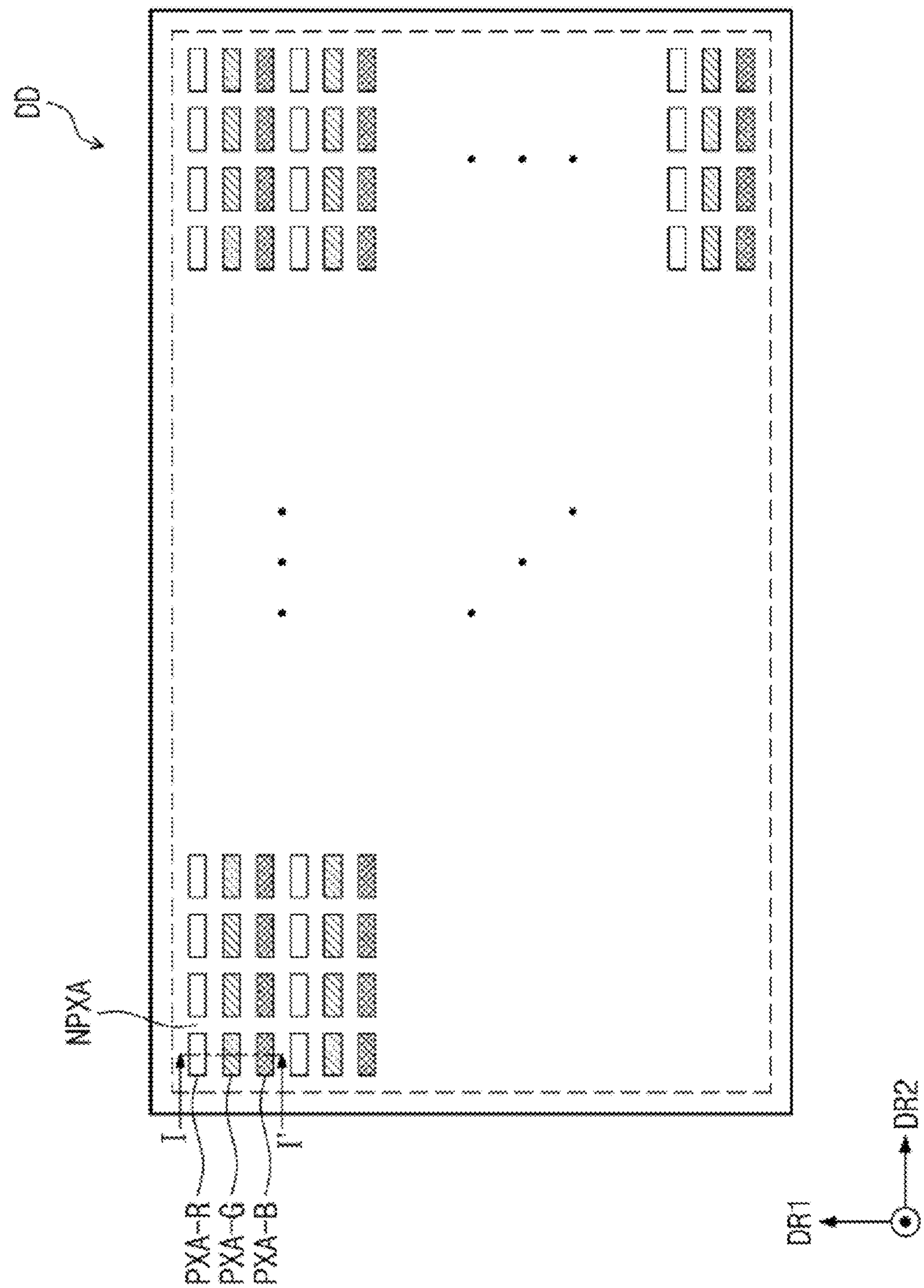
FIG. 1 is a plan view of a display apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the specification, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the specification, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

In the specification, the term "substituted or unsubstituted" may mean a group that is substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. Each of the substituents recited above may itself be substituted or unsubstituted. For example, a biphenyl group may be interpreted as an aryl group or as a phenyl group substituted with a phenyl group.

In the specification, the term "bonded to an adjacent group to form a ring" may mean a group that is bonded to an adjacent group to form a substituted or unsubstituted hydrocarbon ring, or a substituted or unsubstituted heterocycle. The hydrocarbon ring may include an aliphatic hydrocarbon ring and an aromatic hydrocarbon ring. The heterocycle may include an aliphatic heterocycle and an aromatic heterocycle. The hydrocarbon ring and the heterocycle may each independently be monocyclic or polycyclic. Rings which are formed by adjacent groups being bonded to each other may be combined with another ring to form a spiro structure.

In the specification, the term "adjacent group" may mean a substituent substituted for an atom which is directly combined with an atom substituted with a corresponding substituent, another substituent substituted for an atom which is substituted with a corresponding substituent, or a substituent sterically positioned at the nearest position to a corresponding substituent. For example, in 1,2-dimethylbenzene, two methyl groups may be interpreted as "adjacent groups" to each other, and in 1,1-diethylcyclopentene, two ethyl groups may be interpreted as "adjacent groups" to each other. For example, in 4,5-dimethylphenanthrene, two methyl groups may be interpreted as "adjacent groups" to each other. For example, in N,2-dimethylaniline, two methyl groups may be interpreted as "adjacent groups" to each other.

In the specification, a halogen atom may be a fluorine atom, a chlorine atom, a bromine atom, or an iodine atom.

In the specification, an alkyl group may be a linear, a branched, or a cyclic type. The number of carbon atoms in the alkyl group may be 1 to 50, 1 to 30, 1 to 20, 1 to 10, or 1 to 6. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the specification, a hydrocarbon ring group may be any functional group or substituent derived from an aliphatic hydrocarbon ring. The hydrocarbon ring group may be a saturated hydrocarbon ring group of 5 to 20 ring-forming carbon atoms.

In the specification, an aryl group may be any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc., without limitation.

In the specification, a fluorenyl group may be substituted, and two substituents may be combined with each other to form a spiro structure. Examples of substituted fluorenyl groups are as follows, but embodiments are not limited thereto.

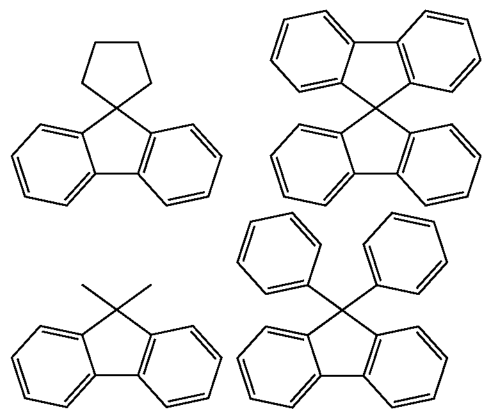

In the specification, a heterocyclic group may be any functional group or substituent derived from a ring including one or more of B, O, N, P, Si, or S as heteroatoms. The heterocyclic group may include an aliphatic heterocyclic group and an aromatic heterocyclic group. The aromatic heterocyclic group may be a heteroaryl group. The aliphatic heterocyclic group and the aromatic heterocyclic group may each independently be monocyclic or polycyclic.

In the specification, a heterocyclic group may include one or more of B, O, N, P, Si, or S as heteroatoms. If the heterocyclic group includes two or more heteroatoms, two or more heteroatoms may be the same as or different from each other. The heterocyclic group may be a monocyclic heterocyclic group or a polycyclic heterocyclic group, and the heterocyclic group may be a heteroaryl group. The number of ring-forming carbon atoms of the heteroaryl group may be 2 to 30, 2 to 20, or 2 to 10.

In the specification, a the heteroaryl group may include one or more of B, O, N, P, Si, or S as heteroatoms. If the heteroaryl group includes two or more heteroatoms, the two or more heteroatoms may be the same as or different from each other. The heteroaryl group may be a monocyclic heterocyclic group or a polycyclic heterocyclic group. The number of ring-forming carbon atoms of the heteroaryl group may be 2 to 30, 2 to 20, or 2 to 10. Examples of the heteroaryl group may include thiophene, furan, pyrrole, imidazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofuran, phenanthroline, thiazole, isooxazole, oxazole, oxadiazole, thiadiazole, phenothiazine, dibenzosilole, dibenzofuran, etc., without limitation.

In the specification, the number of carbon atoms in an amine group is not specifically limited, but may be 1 to 30. The amine group may include an alkyl amine group and an aryl amine group. Examples of the amine group may include a methylamine group, a dimethylamine group, a phenylamine group, a diphenylamine group, a naphthylamine group, a 9-methyl-anthracenylamine group, a triphenylamine group, etc., without limitation.

In the specification, an alkyl group in an alkylthio group, an alkylsulfoxy group, an alkylaryl group, an alkylamino group, an alkylboron group, an alkyl silyl group, and an alkyl amine group may be the same as the examples of the above-described alkyl group.

In the specification, an aryl group in an aryloxy group, an arylthio group, an arylsulfoxy group, an aryl amino group, an arylboron group, and an aryl silyl group may be the same as the examples of the above-described aryl group.

In the description, —* indicates a bonding site to a neighboring atom.

Hereinafter, embodiments will be explained with reference to the drawings.

Figure 2:
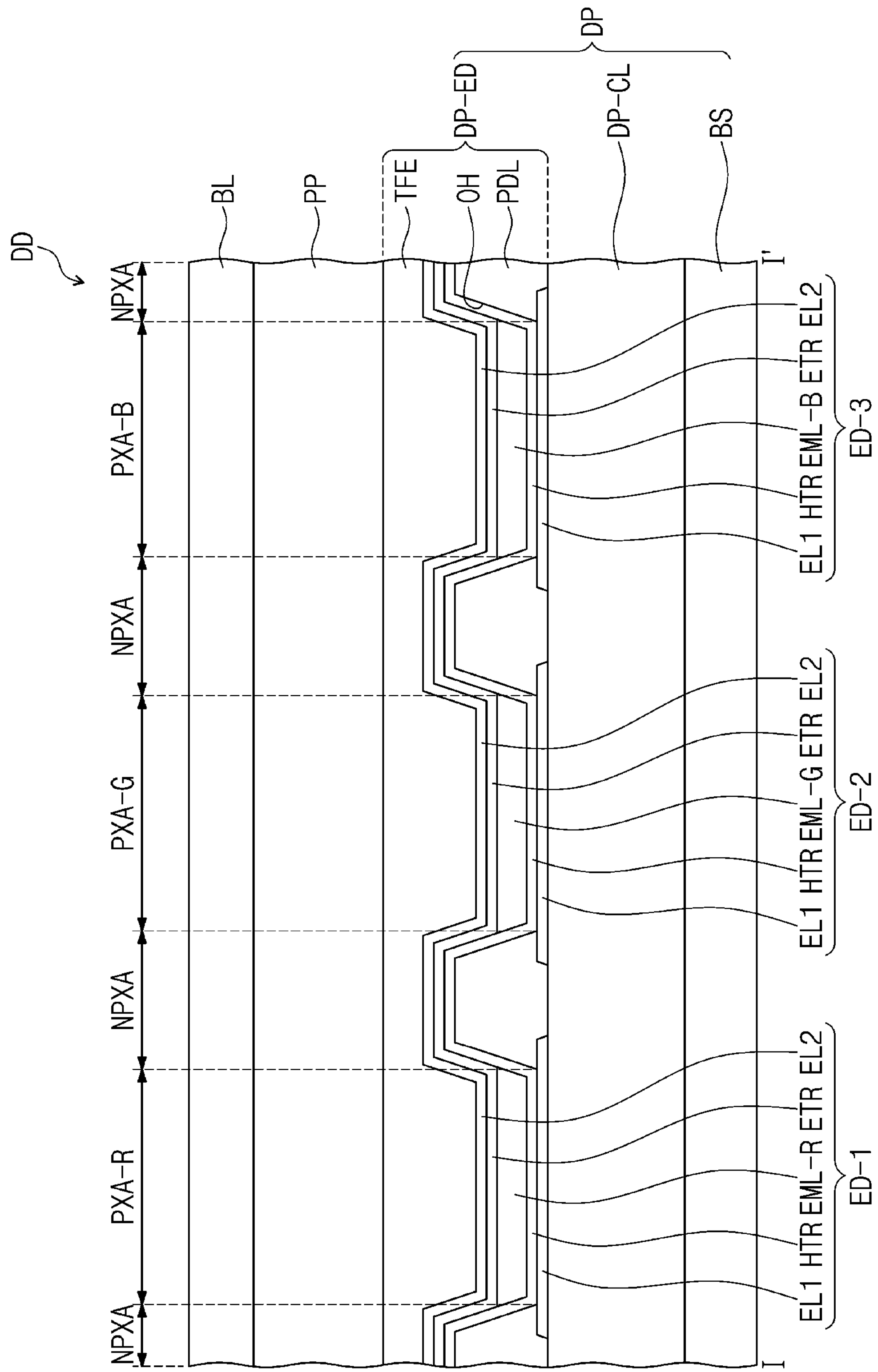
FIG. 2 is a schematic cross-sectional view of a display apparatus according to an embodiment.

FIG. 1 is a plan view showing an embodiment of a display apparatus DD. FIG. 2 is a schematic cross-sectional view of a display apparatus DD of an embodiment. FIG. 2 is a schematic cross-sectional view showing a part corresponding to line I-I' of FIG. 1.

The display apparatus DD may include a display panel DP and an optical layer PP disposed on the display panel DP. The display panel DP includes light emitting devices ED-1, ED-2, and ED-3. The display apparatus DD may include multiples of each of the light emitting devices ED-1, ED-2, and ED-3. The optical layer PP may be disposed on the display panel DP and may control light reflected at the display panel DP from an external light. The optical layer PP may include, for example, a polarization layer or a color filter layer. Although not shown in the drawings, in an embodiment, the optical layer PP may be omitted from the display apparatus DD.

A base substrate BL may be disposed on the optical layer PP. The base substrate BL may provide a base surface where the optical layer PP is disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawings, in an embodiment, the base substrate BL may be omitted.

The display apparatus DD according to an embodiment may further include a plugging layer (not shown). The plugging layer (not shown) may be disposed between a display device layer DP-ED and a base substrate BL. The plugging layer (not shown) may be an organic layer. The plugging layer (not shown) may include at least one of an acrylic resin, a silicon-based resin, or an epoxy-based resin.

The display panel DP may include a base layer BS, a circuit layer DP-CL provided on the base layer BS, and a display device layer DP-ED. The display device layer DP-ED may include a pixel definition layer PDL, light emitting devices ED-1, ED-2, and ED-3 disposed in the pixel definition layer PDL, and an encapsulating layer TFE disposed on the light emitting devices ED-1, ED-2, and ED-3.

The base layer BS may provide a base surface on which the display device layer DP-ED is disposed. The base layer BS may be a glass substrate, a metal substrate, a plastic substrate, etc. However, embodiments are not limited thereto, and the base layer BS may include an inorganic layer, an organic layer, or a composite material layer.

In an embodiment, the circuit layer DP-CL is disposed on the base layer BS, and the circuit layer DP-CL may include transistors (not shown). Each of the transistors (not shown) may include a control electrode, an input electrode, and an output electrode. For example, the circuit layer DP-CL may include switching transistors and driving transistors for driving the light emitting devices ED-1, ED-2, and ED-3 of the display device layer DP-ED.

Each of the light emitting devices ED-1, ED-2, and ED-3 may have the structures of a light emitting device ED of an embodiment according to FIG. 3 to FIG. 6, which will be explained later. Each of the light emitting devices ED-1, ED-2, and ED-3 may include a first electrode EL1, a hole transport region HTR, emission layers EMLL-R, EMLL-G, and EMLL-B, an electron transport region ETR, and a second electrode EL2.

FIG. 2 shows an embodiment where the emission layers EMLL-R, EML-G, and EMLL-B of the light emitting devices ED-1, ED-2, and ED-3, are disposed in openings OH defined in a pixel definition layer PDL, and a hole transport region HTR, an electron transport region ETR, and a second electrode EL2 are each provided as common layers in all light emitting devices ED-1, ED-2, and ED-3. However, embodiments are not limited thereto. Although not shown in FIG. 2, in an embodiment, the hole transport region HTR and the electron transport region ETR may each be patterned and provided in the openings OH defined in the pixel definition layer PDL. For example, in an embodiment, the hole transport region HTR, the emission layers EML-R, EML-G, and EML-B, and the electron transport region ETR of the light emitting devices ED-1, ED-2, and ED-3 may be patterned by an ink jet printing method and provided.

An encapsulating layer TFE may cover the light emitting devices ED-1, ED-2, and ED-3. The encapsulating layer TFE may encapsulate the display device layer DP-ED. The encapsulating layer TFE may be a thin film encapsulating layer. The encapsulating layer TFE may be one layer or a stack of multiple layers. The encapsulating layer TFE may include at least one insulating layer. The encapsulating layer TFE according to an embodiment may include at least one inorganic layer (hereinafter, encapsulating inorganic layer). The encapsulating layer TFE according to an embodiment may include at least one organic layer (hereinafter, encapsulating organic layer) and at least one encapsulating inorganic layer.

The encapsulating inorganic layer may protect the display device layer DP-ED from moisture and/or oxygen, and the encapsulating organic layer may protect the display device layer DP-ED from foreign materials such as dust particles. The encapsulating inorganic layer may include silicon nitride, silicon oxy nitride, silicon oxide, titanium oxide, or aluminum oxide, without specific limitation. The encapsulating organic layer may include an acrylic compound, an epoxy-based compound, etc. The encapsulating organic layer may include a photopolymerizable organic material, without specific limitation.

The encapsulating layer TFE may be disposed on the second electrode EL2 and may be disposed to fill the openings OH.

Referring to FIG. 1 and FIG. 2, the display apparatus DD may include non-luminous areas NPXA and luminous areas PXA-R, PXA-G, and PXA-B. The luminous areas PXA-R, PXA-G, and PXA-B may each be areas emitting light produced from the light emitting devices ED-1, ED-2, and ED-3, respectively. The luminous areas PXA-R, PXA-G, and PXA-B may be separated from each other on a plane.

The luminous areas PXA-R, PXA-G, and PXA-B may each be areas separated by the pixel definition layer PDL. The non-luminous areas NPXA may be areas between neighboring luminous areas PXA-R, PXA-G, and PXA-B and may be areas corresponding to the pixel definition layer PDL. For example, in an embodiment, each of the luminous areas PXA-R, PXA-G, and PXA-B may correspond to a pixel. The pixel definition layer PDL may separate the light emitting devices ED-1, ED-2, and ED-3. The emission layers EML-R, EML-G, and EML-B of the light emitting devices ED-1, ED-2, and ED-3 may be disposed in the openings OH defined in the pixel definition layer PDL and separated from each other.

The luminous areas PXA-R, PXA-G, and PXA-B may be divided into groups according to the color of light produced from each of the light emitting devices ED-1, ED-2, and ED-3. In the display apparatus DD of an embodiment, shown in FIG. 1 and FIG. 2, three luminous areas PXA-R, PXA-G, and PXA-B respectively emitting red light, green light, and blue light are illustrated as an embodiment. For example, the display apparatus DD of an embodiment may include a red luminous area PXA-R, a green luminous area PXA-G, and a blue luminous area PXA-B, which are separated from each other.

In the display apparatus DD according to an embodiment, the light emitting devices ED-1, ED-2, and ED-3 may each emit light having different wavelength regions. For example, in an embodiment, the display apparatus DD may include a first light emitting device ED-1 emitting red light, a second light emitting device ED-2 emitting green light, and a third light emitting device ED-3 emitting blue light. For example, each of the red luminous area PXA-R, the green luminous area PXA-G, and the blue luminous area PXA-B of the display apparatus DD may correspond to the first light emitting device ED-1, the second light emitting device ED-2, and the third light emitting device ED-3, respectively.

However, embodiments are not limited thereto, and the first to third light emitting devices ED-1, ED-2 and ED-3 may emit light in a same wavelength region, or at least one thereof may emit light in a different wavelength region. For example, the first to third light emitting devices ED-1, ED-2, and ED-3 may all emit blue light.

The luminous areas PXA-R, PXA-G, and PXA-B in the display apparatus DD according to an embodiment may be arranged in a stripe shape. Referring to FIG. 1, the red luminous areas PXA-R, the green luminous areas PXA-G, and the blue luminous areas PXA-B may be arranged along a second directional axis DR2. The red luminous area PXA-R, the green luminous area PXA-G, and the blue luminous area PXA-B may be arranged by turns along a first directional axis DR1.

In FIG. 1 and FIG. 2, the areas of the luminous areas PXA-R, PXA-G, and PXA-B are shown as having a similar area, but embodiments are not limited thereto. The areas of the luminous areas PXA-R, PXA-G, and PXA-B may be different from each other according to a wavelength region of light emitted. The areas of the luminous areas PXA-R, PXA-G, and PXA-B may be areas in a plan view that are defined by the first directional axis DR1 and the second directional axis DR2.

The arrangement type of the luminous areas PXA-R, PXA-G, and PXA-B is not limited to the configuration shown in FIG. 1, and the arrangement order of the red luminous areas PXA-R, the green luminous areas PXA-G, and the blue luminous areas PXA-B may be provided in various combinations according to the display quality characteristics which are required for the display apparatus DD. For example, the arrangement type of the luminous areas PXA-R, PXA-G, and PXA-B may be a PENTILE™ arrangement type, or a Diamond Pixel™ arrangement type.

In an embodiment, the areas of the luminous areas PXA-R, PXA-G, and PXA-B may be different from each other. For example, in an embodiment, an area of the green luminous area PXA-G may be smaller than an area of the blue luminous area PXA-B, but embodiments are not limited thereto.

Hereinafter, FIG. 3 to FIG. 6 are each a schematic cross-sectional view showing a light emitting device according to embodiments. The light emitting device ED according to an embodiment may include a first electrode EL1, a hole transport region HTR, an emission layer EML, an electron transport region ETR, and a second electrode EL2, stacked in that order.

Figure 3:
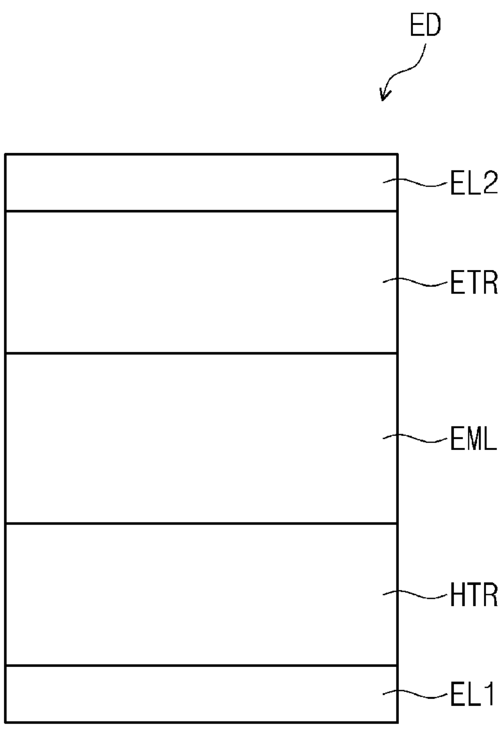
FIG. 3 is a schematic cross-sectional view showing a light emitting device according to an embodiment.
Figure 4:
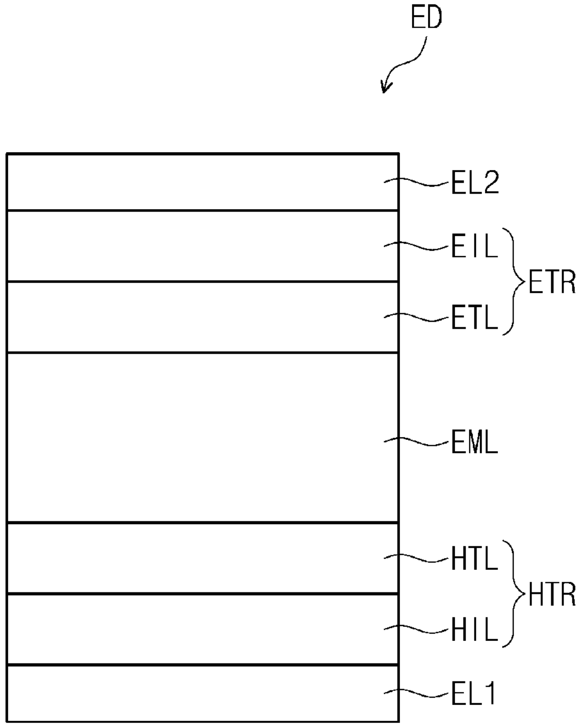
FIG. 4 is a schematic cross-sectional view showing a light emitting device according to an embodiment.
Figure 5:
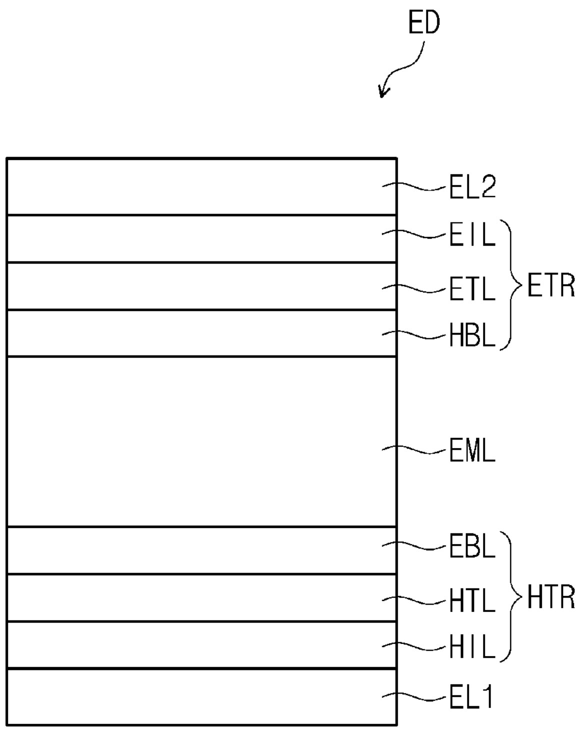
FIG. 5 is a schematic cross-sectional view showing a light emitting device according to an embodiment.
Figure 6:
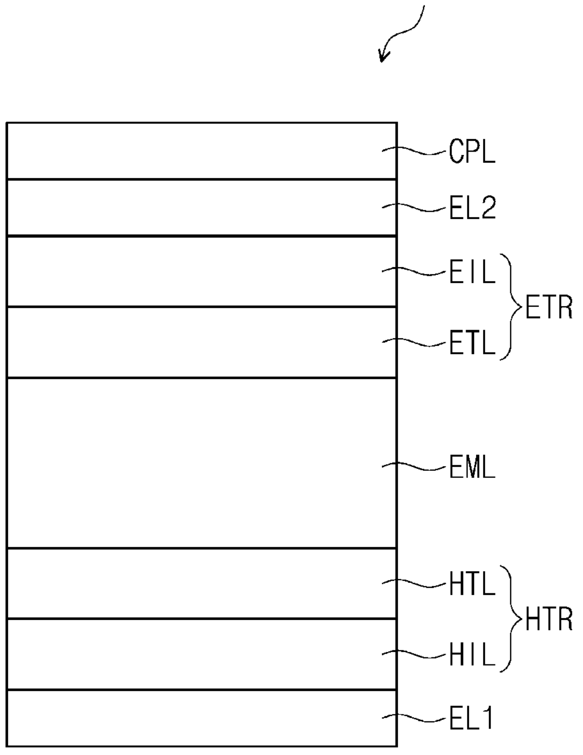
FIG. 6 is a schematic cross-sectional view showing a light emitting device according to an embodiment.

In comparison to FIG. 3, FIG. 4 shows a schematic cross-sectional view of a light emitting device ED of an embodiment, wherein a hole transport region HTR includes a hole injection layer HIL and a hole transport layer HTL, and an electron transport region ETR includes an electron injection layer EIL and an electron transport layer ETL. In comparison to FIG. 3, FIG. 5 shows a schematic cross-sectional view of a light emitting device ED of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. In comparison to FIG. 4, FIG. 6 shows a schematic cross-sectional view of a light emitting device ED of an embodiment, that includes a capping layer CPL disposed on the second electrode EL2.

The first electrode EL1 has conductivity. The first electrode EL1 may be formed using a metal material, a metal alloy, or a conductive compound. The first electrode EL1 may be an anode or a cathode. However, embodiments are not limited thereto. For example, the first electrode EL1 may be a pixel electrode. The first electrode EL1 may be a transmissive electrode, a transflective electrode, or a reflective electrode. If the first electrode EL1 is a transmissive electrode, the first electrode EL1 may include a transparent metal oxide such as indium tin oxide (ITO), indium zinc oxide (IZO), zinc oxide (ZnO), or indium tin zinc oxide (ITZO). If the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, compounds thereof, or mixtures thereof (for example, a mixture of Ag and Mg). In another embodiment, the first electrode EL1 may have a structure including multiple layers including a reflective layer or a transflective layer formed using the above materials, and a transmissive conductive layer formed using ITO, IZO, ZnO, or ITZO. For example, the first electrode EL1 may include a three-layer structure of ITO/Ag/ITO. However, embodiments are not limited thereto. The first electrode EL1 may include the above-described metal materials, combinations of two or more metal materials selected from the above-described metal materials, or oxides of the above-described metal materials. A thickness of the first electrode EL1 may be in a range of about 700 Å to about 10,000 Å. For example, the thickness of the first electrode EL1 may be in a range of about 1,000 Å to about 3,000 Å.

The hole transport region HTR is provided on the first electrode EL1. The hole transport region HTR may include at least one of a hole injection layer HIL, a hole transport layer HTL, a buffer layer (not shown), an emission auxiliary layer (not shown), or an electron blocking layer EBL. A thickness of the hole transport region HTR may be in a range of about 50 Å to about 15,000 Å.

The hole transport region HTR may be a layer formed of a single material, a layer formed of different materials, or a multilayer structure including layers formed of different materials.

For example, the hole transport region HTR may have the structure of a single layer of a hole injection layer HIL or a hole transport layer HTL, or may have a structure of a single layer formed of a hole injection material and a hole transport material. The hole transport region HTR may have a structure of a single layer formed using multiple different materials, or a structure in which a hole injection layer HIL/hole transport layer HTL, a hole injection layer HIL/hole transport layer HTL/buffer layer (not shown), a hole injection layer HIL/buffer layer (not shown), a hole transport layer HTL/buffer layer (not shown), or a hole injection layer HIL/hole transport layer HTL/electron blocking layer EBL are stacked in its respective stated order from the first electrode EL1, but embodiments are not limited thereto.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole transport region HTR may include a compound represented by Formula H-1.

[Formula H-1]

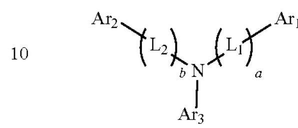

In Formula H-1, $L_1$ and $L_2$ may each independently be a direct linkage, a substituted or unsubstituted arylene group of 6 to 30 ring-forming carbon atoms, or a substituted or unsubstituted heteroarylene group of 2 to 30 ring-forming carbon atoms. In Formula H-1, a and b may each independently be an integer from 0 to 10. When a or b is 2 or more, $L_1$ groups and $L_2$ groups may each independently be a substituted or unsubstituted arylene group of 6 to 30 ring-forming carbon atoms, or a substituted or unsubstituted heteroarylene group of 2 to 30 ring-forming carbon atoms.

In Formula H-1, $Ar_1$ and $Ar_2$ may each independently be a substituted or unsubstituted aryl group of 6 to 30 ring-forming carbon atoms, or a substituted or unsubstituted heteroaryl group of 2 to 30 ring-forming carbon atoms. In Formula H-1, $Ar_3$ may be a substituted or unsubstituted aryl group of 6 to 30 ring-forming carbon atoms.

The compound represented by Formula H-1 may be a monoamine compound. In another embodiment, the compound represented by Formula H-1 may be a diamine compound in which at least one of $Ar_1$ to $Ar_3$ may include an amine group as a substituent. For example, the compound represented by Formula H-1 may be a carbazole-based compound in which at least one of $Ar_1$ to $Ar_3$ may include a substituted or unsubstituted carbazole group, or a fluorene-based compound in which at least one of $Ar_1$ to $Ar_3$ may include a substituted or unsubstituted fluorene group.

The compound represented by Formula H-1 may be any one selected from Compound Group H. However, the compounds of Compound Group H are only examples, and the compound represented by Formula H-1 is not limited to Compound Group H.

[Compound Group H]

H-1-1

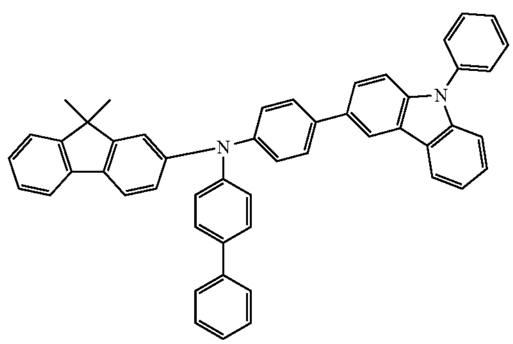

H-1-2

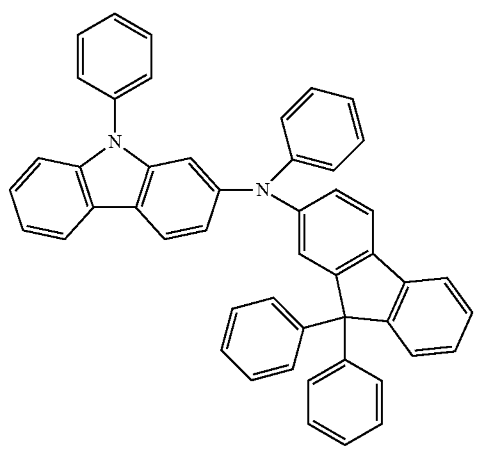

-continued
H-1-3
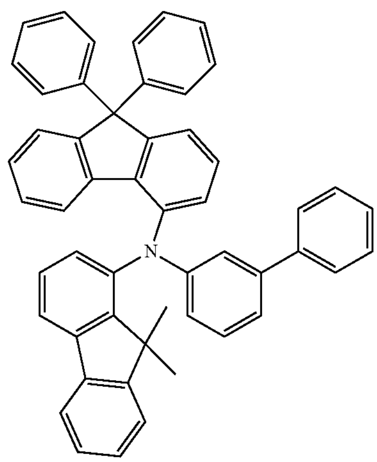
H-1-4
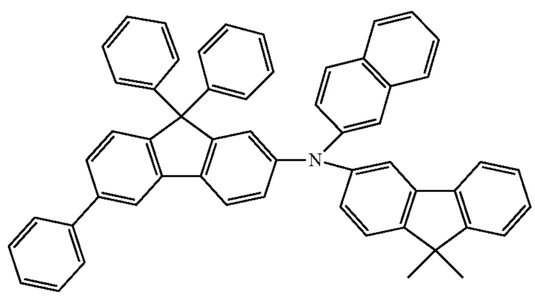
H-1-5
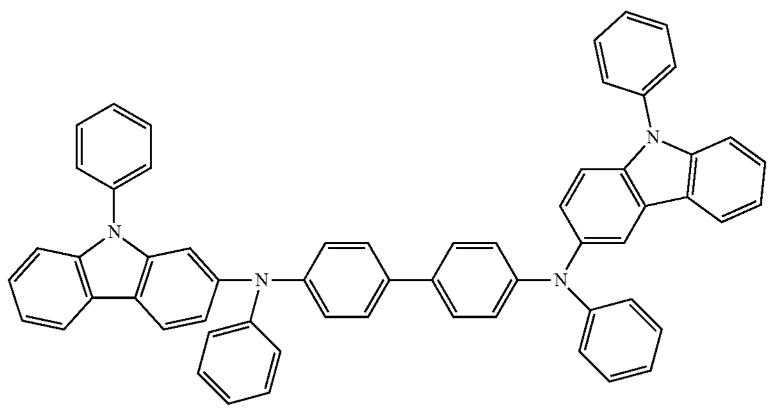
H-1-6
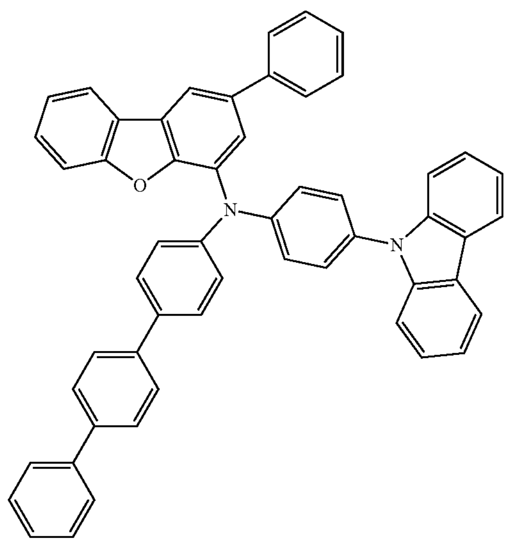
H-1-7
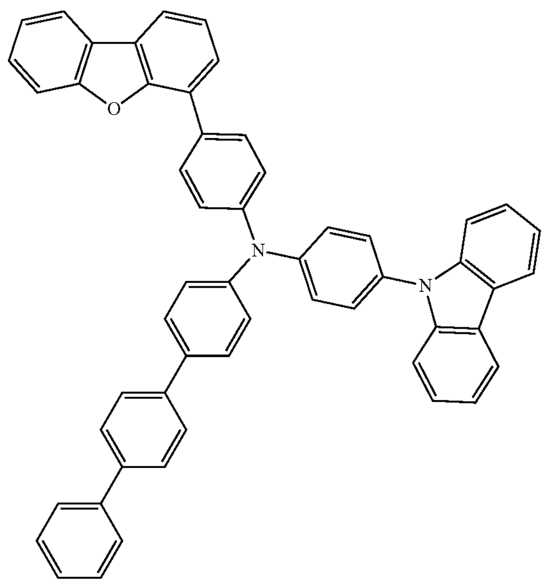

-continued
H-1-8
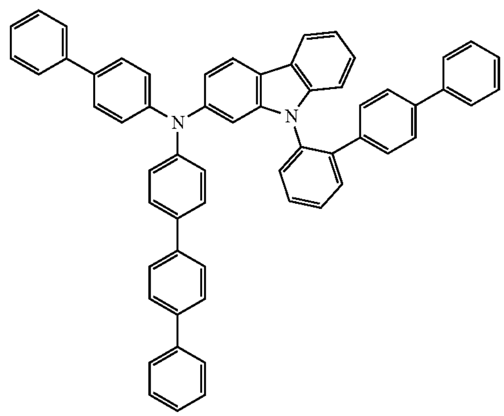
H-1-9
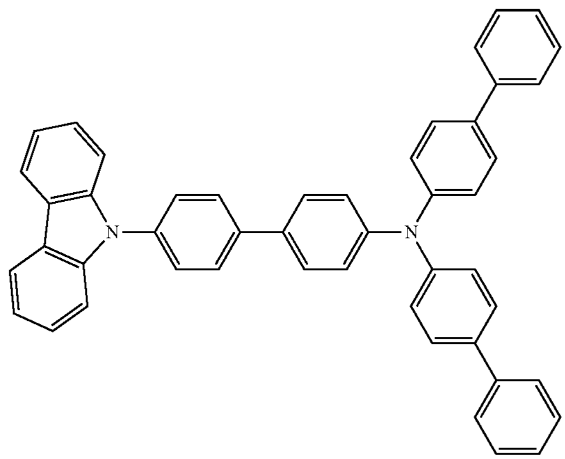
H-1-10
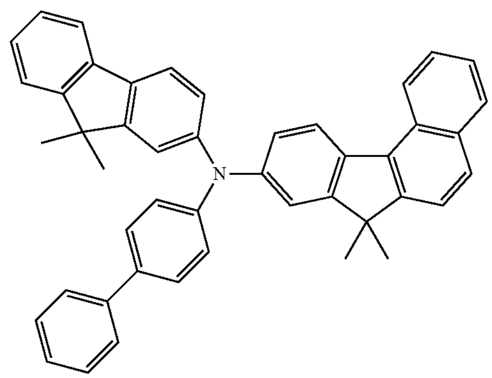
H-1-11
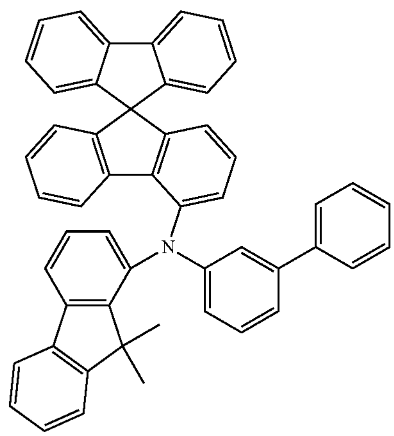
H-1-12
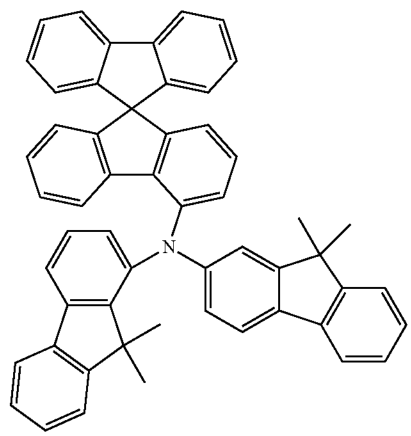
H-1-13
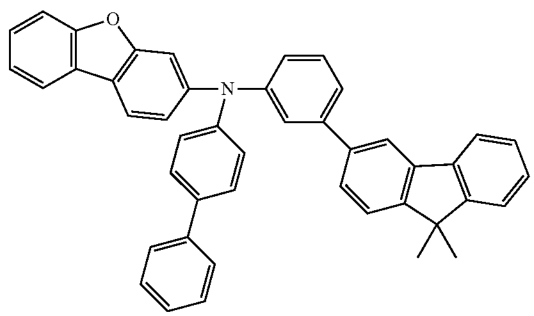

-continued
H-1-14
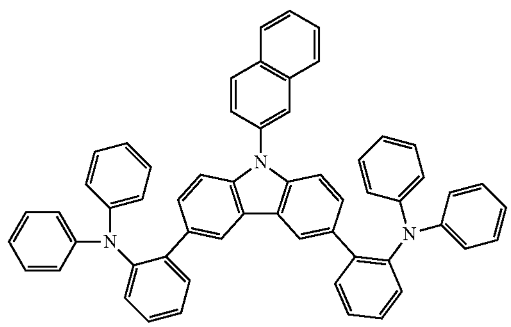
H-1-15
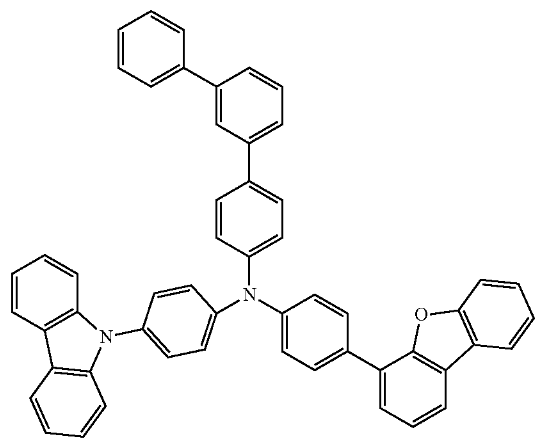
H-1-16
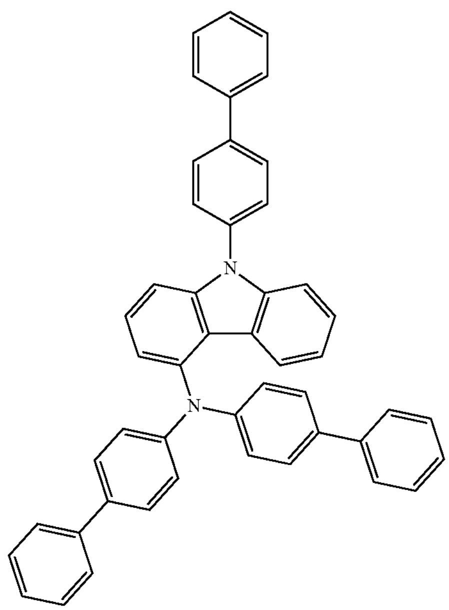
H-1-17
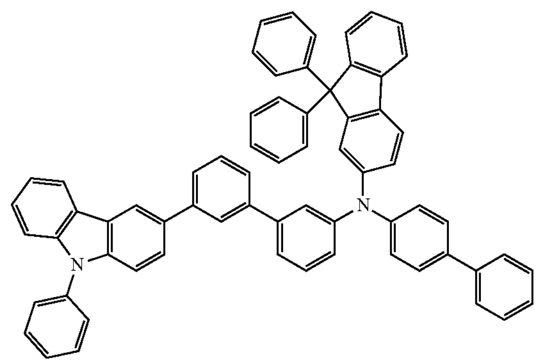

-continued

H-1-18

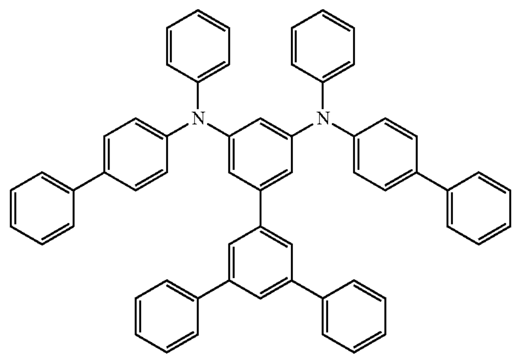

H-1-19

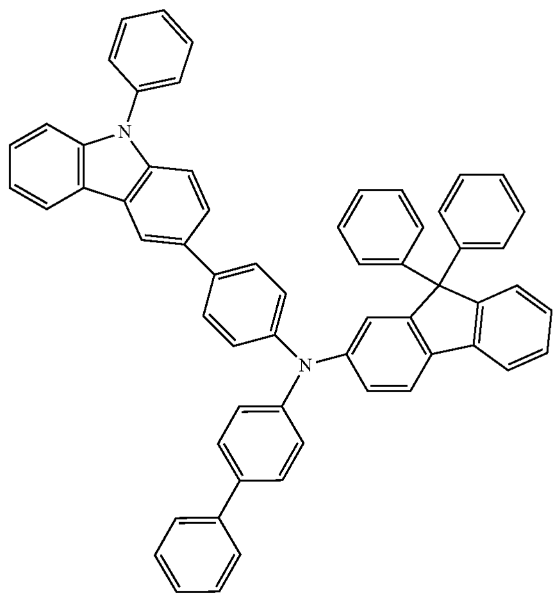

The hole transport region HTR may include a compound represented by Formula H-a. The compound represented by Formula H-a may be a monoamine compound.

[Formula H-a]

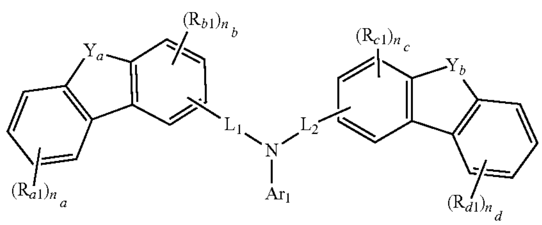

In Formula H-a, $Y_a$ and $Y_b$ may each independently be $C(R_{e1})(R_{f1})$, $N(R_{g1})$, O, or S. $Y_a$ and $Y_b$ may be the same as or different from each other. In an embodiment, $Y_a$ and $Y_b$ may each be $C(R_{e1})(R_{f1})$. In another embodiment, any one of $Y_a$ and $Y_b$ may be $C(R_{e1})(R_{f1})$, and the other of $Y_a$ and $Y_b$ may be $N(R_{g1})$.

In Formula H-a, $Ar_1$ may be a substituted or unsubstituted aryl group of 6 to 30 ring-forming carbon atoms, or a substituted or unsubstituted heteroaryl group of 2 to 30 ring-forming carbon atoms. For example, $Ar_1$ may be a substituted or unsubstituted phenyl group, a substituted or unsubstituted biphenyl group, a substituted or unsubstituted naphthyl group, a substituted or unsubstituted fluorenyl group, or a substituted or unsubstituted terphenyl group.

In Formula H-a, $L_1$ and $L_2$ may each independently be a direct linkage, a substituted or unsubstituted arylene group of 6 to 30 ring-forming carbon atoms, or a substituted or unsubstituted heteroarylene group of 2 to 30 ring-forming carbon atoms. For example, $L_1$ and $L_2$ may each independently be a direct linkage, a substituted or unsubstituted phenylene group, or a substituted or unsubstituted divalent biphenyl group.

In Formula H-a, $R_{a1}$ to $R_{g1}$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. For example, $R_{a1}$ to $R_{g1}$ may each independently be a hydrogen atom, a substituted or unsubstituted methyl group, or a substituted or unsubstituted phenyl group.

In Formula H-a, $n_a$ and $n_d$ may each independently be an integer from 0 to 4, and $n_b$ and n, may each independently be an integer from 0 to 3.

The hole transport region HTR may include a phthalocyanine compound such as copper phthalocyanine, $N^1$,$N^{1'}$-([1,1'-biphenyl]-4,4'-diyl)bis($N^1$-phenyl-$N^4$,$N^4$-di-m-tolylbenzene-1,4-diamine) (DNTPD), 4,4',4"-[tris(3-methylphenyl)phenylamino]triphenylamine (m-MTDATA), 4,4',4"-tris(N,N-diphenylamino)triphenylamine (TDATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthalene-1-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], and dipyrazino[2,3-f:2',3'-h] quinoxaline-2,3,6,7,10,11-hexacarbonitrile (HAT-CN).

The hole transport region HTR may include carbazole derivatives such as N-phenyl carbazole and polyvinyl carbazole, fluorene-based derivatives, N,N'-bis(3-methylphenyl)-N,N'-diphenyl-[1,1'-biphenyl]-4,4'-diamine (TPD), triphenylamine-based derivatives such as 4,4',4"-tris(N-carbazolyl)triphenylamine (TCTA), N,N'-di(1-naphthalene-1-yl)-N,N'-diphenyl-benzidine (NPB), 4,4'-cyclohexylidene bis[N,N-bis(4-methylphenyl)benzeneamine](TAPC), 4,4'-bis[N,N'-(3-tolyl)amino]-3,3'-dimethylbiphenyl (HMTPD), 1,3-bis(N-carbazolyl)benzene (mCP), etc.

The hole transport region HTR may include 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the compounds of the hole transport region in at least one of a hole injection layer HIL, a hole transport layer HTL, or an electron blocking layer EBL.

A thickness of the hole transport region HTR may be in a range of about 100 Å to about 10,000 Å. For example, the thickness of the hole transport region HTR may be in a range of about 100 Å to about 5,000 Å. In case where the hole transport region HTR includes a hole injection layer HIL, a thickness of the hole injection region HIL may be in a range of about 30 Å to about 1,000 Å. In case where the hole transport region HTR includes a hole transport layer HTL, a thickness of the hole transport layer HTL may be in a range of about 30 Å to about 1,000 Å. In case where the hole transport region HTR includes an electron blocking layer EBL, a thickness of the electron blocking layer EBL may be in a range of about 10 Å to about 1,000 Å. If the thicknesses of the hole transport region HTR, the hole injection layer HIL, the hole transport layer HTL, and the electron blocking layer EBL satisfy the above-described ranges, satisfactory hole transport properties may be achieved without a substantial increase of driving voltage.

The hole transport region HTR may further include a charge generating material to increase conductivity. The charge generating material may be dispersed uniformly or non-uniformly in the hole transport region HTR. The charge generating material may be, for example, a p-dopant. The p-dopant may include at least one of metal halide compounds, quinone derivatives, metal oxides, and cyano group-containing compounds, without limitation.

For example, the p-dopant may include metal halide compounds such as CuI and RbI, quinone derivatives such as tetracyanoquinodimethane (TCNQ) and 2,3,5,6-tetrafluoro-7,7',8,8-tetracyanoquinodimethane (F4-TCNQ), metal oxides such as tungsten oxide and molybdenum oxide, cyano group-containing compounds such as dipyrazino[2,3-f:2',3'-h]quinoxaline-2,3,6,7,10,11-hexacarbonitrile (HATCN) and 4-[[2,3-bis[cyano-(4-cyano-2,3,5,6-tetrafluorophenyl)methylidene]cyclopropylidene]-cyanomethyl]-2,3,5,6-tetrafluorobenzonitrile (NPD9), etc., without limitation.

As described above, the hole transport region HTR may further include at least one of a buffer layer (not shown) or an electron blocking layer EBL in addition to the hole injection layer HIL and the hole transport layer HTL. The buffer layer (not shown) may compensate for a resonance distance according to a wavelength of light emitted from an emission layer EML and may increase light emitting efficiency. As materials included in the buffer layer (not shown), materials which may be included in the hole transport region HTR may be used. The electron blocking layer EBL may block the injection of electrons from an electron transport region ETR to a hole transport region HTR.

The emission layer EML is provided on the hole transport region HTR. The emission layer EML may have a thickness, for example, in a range of about 100 Å to about 1,000 Å. For example, the emission layer EML may have a thickness in a range of about 100 Å to about 300 Å. The emission layer EML may be a layer formed of a single material, a layer formed of different materials, or a multilayer structure having layers formed of different materials.

In a light emitting device ED according to an embodiment, the emission layer EML may include a fused polycyclic compound of an embodiment.

The fused polycyclic compound of an embodiment has a plate type resonance structure including at least one boron atom, wherein at least one julolidine group is included. The julolidine group may be an aromatic amine in which an alkyl group including a nitrogen atom forms a ring structure with a benzene ring as a center. The fused polycyclic compound of an embodiment may have an extended conjugated structure through the additional fusion of an aromatic structure which may include a boron atom and a heteroatom, connected with the benzene ring of the julolidine group. In the fused polycyclic compound of an embodiment, the nitrogen atom of the julolidine group and the boron atom may be connected at para positions at the benzene ring of the julolidine group.

The fused polycyclic compound of an embodiment may be represented by Formula 1.

[Formula 1]

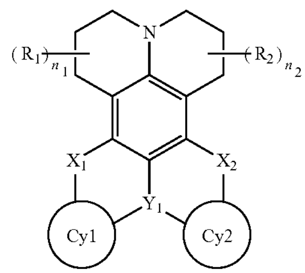

In Formula 1, $X_1$ and $X_2$ may each independently be $N(R_3)$, O, or S. $X_1$ and $X_2$ may be the same as or different from each other. For example, $X_1$ and $X_2$ may each be $N(R_3)$, or they may each be O, or they may each be S. For example, any one of $X_1$ and $X_2$ may be $N(R_3)$, and the remaining one of $X_1$ and $X_2$ may be O or S. For example, any one of $X_1$ and $X_2$ may be O, and the remaining one $X_1$ and $X_2$ may be S.

In Formula 1, $Y_1$ is B.

In Formula 1, $R_1$ and $R_2$ may each independently be a hydrogen atom, a deuterium atom, a halogen atom, a cyano group, a substituted or unsubstituted amine group, a substituted or unsubstituted alkyl group of 1 to 30 carbon atoms, a substituted or unsubstituted aryl group of 6 to 60 ring-forming carbon atoms, or a substituted or unsubstituted heteroaryl group of 2 to 60 ring-forming carbon atoms, or may be combined with an adjacent group to form a ring.

For example, $R_1$ and $R_2$ may each independently be a hydrogen atom.

In Formula 1, $R_3$ may be a hydrogen atom, a deuterium atom, a halogen atom, a substituted or unsubstituted alkyl group of 1 to 30 carbon atoms, a substituted or unsubstituted aryl group of 6 to 60 ring-forming carbon atoms, or a substituted or unsubstituted heteroaryl group of 2 to 60 ring-forming carbon atoms, or may be combined with an adjacent group to form a ring. For example, $R_3$ may be a hydrogen atom, a deuterium atom, a halogen atom, a substituted or unsubstituted phenyl group, a substituted or unsubstituted biphenyl group, a substituted or unsubstituted terphenyl group, a substituted or unsubstituted fluorenyl group, a substituted or unsubstituted naphthyl group, or a substituted or unsubstituted tetrahydronaphthyl group.

In Formula 1, $n_1$ and $n_2$ may each independently be an integer from 0 to 6. If $n_1$ and $n_2$ are each 0, the fused polycyclic compound of an embodiment may not be substituted with $R_1$ and $R_2$, respectively. In Formula 1, a case where $n_1$ and $n_2$ are each 6, and $R_1$ and $R_2$ are all hydrogen atoms may be the same as a case where $n_1$ and $n_2$ are each 0 in Formula 1. If $n_1$ and $n_2$ are 2 or more, $R_i$ groups and $R_2$ groups may be the same, or at least one of the $R_i$ groups and the $R_2$ groups may be different.

In Formula 1, Cy1 and Cy2 may each independently be a substituted or unsubstituted aromatic hydrocarbon ring of 6 to 60 ring-forming carbon atoms, or a substituted or unsubstituted aromatic heterocycle of 2 to 60 ring-forming carbon atoms, may be combined with an adjacent group to form a ring. For example, Cy1 may be combined with an adjacent $X_1$ group to form a ring, and Cy2 may be combined with an adjacent $X_2$ group to form a ring. In an embodiment, any one of $X_1$ and $X_2$ may be $N(R_3)$, and any one of Cy1 and Cy2 may be connected with $N(R_3)$. For example, $X_1$ and $X_2$ may each be $N(R_3)$, and Cy1 and Cy2 may each be connected with $X_1$ and $X_2$, respectively. For example, the $R_3$ groups may be the same as or different from each other.

In an embodiment, in Formula 1, Cy1 and Cy2 may each independently be a group represented by Formula 2 or Formula 3. In an embodiment, Cy1 and Cy2 may each have a structure represented by Formula 2 or Formula 3. For example, any one of Cy1 and Cy2 may have a structure represented by Formula 2, and the remaining one of Cy1 and Cy2 may have a structure represented by Formula 3.

[Formula 2]

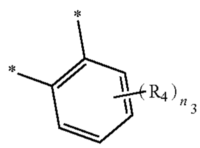

In Formula 2, $R_4$ may be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. For example, $R_4$ may be a hydrogen atom, a deuterium atom, a halogen atom, a substituted or unsubstituted alkyl group of 1 to 20 carbon atoms, a substituted or unsubstituted phenyl group, a substituted or unsubstituted carbazole group, or a substituted or unsubstituted amine group. For example, multiple $R_4$ groups may be provided, and adjacent $R_4$ groups may be combined with each other to form a ring.

In Formula 2, $n_3$ may be an integer from 0 to 4. In Formula 2, if $n_3$ is 0, the fused polycyclic compound of an embodiment may not be substituted with $R_4$. In Formula 2, a case where $n_3$ is 4, and all $R_4$ are hydrogen atoms may be the same as a case where $n_3$ is 0 in Formula 2. If $n_3$ is 2 or more, $R_4$ groups may be all the same, or at least one $R_4$ group may be different.

In Formula 2, —* indicates positions connected with $X_1$ and $Y_1$ of Formula 1, or indicates positions connected with $X_2$ and $Y_1$ of Formula 1, respectively.

[Formula 3]

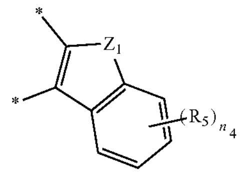

In Formula 3, $Z_1$ may be $N(R_6)$, O, or S.

In Formula 3, $R_5$ may be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In Formula 3, $R_6$ may be a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula 3, $n_4$ may be an integer from 0 to 4. In Formula 3, if $n_4$ is 0, the fused polycyclic compound of an embodiment may not be substituted with $R_5$. In Formula 3, a case where $n_4$ is 4, and all $R_5$ groups are hydrogen atoms may be the same as a case where $n_4$ is 0 in Formula 3. If $n_4$ is 2 or more, $R_5$ groups may be all the same, or at least one $R_5$ group may be different.

In Formula 3, —* indicates positions connected with $X_1$ and $Y_1$ of Formula 1, or indicates positions connected with $X_2$ and $Y_1$ of Formula 1, respectively.

In an embodiment, Cy1 may be a structure represented by Formula 3, a position of —* that is adjacent to $Z_1$ may be connected with $Y_1$, and a position of —* that is not adjacent to $Z_1$ may be connected with $X_1$. In another embodiment, a position of —* that is adjacent to $Z_1$ may be connected with $X_1$, and a position of —* that is not adjacent to $Z_1$ may be connected with $Y_1$.

In an embodiment, Cy2 may be a structure represented by Formula 3, a position of —* that is adjacent to $Z_1$ may be connected with $Y_1$, and a position of —* that is not adjacent to $Z_1$ may be connected with $X_2$. In another embodiment, a position of —* that is adjacent to $Z_1$ may be connected with $X_2$, and a position of —* that is not adjacent to $Z_1$ may be connected with $Y_1$.

The fused polycyclic compound of an embodiment includes a plate type skeleton structure with one boron atom as a center, and has a structure including at least one julolidine group in the plate type structure. The fused polycyclic compound of an embodiment includes at least one julolidine group connected with a boron atom, and the boron atom may be substituted at a para position with respect to the nitrogen atom of the julolidine group. Since the fused polycyclic compound of an embodiment has a structure in which a heteroatom is substituted at an ortho position with respect to a boron atom with the benzene ring of the julolidine group as a center, an aromatic ring may be fused with an additional moiety. For example, the structure of a group represented by Formula 2 or Formula 3 may be included in the plate type structure. Accordingly, the fused polycyclic compound of an embodiment may have a low $\Delta E_{ST}$ value, and a polycyclic aromatic ring structure may be stabilized, and accordingly, a wavelength region may be selected so as to be suitable as a material for emitting blue light, and if applied to a light emitting device, the efficiency of the light emitting device may be improved. The fused polycyclic compound of an embodiment has high electron density in a core skeleton structure through the julolidine group and has a structure in which the p-orbital of a boron atom is protected. Accordingly, the molecular stability of the fused polycyclic compound may be increased, and if applied to a light emitting device, the life and emission efficiency of the light emitting device may be improved.

In an embodiment, if Cy1 and Cy2 are each a group represented by Formula 2, then Cy1 and Cy2 may each independently be a group represented by any one of Formula 2-1 to Formula 2-3. Formula 2-1 to Formula 2-3 represent cases of Formula 2 where a bonding position of $R_4$ and the type of the substituent are specified. Formula 2-2 represents a case of Formula 2 where multiple $R_4$ are provided, substituted at a para position and a meta position with respect to a position of —*, and combined with each other to form an additional ring. Formula 2-3 represents a case of Formula 2 where multiple $R_4$ are provided, substituted at a para position, a meta position and an ortho position with respect to a position of —*, and combined with each other to form an additional ring. If one of Cy1 and Cy2 is a group represented by Formula 2-3, the fused polycyclic compound represented by Formula 1 may be a compound that includes two julolidine groups. If Cy1 and Cy2 are each a group represented by Formula 2-3, the fused polycyclic compound represented by Formula 1 may be a compound that includes three julolidine groups.

[Formula 2-1]

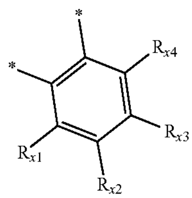

In Formula 2-1, $R_{x1}$ to $R_{x4}$ may each independently be a hydrogen atom, a deuterium atom, a halogen atom, a substituted or unsubstituted alkyl group of 1 to 10 carbon atoms, a substituted or unsubstituted phenyl group, a substituted or unsubstituted carbazole group, or a substituted or unsubstituted amine group, or may be combined with an adjacent group to form a ring.

In Formula 2-1, —* indicates positions connected with $X_1$ and $Y_1$ of Formula 1, or indicates positions connected with $X_2$ and $Y_1$ of Formula 1, respectively.

[Formula 2-2]

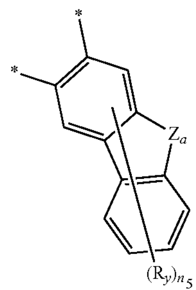

In Formula 2-2, $Z_a$ may be $C(R_7)(R_8)$, $N(R_9)$, O, or S.

In Formula 2-2, $R_y$, $R_7$, and $R_8$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In Formula 2-2, $R_9$ may be a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula 2-2, $n_5$ may be an integer from 0 to 6. In Formula 2-2, if $n_5$ is 0, the fused polycyclic compound of an embodiment may not be substituted with $R_y$. In Formula 2-2, a case where $n_5$ is 6, and $R_y$ groups are all hydrogen atoms may be the same as Formula 2-2 where $n_5$ is 0. If $n_5$ is 2 or more, $R_y$ groups may be the same, or at least one $R_y$ group may be different.

In Formula 2-2, —* indicates positions connected with $X_1$ and $Y_1$ of Formula 1, or indicates positions connected with $X_2$ and $Y_1$ of Formula 1, respectively.

In an embodiment, Cy1 may be a group represented by Formula 2-2, a position of —* that is bonded to a para position with respect to $Z_a$ may be connected with $Y_1$, and a position of —* that is bonded to a meta position with respect to $Z_a$ may be connected with $X_1$. In another embodiment, a position of —* that is bonded to a para position with respect to $Z_a$ may be connected with $X_1$, and a position of —* that is bonded to a meta position with respect to $Z_a$ may be connected with $Y_1$.

In an embodiment, Cy2 may be a group represented by Formula 2-2, a position of —* that is bonded to a para position with respect to $Z_a$ may be connected with $Y_1$, and a position of —* that is bonded to a meta position with respect to $Z_a$ may be connected with $X_2$. In another embodiment, a position of —* that is bonded to a para position with respect to $Z_a$ may be connected with $X_2$, and a position of —* that is bonded to a meta position with respect to $Z_a$ may be connected with $Y_1$.

[Formula 2-3]

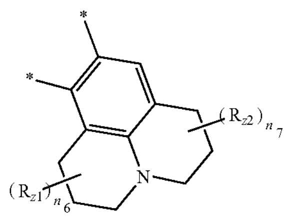

In Formula 2-3, $R_{z1}$ and $R_{z2}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In Formula 2-3, $n_6$ and $n_7$ may each independently be an integer from 0 to 6. If $n_6$ and $n_7$ are each 0, the fused polycyclic compound of an embodiment may not be substituted with $R_{z1}$ and $R_{z2}$, respectively. A case where $n_6$ and $n_7$ are each 6, and $R_{z1}$ groups and $R_{z2}$ groups are all hydrogen atoms may be the same as Formula 2-3 where $n_6$ and $n_7$ are each 0. If each of $n_6$ and $n_7$ is 2 or more, $R_{z1}$ groups and $R_{z2}$ groups may be the same, or at least one of $R_{z1}$ groups and $R_{z2}$ groups may be different.

In Formula 2-3, ——* indicates positions connected with $X_1$ and $Y_1$ of Formula 1, or indicates positions connected with $X_2$ and $Y_1$ of Formula 1, respectively.

In an embodiment, Cy1 may be a group represented by Formula 2-3, a position of ——* that is bonded to a para position with respect to the nitrogen atom of Formula 2-3 may be connected with $Y_1$, and a position of ——* that is bonded to a meta position with respect to the nitrogen atom of Formula 2-3 may be connected with $X_1$. In another embodiment, a position of ——* that is bonded to a para position with respect to the nitrogen atom of Formula 2-3 may be connected with $X_1$, and a position of ——* that is bonded to a meta position with respect to the nitrogen atom of Formula 2-3 may be connected with $Y_1$.

In an embodiment, Cy2 may be a group represented by Formula 2-3, a position of ——* that is bonded to a para position with respect to the nitrogen atom of Formula 2-3 may be connected with $Y_1$, and a position of ——* that is bonded to a meta position with respect to the nitrogen atom of Formula 2-3 may be connected with $X_2$. In another embodiment, a position of ——* that is bonded to a para position with respect to the nitrogen atom of Formula 2-3 may be connected with $X_2$, and a position of ——* that is bonded to a meta position with respect to the nitrogen atom of Formula 2-3 may be connected with $Y_1$.

In an embodiment, the fused polycyclic compound represented by Formula 1 may be represented by any one of Formula 4-1 to Formula 4-3.

[Formula 4-1]

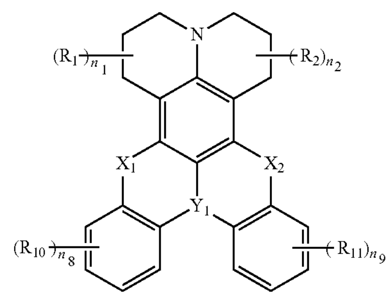

[Formula 4-2]

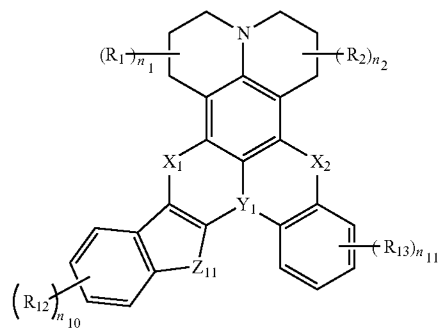

[Formula 4-3]

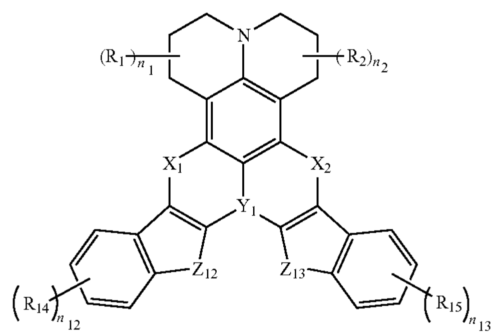

Formula 4-1 to Formula 4-3 represent Formula 1 where the structures of Cy1 and Cy2 are specified. Formula 4-1 represents a case of Formula 1 where Cy1 and Cy2 are each a group represented by Formula 2. Formula 4-2 represents a case of Formula 1 where Cy1 is a group represented by Formula 3, and Cy2 is a group represented by Formula 2. Formula 4-3 represents a case of Formula 1 where Cy1 and Cy2 are each a group represented by Formula 3.

In Formula 4-1 to Formula 4-3, $Z_{11}$ to $Z_{13}$ may each independently be $N(R_{16})$, O, or S. In Formula 4-3, $Z_{12}$ and $Z_{13}$ may be the same as or different from each other. For example, $Z_{12}$ and $Z_{13}$ may each be $N(R_{16})$, $Z_{12}$ and $Z_{13}$ may each be O, or $Z_{12}$ and $Z_{13}$ may each be S. In another embodiment, any one of $Z_{12}$ and $Z_{13}$ may be $N(R_{16})$, and the remaining one of $Z_{12}$ and $Z_{13}$ may be O or S. In another embodiment, any one of $Z_{12}$ and $Z_{13}$ may be O, and the remaining one of $Z_{12}$ and $Z_{13}$ may be S.

In Formula 4-1 to Formula 4-3, $R_{10}$ to $R_{15}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. For example, $R_{10}$ to $R_{15}$ may each independently be a hydrogen atom, a deuterium atom, a halogen atom, a substituted or unsubstituted alkyl group of 1 to 20 carbon atoms, a substituted or unsubstituted phenyl group, a substituted or unsubstituted carbazole group, or a substituted or unsubstituted amine group. In an embodiment, multiple $R_{10}$ to $R_{15}$ groups may be provided, and adjacent $R_{10}$ to $R_{15}$ groups may be combined with each other to form a ring.

In Formula 4-1 to Formula 4-3, $R_{16}$ may be a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula 4-1 to Formula 4-3, $n_8$ to $n_{13}$ may each independently be an integer from 0 to 4. If $n_8$ to $n_{13}$ are each 0, the fused polycyclic compound of an embodiment may not be substituted with $R_{10}$ to $R_{15}$, respectively. A case where $n_8$ to $n_{13}$ are each 4, and $R_{10}$ to $R_{15}$ are all hydrogen atoms may be the same as a case where $n_8$ to $n_{13}$ are each 0. If $n_8$ to $n_{13}$ are 2 or more, multiple $R_{10}$ to $R_{15}$ groups may be the same, or at least one of $R_{10}$ and $R_{15}$ groups may be different.

In Formula 4-1 to Formula 4-3, $X_1$, $X_2$, $Y_1$, $R_i$, $R_2$, $n_1$, and $n_2$ may be the same as defined in Formula 1.

In an embodiment, the fused polycyclic compound represented by Formula 1 may be represented by any one of Formula 5-1 to Formula 5-3.

[Formula 5-1]

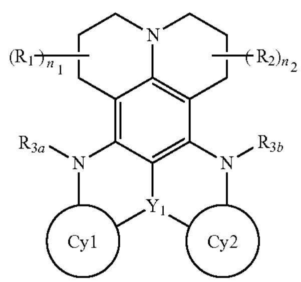

[Formula 5-2]

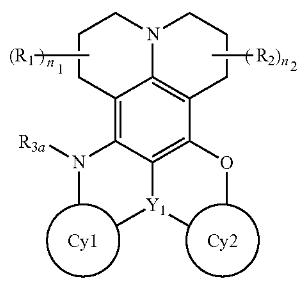

[Formula 5-3]

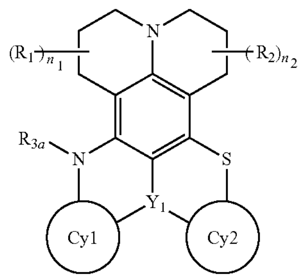

Formula 5-1 to Formula 5-3 represent Formula 1 where $X_1$ and $X_2$ are each specified. Formula 5-1 represents a case where $X_1$ and $X_2$ are each $N(R_3)$. Formula 5-2 represents a case where $X_1$ is $N(R_3)$, and $X_2$ is O. Formula 5-3 represents a case where $X_1$ is $N(R_3)$, and $X_2$ is S.

In Formula 5-1 to Formula 5-3, $R_{3a}$ and $R_{3b}$ may each independently be a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. For example, $R_{3a}$ and $R_{3b}$ may each independently be a hydrogen atom, a deuterium atom, a halogen atom, a substituted or unsubstituted phenyl group, a substituted or unsubstituted biphenyl group, a substituted or unsubstituted terphenyl group, a substituted or unsubstituted fluorenyl group, a substituted or unsubstituted naphthyl group, or a substituted or unsubstituted tetrahydronaphthyl group. In an embodiment, $R_{3a}$ may be combined with a substituent included in Cy1 to form a ring, and $R_{3b}$ may be combined with a substituent included in Cy2 to form a ring.

In Formula 5-1 to Formula 5-3, Cy1, Cy2, $Y_1$, $R_1$, $R_2$, $n_1$, and $n_2$ may each be the same as defined in Formula 1.

In an embodiment, the fused polycyclic compound represented by Formula 1 may be represented by any one of Formula 6-1 to Formula 6-3.

[Formula 6-1]

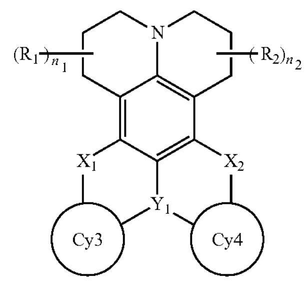

[Formula 6-2]

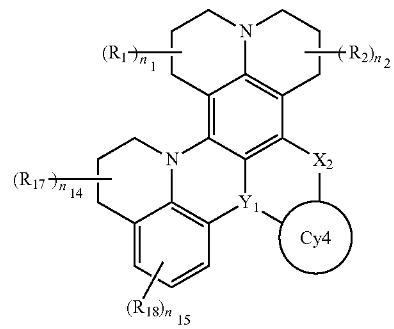

[Formula 6-3]

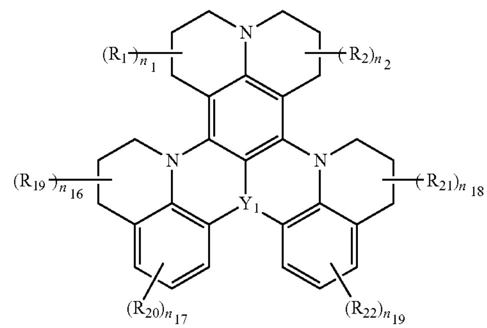

In Formula 6-1 to Formula 6-3, Cy3 and Cy4 may each independently be a substituted or unsubstituted aromatic hydrocarbon ring of 6 to 30 ring-forming carbon atoms, or a substituted or unsubstituted aromatic heterocycle of 2 to 30 ring-forming carbon atoms.

Formula 6-2 represents a case where Cy1 of Formula 1 is a group represented by Formula 2, $X_1$ is $N(R_3)$, and $X_1$ and Cy1 in Formula 1 are combined with each other to form a ring. Formula 6-3 represents a case where Cy1 and Cy2 of Formula 1 are each a group represented by Formula 2, $X_1$ and $X_2$ are each $N(R_3)$, $X_1$ and Cy1 in Formula 1 are combined with each other to form a ring, and $X_2$ and Cy2 are combined with each other to form a ring.

In Formula 6-1 to Formula 6-3, $R_{17}$ to $R_{22}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In Formula 6-2 and Formula 6-3, $n_{14}$, $n_{16}$, and $n_{18}$ may each independently be an integer from 0 to 6, and $n_{15}$, $n_{17}$, and $n_{19}$ may each independently be an integer from 0 to 3.

If $n_{14}$, $n_{16}$, and $n_{18}$ are each 0, the fused polycyclic compound according to an embodiment may not be substituted with $R_{17}$, $R_{19}$, and $R_{21}$, respectively. A case where $n_{14}$, $n_{16}$, and $n_{18}$ are each 6, and $R_{17}$, $R_{19}$, and $R_{21}$ are all hydrogen atoms may be the same as a case where $n_{14}$, $n_{16}$, and $n_{18}$ are each 0. If $n_{14}$, $n_{16}$, and $n_{18}$ are 2 or more, $R_{17}$, $R_{19}$, and $R_{21}$ groups may be all the same, or at least one of $R_{17}$, $R_{19}$, and $R_{21}$ groups may be different.

If $n_{15}$, $n_{17}$, and $n_{19}$ are each 0, the fused polycyclic compound according to an embodiment may not be substituted with $R_{18}$, $R_{20}$, and $R_{22}$, respectively. A case where $n_{15}$, $n_{17}$, and $n_{19}$ are each 3, and $R_{18}$, $R_{20}$, and $R_{22}$ are all hydrogen atoms may be the same as a case where $n_{15}$, $n_{17}$, and $n_{19}$, are each 0. If $n_{15}$, $n_{17}$, and $n_{19}$ are 2 or more, $R_{18}$, $R_{20}$, and $R_{22}$ groups may be all the same, or at least one of $R_{18}$, $R_{20}$, and $R_{22}$ groups may be different.

In Formula 6-1 to Formula 6-3, $X_1$, $X_2$, $Y_1$, $R_1$, $R_2$, $n_1$, and $n_2$ may be the same as described in Formula 1.

The fused polycyclic compound of an embodiment may be any one selected from Compound Group 1. A light emitting device ED of an embodiment may include at least one fused polycyclic compound selected from Compound Group 1 in an emission layer EML.

[Compound Group 1]

1

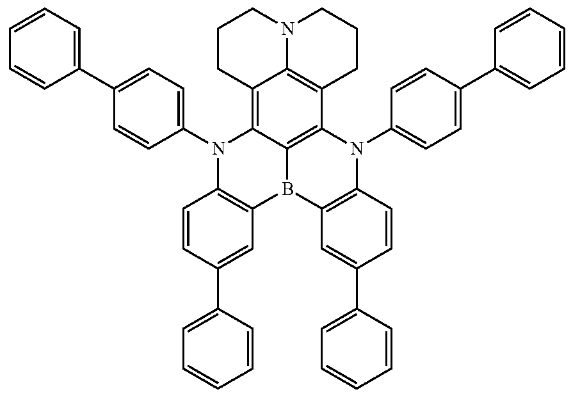

-continued

2

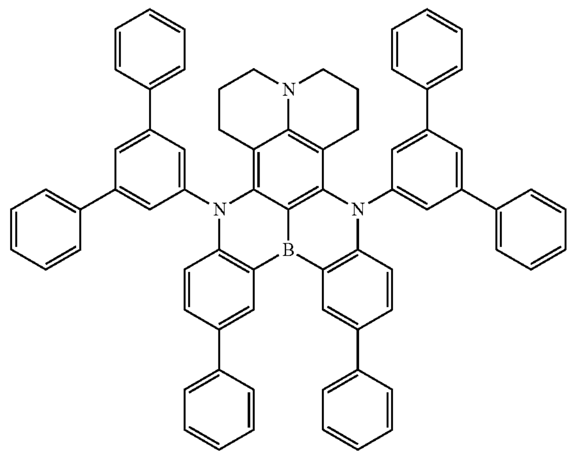

3

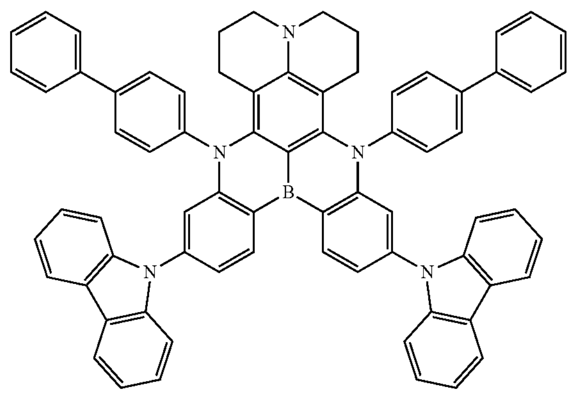

4

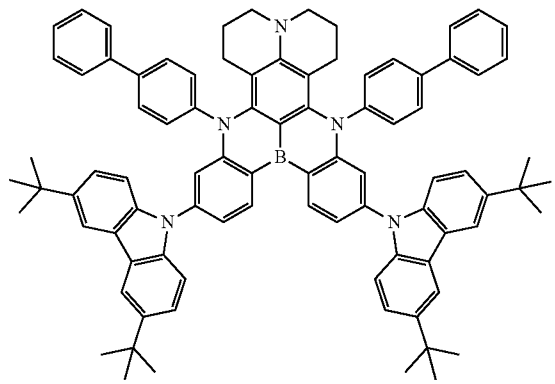

5
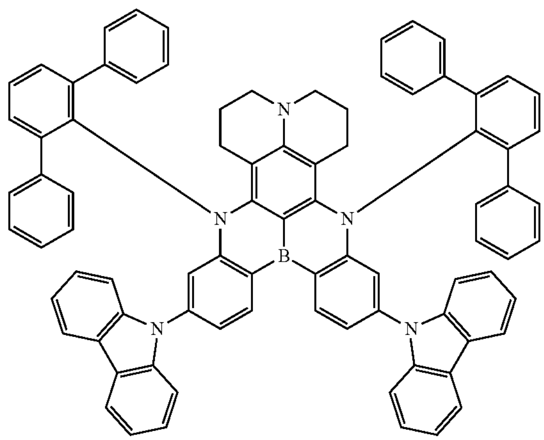
6
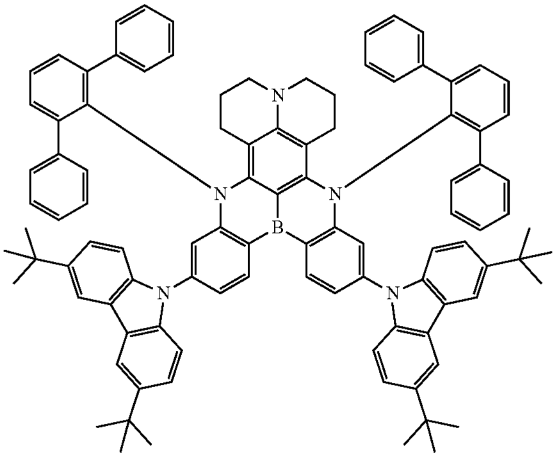
7
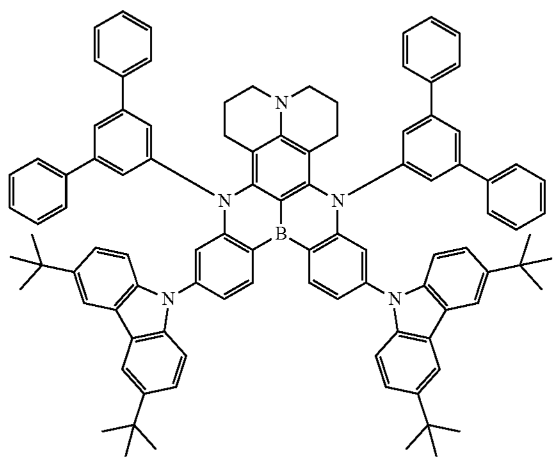
8
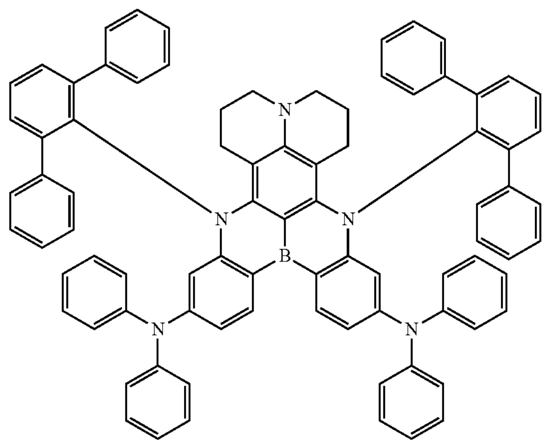
9
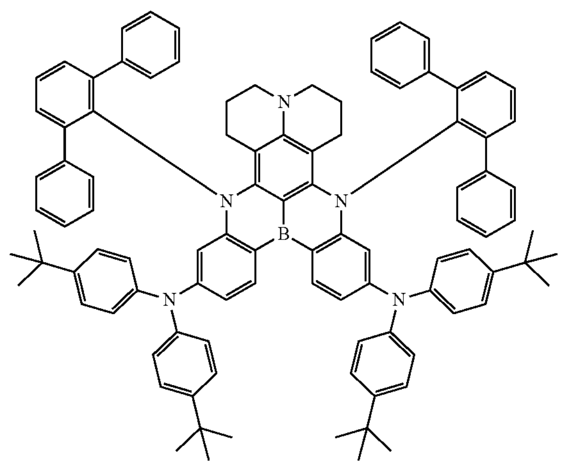
10
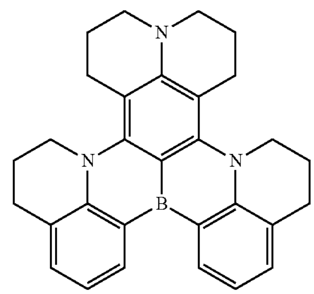

-continued
11
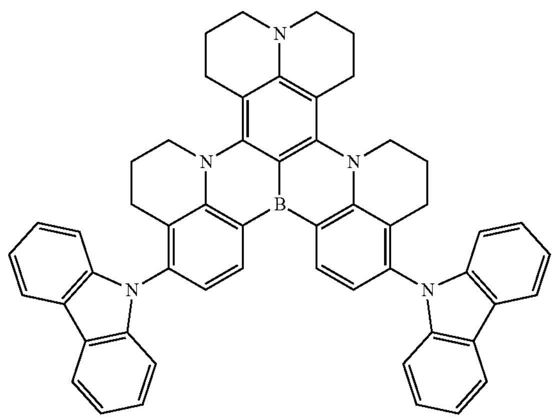
12
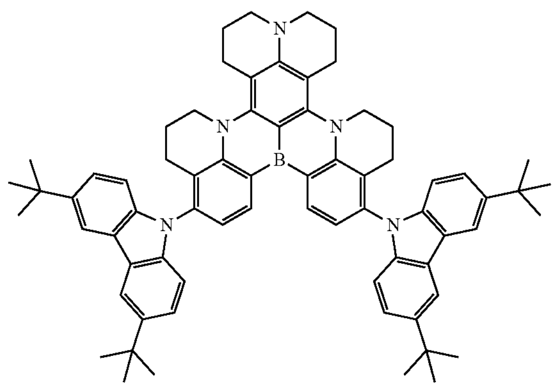
13
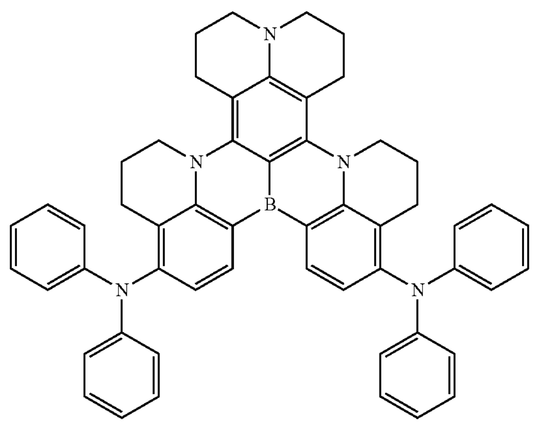
14
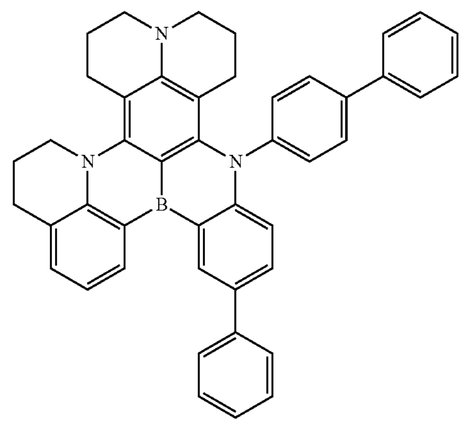
15
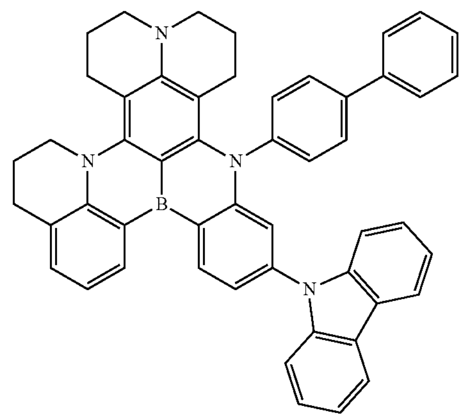
16
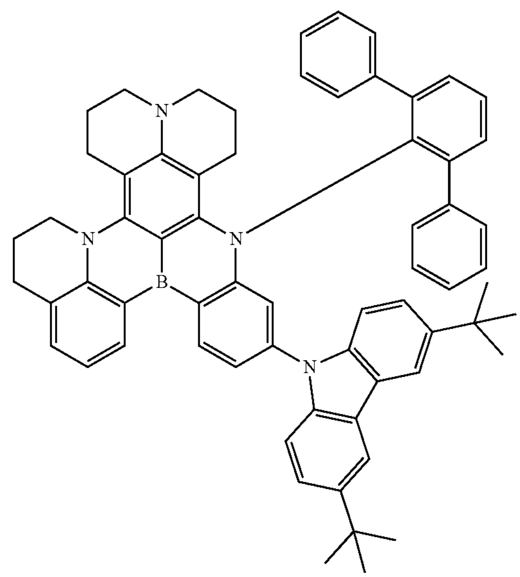

-continued
17
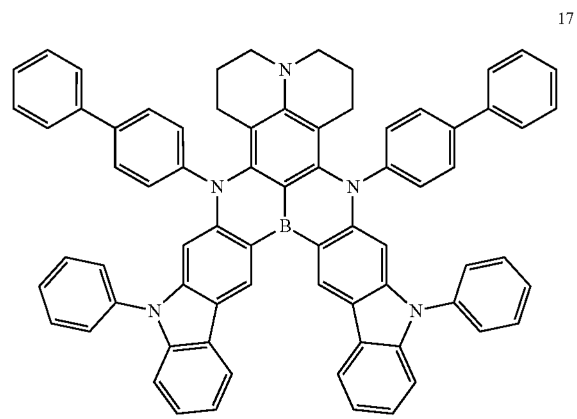
18
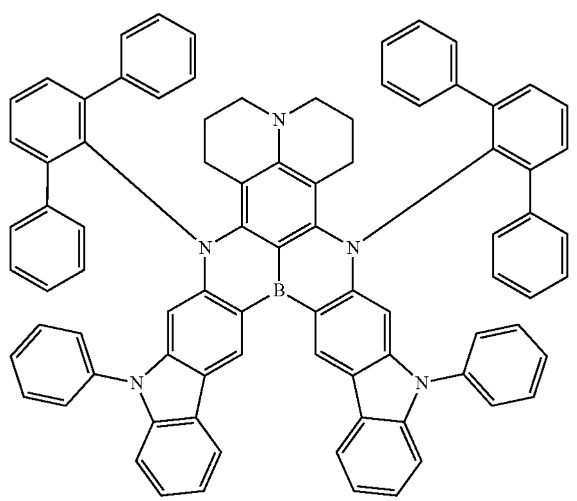
19
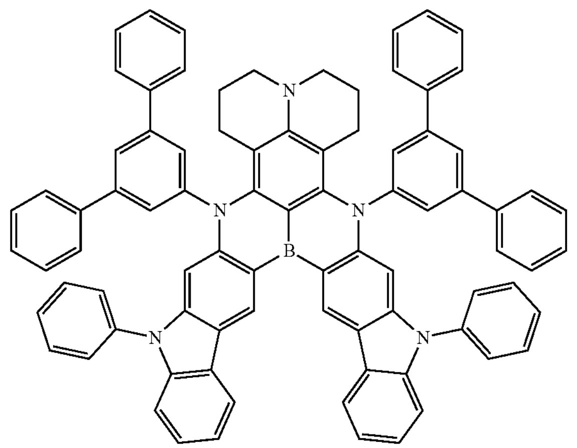
-continued
20
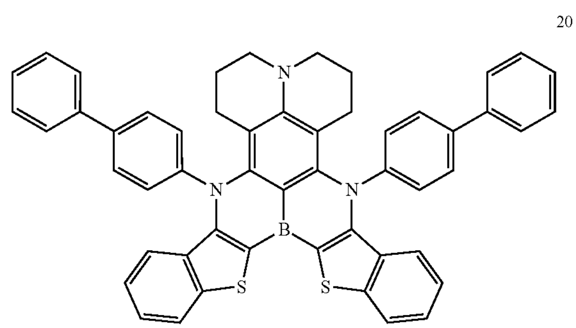
21
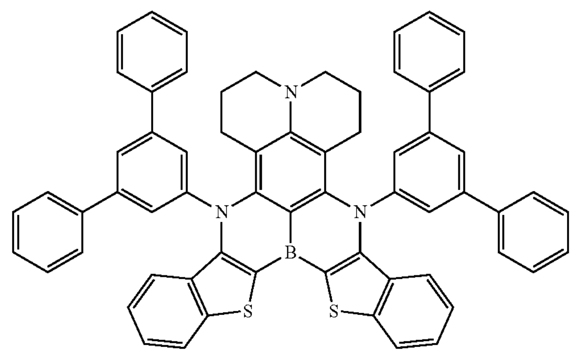
22
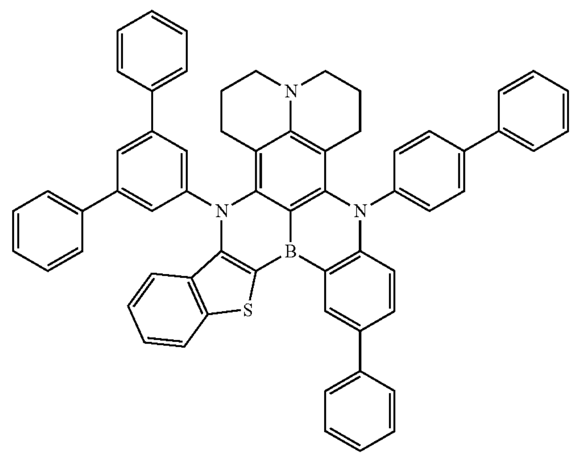
23
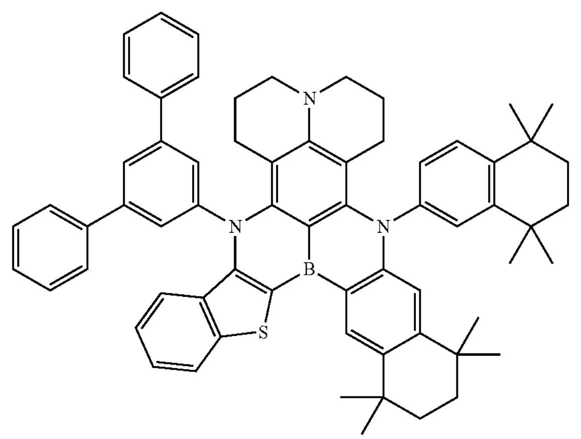

-continued

24

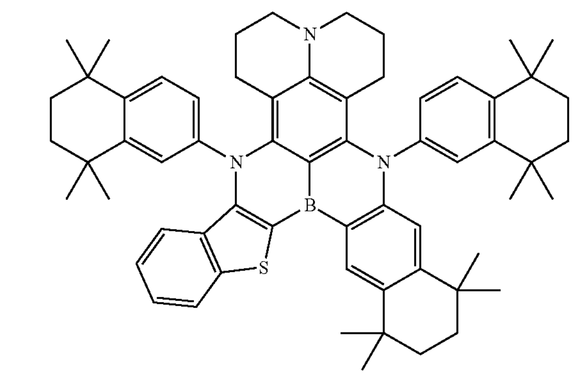

25

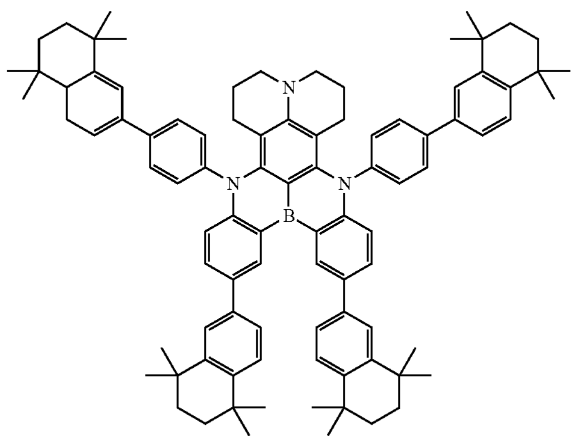

26

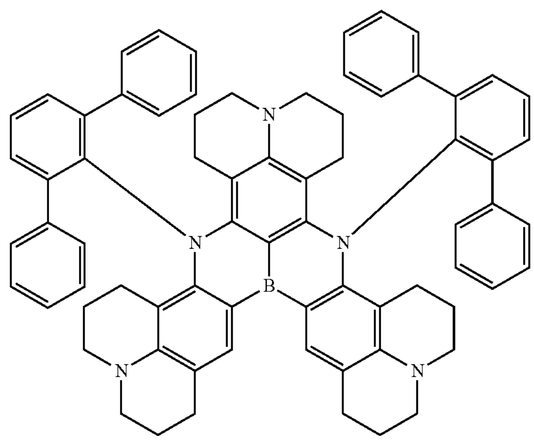

-continued

27

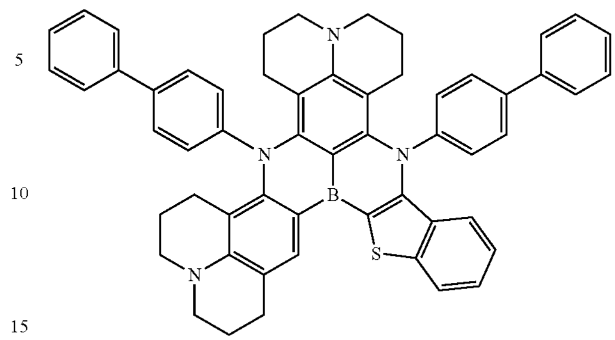

28

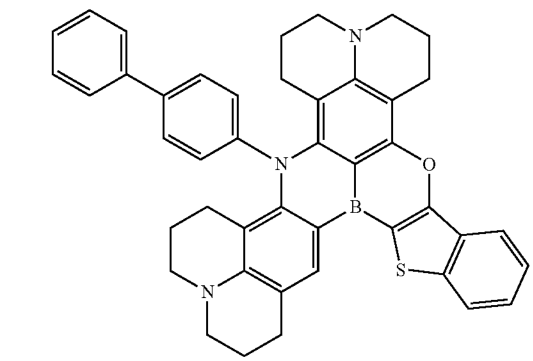

29

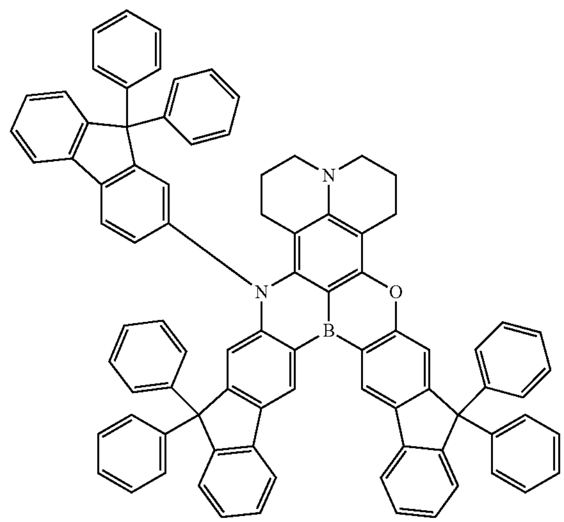

.

The fused polycyclic compound according to an embodiment has a structure including at least one julolidine group in a plate type skeleton structure with one boron atom as a center. The julolidine group is an aromatic amine having a structure in which an alkyl amine forms a ring with a benzene ring, and acts as a stronger electron donor than a conventional aryl amine group, and accordingly, high electron density may be provided into a core skeleton structure, and effects of protecting the p-orbital of a boron atom may be shown.

When the fused polycyclic compound of an embodiment includes the julolidine group, rigidity in a molecule may increase, structural change in an excited state and a ground state may be small, and stokes shift may be largely reduced. Accordingly, blue light with high color purity may be achieved. With a reduction of the stokes shift, the maximum absorption wavelength of a delayed fluorescence material may increase, a spectrum overlapping area with the wavelength of the light emitted of a host material may increase, and it may be advantageous in regard of energy transition efficiency. Therefore, when the fused polycyclic compound according to an embodiment is used as a delayed fluorescence dopant of an emission layer, emission efficiency and color purity may be improved, a host having a relatively long emission wavelength may be selected, and there may be a wide choice of selection of a host material.

The light emission spectrum of the fused polycyclic compound of an embodiment, represented by Formula 1, may have a full width at half maximum (FWHM) in a range of about 10 nm to about 50 nm. For example, the light emission spectrum of the fused polycyclic compound of an embodiment, represented by Formula 1, may have a FWHM in a range of about 20 nm to about 40 nm. Since the light emission spectrum of the fused polycyclic compound of an embodiment, represented by Formula 1, has the full width at half maximum in the ranges as described above, emission efficiency may be improved when the fused polycyclic compound of an embodiment is applied to a light emitting device. When the fused polycyclic compound is used as a material for a blue light emitting device, device life may be improved.

The fused polycyclic compound of an embodiment, represented by Formula 1, may be a material for emitting thermally activated delayed fluorescence. The fused polycyclic compound of an embodiment represented by Formula 1 may be a thermally activated delayed fluorescence dopant having a difference ($\Delta E_{ST}$) between the lowest triplet excitation energy level (T1 level) and the lowest singlet excitation energy level (S1 level) equal to or less than about 0.6 eV. The fused polycyclic compound of an embodiment represented by Formula 1 may be a thermally activated delayed fluorescence dopant having a difference ($\Delta E_{ST}$) between the lowest triplet excitation energy level (T1 level) and the lowest singlet excitation energy level (S1 level) equal to or less than about 0.2 eV.

The fused polycyclic compound of an embodiment, represented by Formula 1, may be a light emitting material having a central wavelength in a range of about 430 nm to about 490 nm. For example, the fused polycyclic compound of an embodiment, represented by Formula 1 may be a blue thermally activated delayed fluorescence (TADF) dopant. However, embodiments are not limited thereto. When the fused polycyclic compound of an embodiment is used as a light emitting material, the fused polycyclic compound may be used as a dopant material emitting light in various wavelength regions including a red light emitting dopant, a green light emitting dopant, etc.

In the light emitting device ED of an embodiment, an emission layer EML may emit delayed fluorescence. For example, the emission layer EML may emit thermally activated delayed fluorescence (TADF).

The emission layer EML of the light emitting device ED may emit blue light. For example, the emission layer EML of the light emitting device ED may emit blue light in a wavelength region equal to or less than about 490 nm. However, embodiments are not limited thereto. The emission layer EML may emit green light or red light.

In an embodiment, the emission layer EML may include a host and a dopant and may include the fused polycyclic compound as the dopant. For example, in the light emitting device ED of an embodiment, the emission layer EML may include a host for emitting delayed fluorescence and a dopant for emitting delayed fluorescence. The fused polycyclic compound may include the dopant for emitting delayed fluorescence. For example, in an embodiment, the emission layer EML may be a delayed fluorescence emission layer including a host and a dopant, and the dopant may include the fused polycyclic compound. The emission layer EML may include at least one fused polycyclic compound selected from Compound Group 1 as a thermally activated delayed fluorescence dopant.

In the light emitting device ED of an embodiment, the emission layer EML may include anthracene derivatives, pyrene derivatives, fluoranthene derivatives, chrysene derivatives, dihydrobenzanthracene derivatives, or triphenylene derivatives. For example, the emission layer EML may include anthracene derivatives or pyrene derivatives.

In the light emitting devices ED of embodiments shown in each of FIG. 3 to FIG. 6, the emission layer EML may include a host and a dopant, and the emission layer EML may include a compound represented by Formula E-1. The compound represented by Formula E-1 may be used as a fluorescence host material.

[Formula E-1]

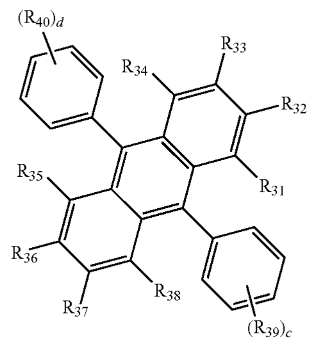

In Formula E-1, $R_{31}$ to $R_{40}$ may each independently be a hydrogen atom, a deuterium atom, a halogen atom, a substituted or unsubstituted silyl group, a substituted or unsubstituted thio group, a substituted or unsubstituted oxy group, a substituted or unsubstituted alkyl group of 1 to 10 carbon atoms, a substituted or unsubstituted alkenyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. In Formula E-1, $R_{31}$ to $R_{40}$ may be combined with an adjacent group to form a saturated hydrocarbon ring, an unsaturated hydrocarbon ring, a saturated heterocycle, or an unsaturated heterocycle.

In Formula E-1, c and d may each independently be an integer from 0 to 5.

The compound represented by Formula E-1 may be any one selected from Compound E1 to Compound E19.

-continued
E1
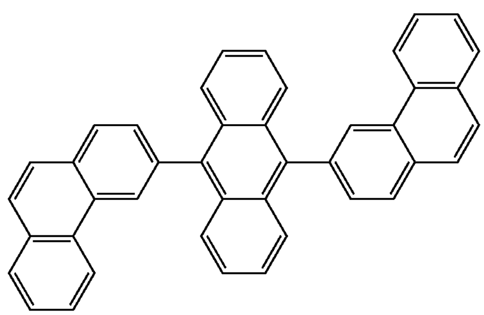
E2
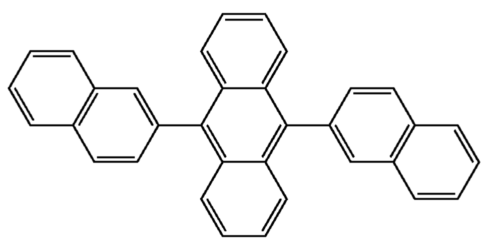
E3
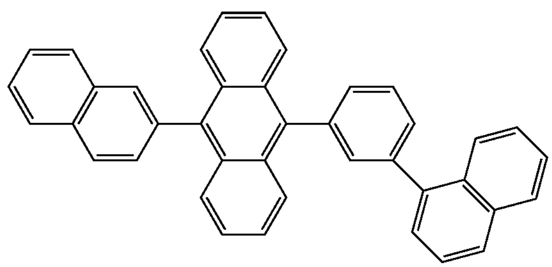
E4
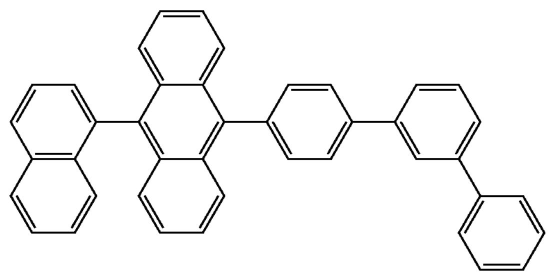
E5
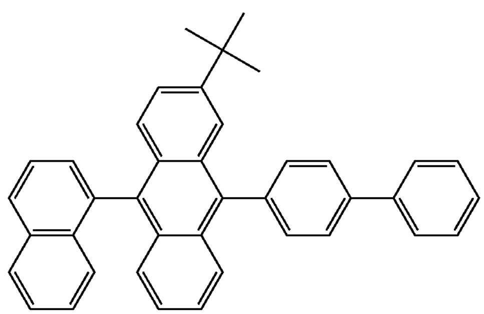
E6
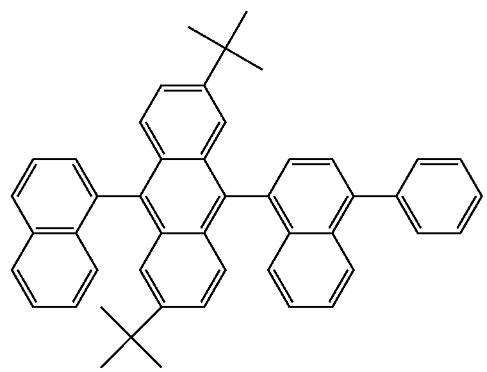
E7
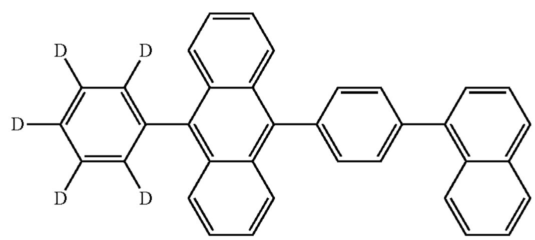
E8
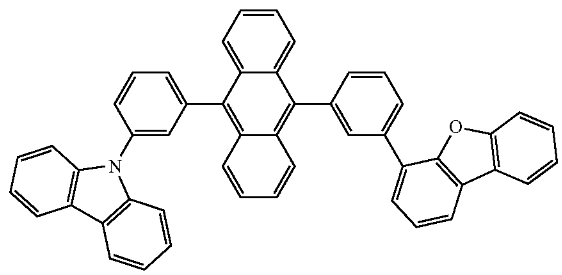
E9
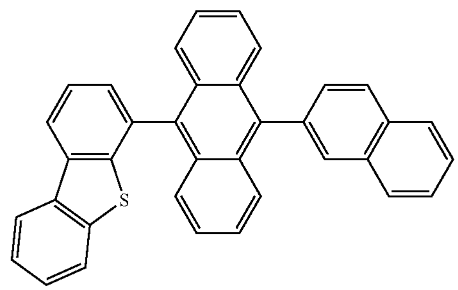
E10
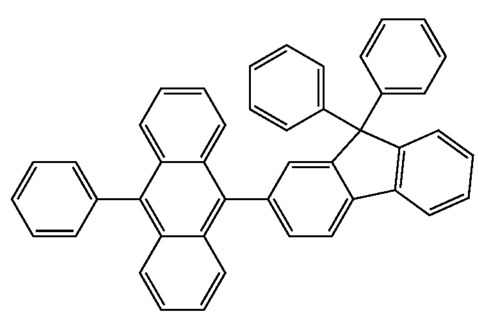

-continued
E11
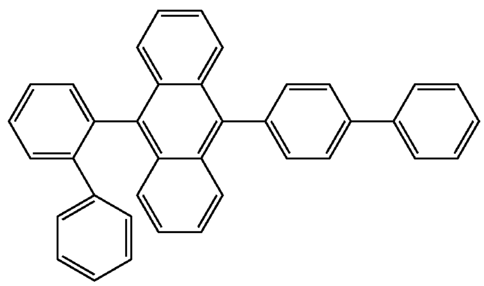
E12
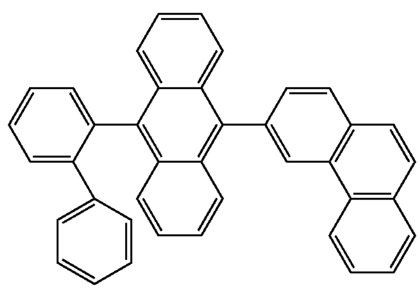
E13
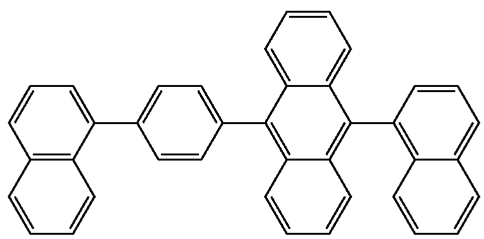
E14
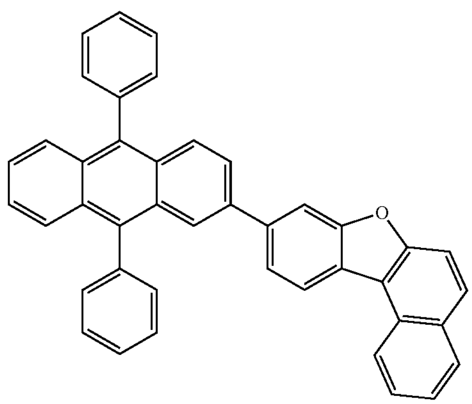
-continued
E15
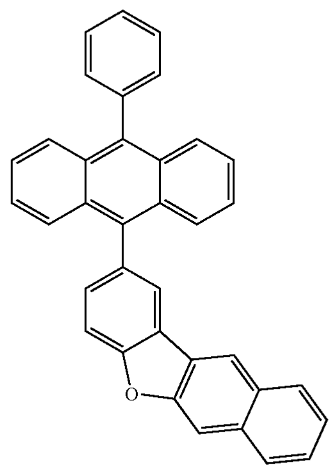
E16
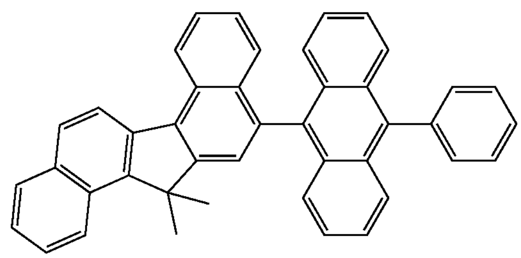
E17
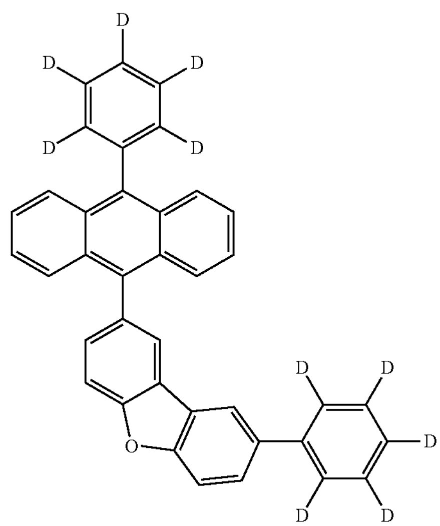
E18
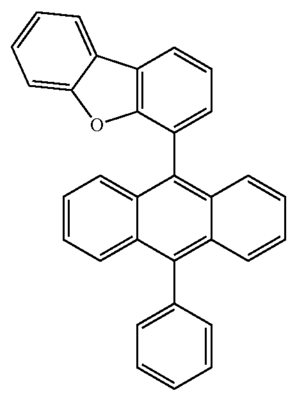

-continued

E19

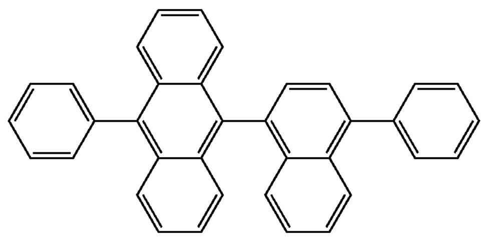

In an embodiment, the emission layer EML may include a compound represented by Formula E-2a or Formula E-2b. The compound represented by Formula E-2a or Formula E-2b may be used as a phosphorescence host material.

[Formula E-2a]

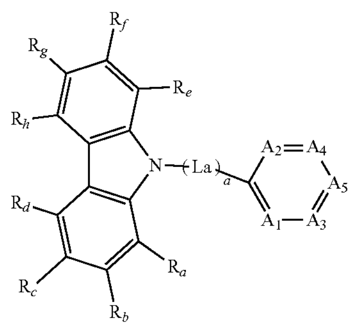

In Formula E-2b, a may be an integer from 0 to 10, and $L_a$ may be a direct linkage, a substituted or unsubstituted arylene group of 6 to 30 ring-forming carbon atoms, or a substituted or unsubstituted heteroarylene group of 2 to 30 ring-forming carbon atoms. If a is 2 or more, multiple $L_a$ groups may each independently be a substituted or unsubstituted arylene group of 6 to 30 ring-forming carbon atoms, or a substituted or unsubstituted heteroarylene group of 2 to 30 ring-forming carbon atoms.

In Formula E-2a, $A_1$ to $A_5$ may each independently be N or $C(R_i)$. $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. $R_a$ to $R_i$ may be combined with an adjacent group to form a hydrocarbon ring or a heterocycle including N, O, S, etc. as a ring-forming atom.

In Formula E-2a, two or three of $A_1$ to $A_5$ may be N, and the remainder of $A_1$ to $A_5$ may be $C(R_i)$.

[Formula E-2b]

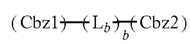

In Formula E-2b, Cbz1 and Cbz2 may each independently be an unsubstituted carbazole group, or a carbazole group substituted with an aryl group of 6 to 30 ring-forming carbon atoms. $L_b$ may be a direct linkage, a substituted or unsubstituted arylene group of 6 to 30 ring-forming carbon atoms, or a substituted or unsubstituted heteroarylene group of 2 to 30 ring-forming carbon atoms. In Formula E-2b, b may be an integer from 0 to 10, and if b is 2 or more, multiple $L_b$ groups may each independently be a substituted or unsubstituted arylene group of 6 to 30 ring-forming carbon atoms, or a substituted or unsubstituted heteroarylene group of 2 to 30 ring-forming carbon atoms.

The compound represented by Formula E-2a or Formula E-2b may be any one selected from Compound Group E-2. However, the compounds shown in Compound Group E-2 are only examples, and the compound represented by Formula E-2a or Formula E-2b is not limited to Compound Group E-2.

[Compound Group E-2]

E-2-1

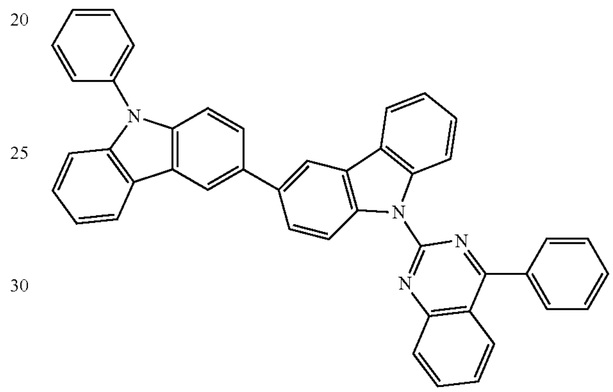

E-2-2

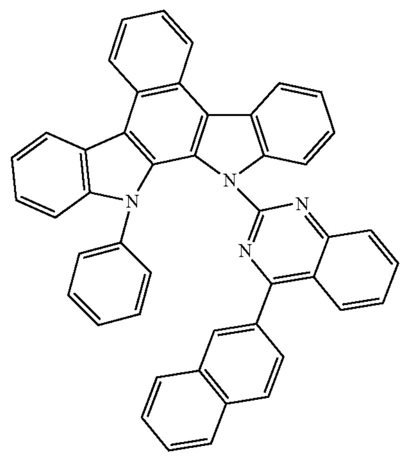

E-2-3

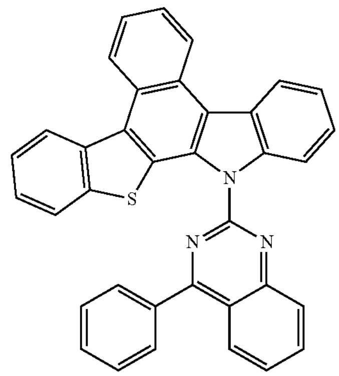

E-2-4
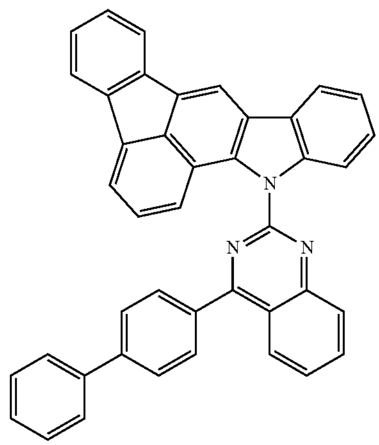
E-2-5
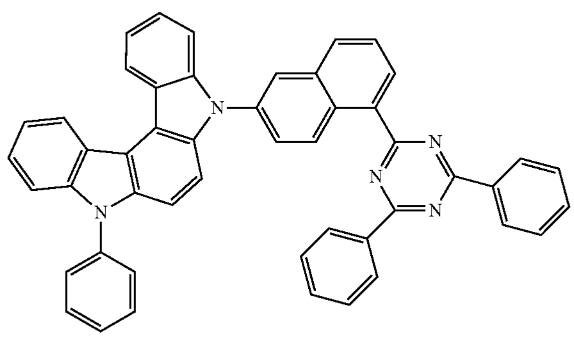
E-2-6
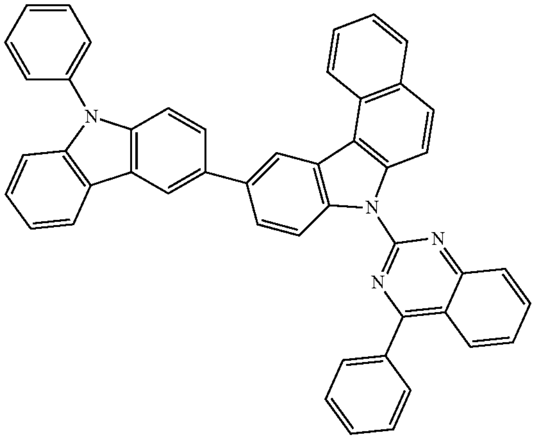
E-2-7
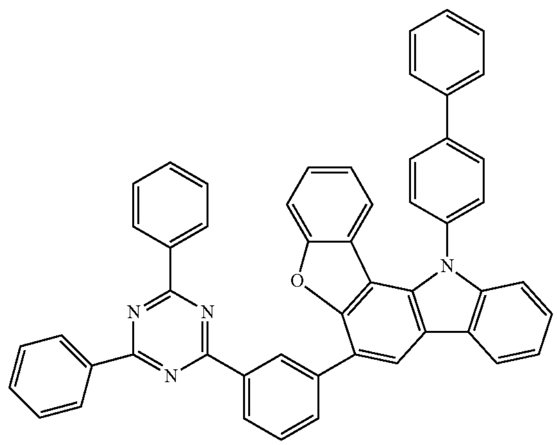
E-2-8
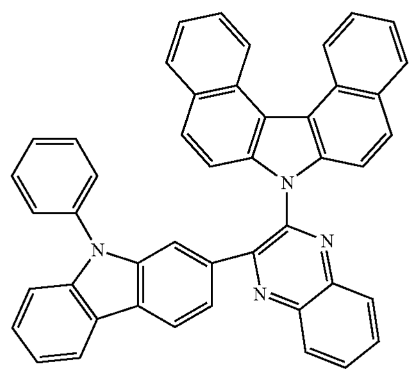
E-2-9
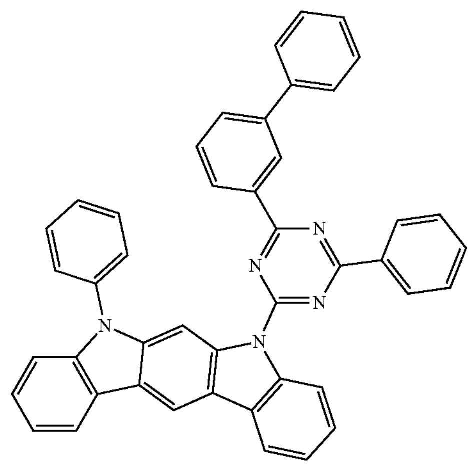

-continued
E-2-10
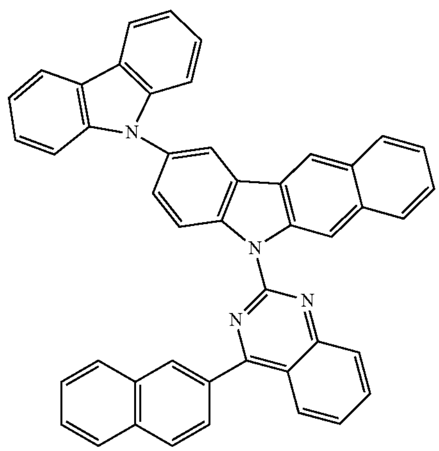
E-2-11
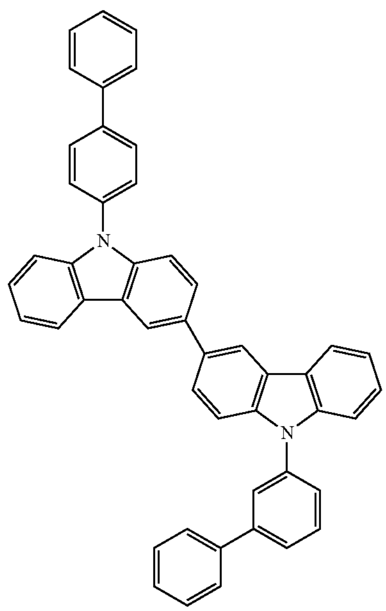
E-2-12
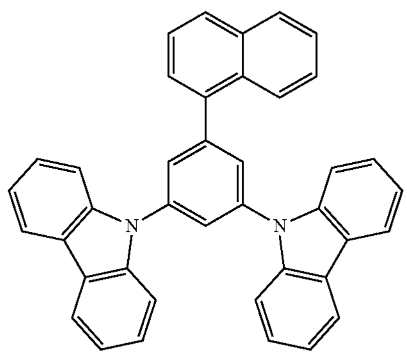
-continued
E-2-13
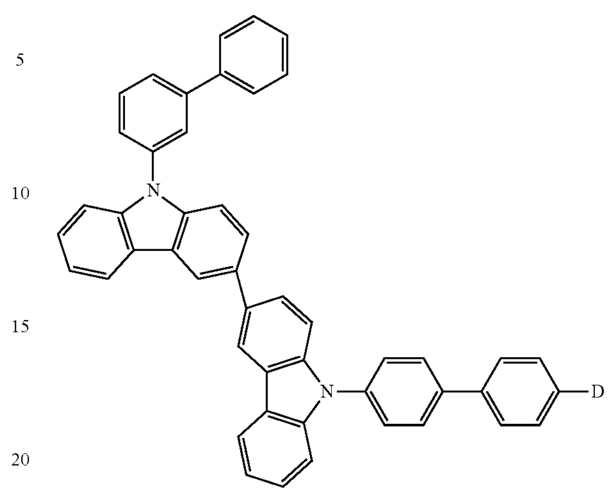
E-2-14
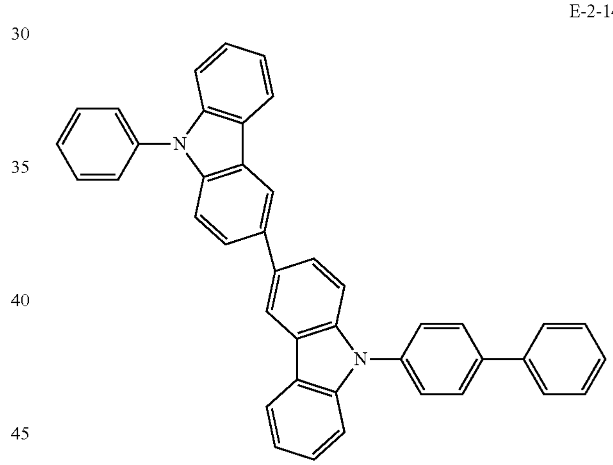
E-2-15
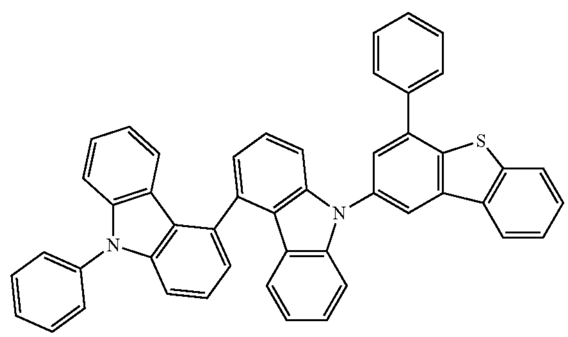

-continued
E-2-16
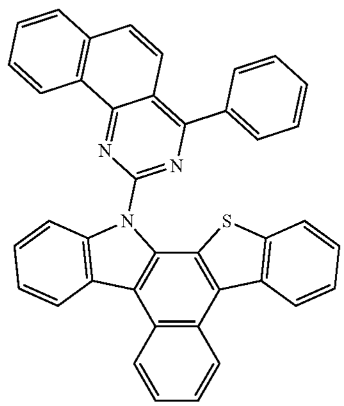
E-2-17
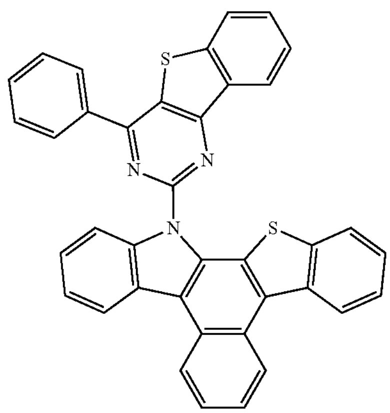
E-2-18
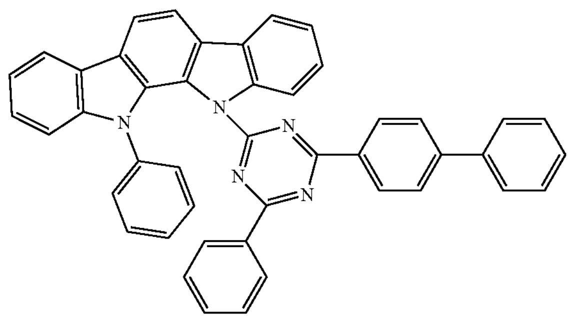
E-2-19
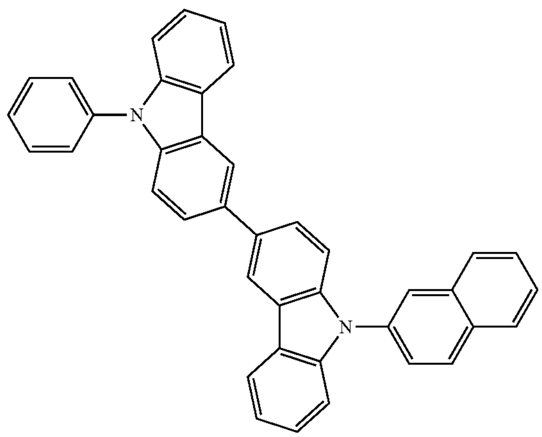
-continued
E-2-20
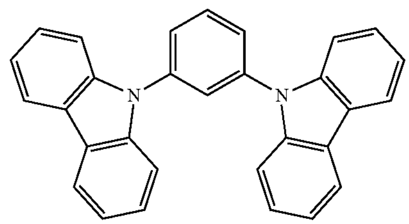
E-2-21
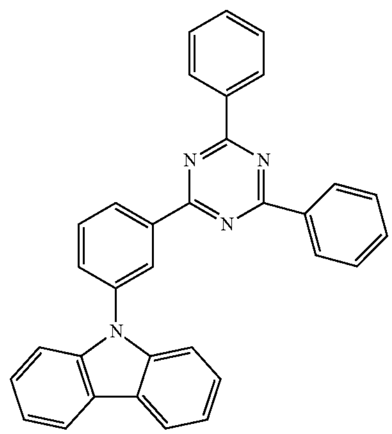
E-2-22
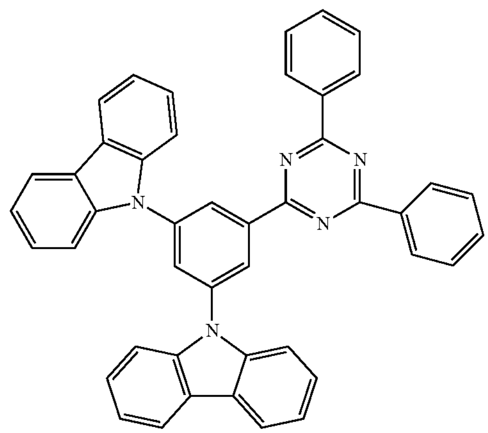
E-2-23
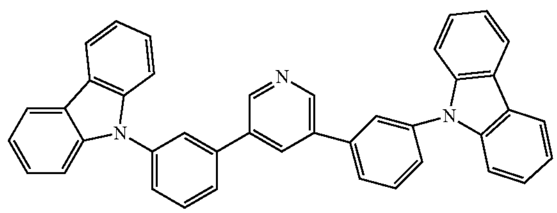

-continued

E-2-24

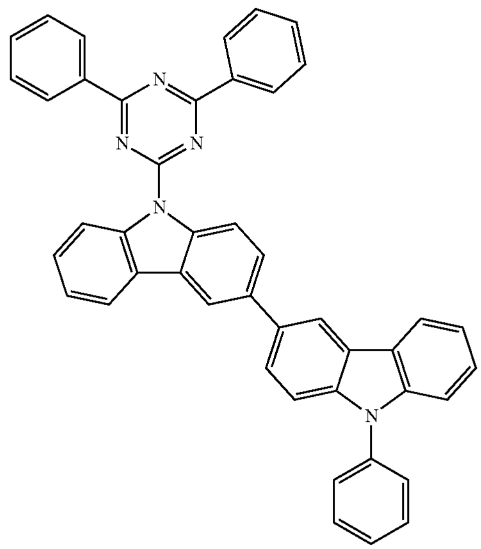

The emission layer EML may further include a common material in the art as a host material. For example, the emission layer EML may include as a host material, at least one of bis (4-(9H-carbazol-9-yl) phenyl) diphenylsilane (BCPDS), (4-(1-(4-(diphenylamino) phenyl) cyclohexyl) phenyl) diphenyl-phosphine oxide (POPCPA), bis[2-(diphenylphosphino)phenyl]ether oxide (DPEPO), 4,4'-bis(N-carbazolyl)-1,1'-biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), or 1,3,5-tris(1-phenyl-1H-benzo[d]imidazole-2-yl)benzene (TPBi). However, embodiments are not limited thereto. For example, tris(8 -hydroxyquinolino)aluminum ($Alq_3$), 9,10-di(naphthalene-2-yl)anthracene (ADN), 2-tert-butyl-9,10-di (naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), etc. may be used as the host material.

The emission layer EML may include a compound represented by Formula M-a or Formula M-b. The compound represented by Formula M-a or Formula M-b may be used as a phosphorescence dopant material.

[Formula M-a]

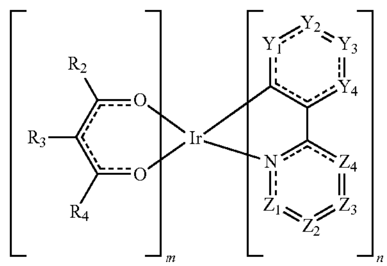

In Formula M-a, $Y_1$ to $Y_4$ and $Z_1$ to $Z_4$ may each independently be $C(R_1)$ or N, and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. In Formula M-a, m may be 0 or 1, and n may be 2 or 3. In Formula M-a, if m is 0, n may be 3, and if m is 1, n may be 2.

The compound represented by Formula M-a may be used as a phosphorescence dopant.

The compound represented by Formula M-a may be any one selected from Compounds M-a1 to M-a25. However, Compounds M-a1 to M-a25 are examples, and the compound represented by Formula M-a is not limited to Compounds M-a1 to M-a25.

M-a1

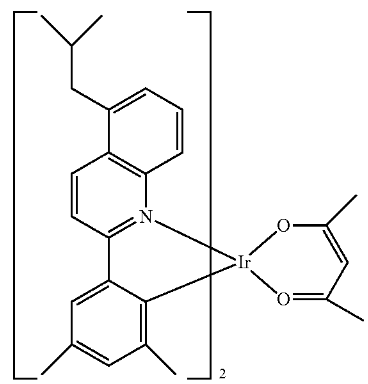

M-a2

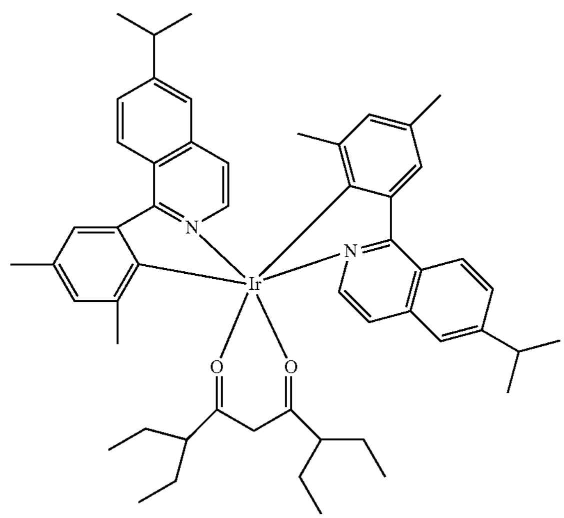

-continued
M-a3
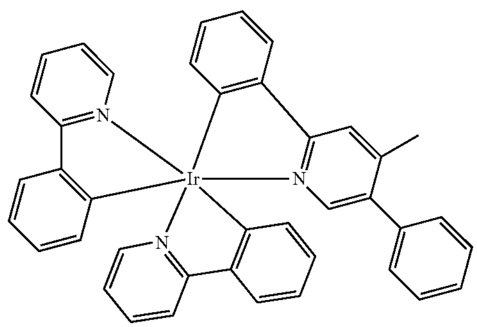
M-a4
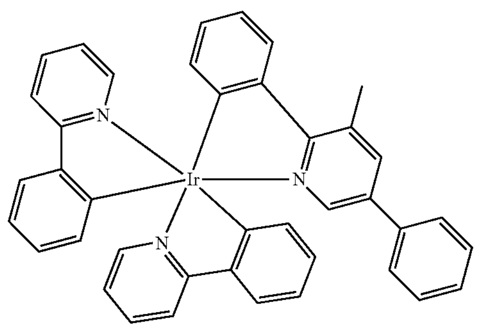
M-a5
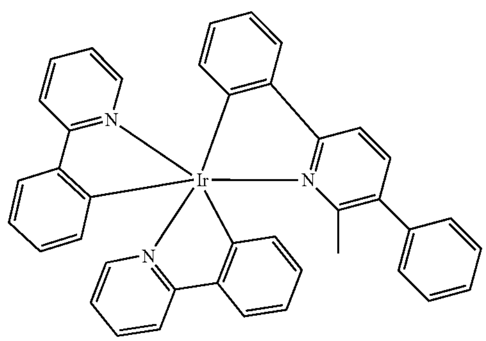
M-a6
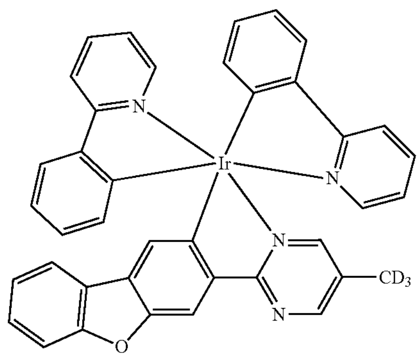
-continued
M-a7
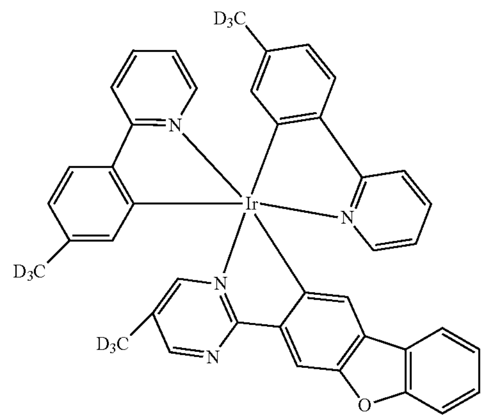
M-a8
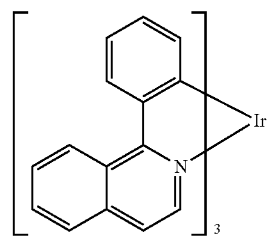
M-a9
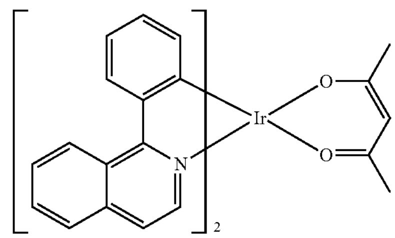
M-a10
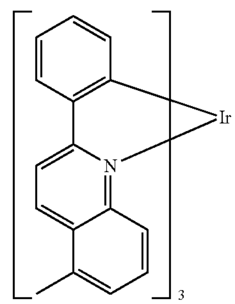
M-a11
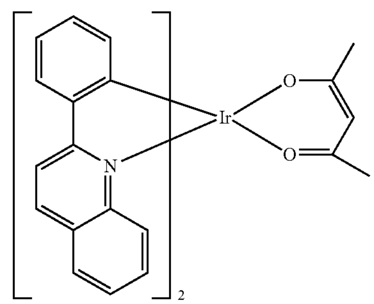

-continued
M-a12
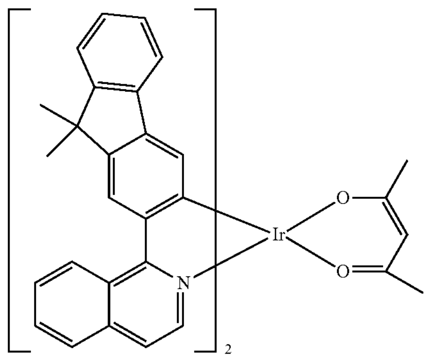
M-a13
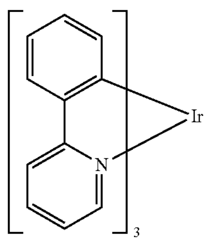
M-a14
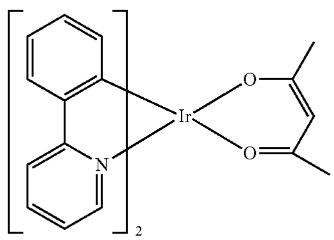
M-a15
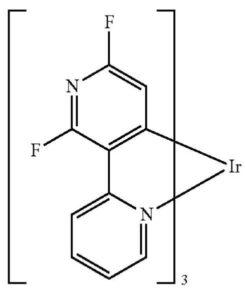
M-a16
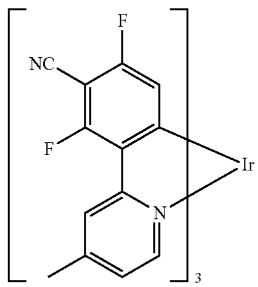
-continued
M-a17
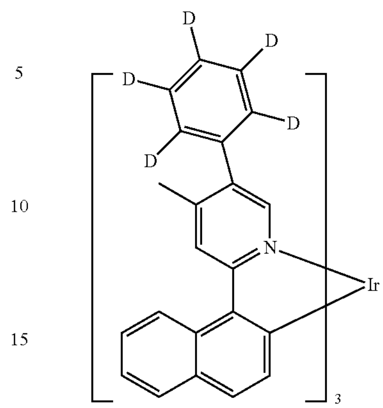
M-a18
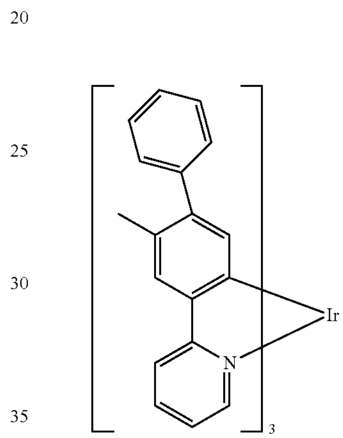
M-a19
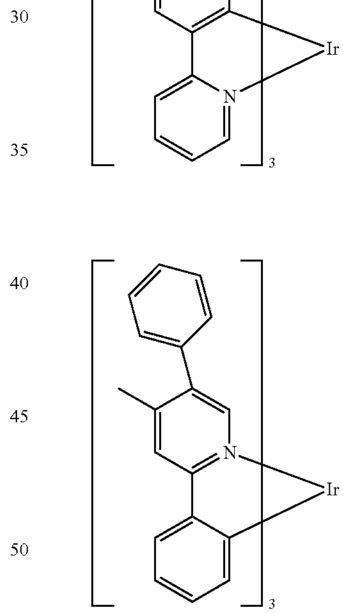
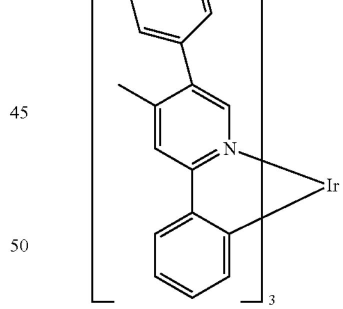
M-a20
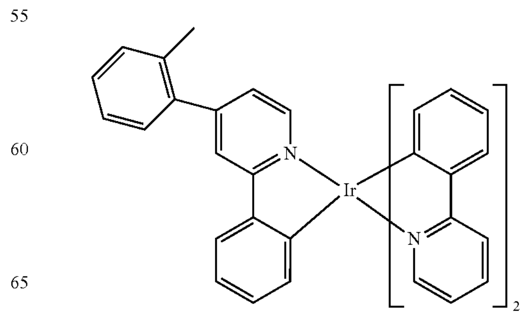

-continued

M-a21

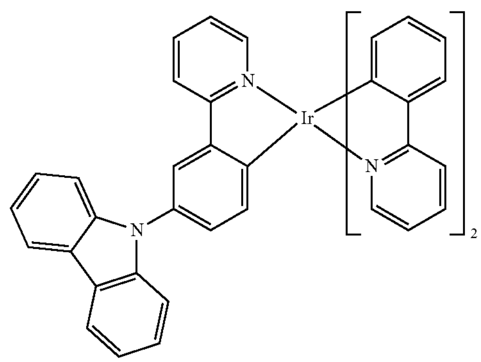

M-a22

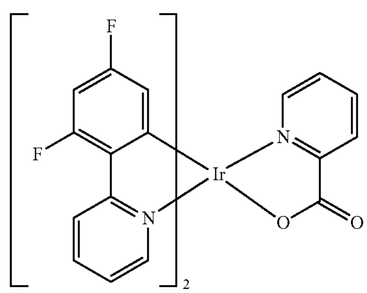

M-a23

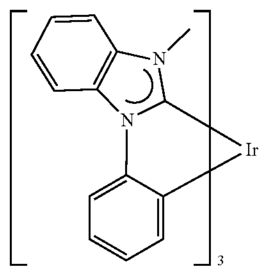

M-a24

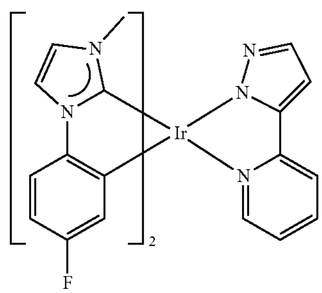

M-a25

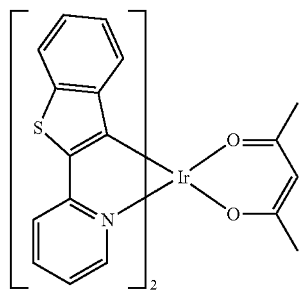

-continued

[Formula M-b]

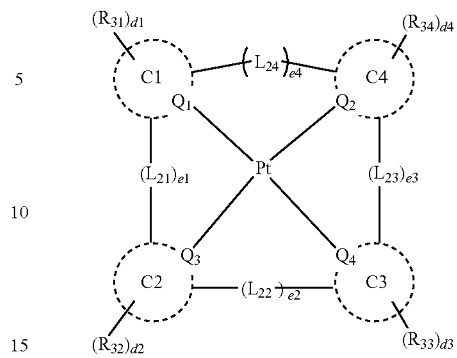

In Formula M-b, $Q_1$ to $Q_4$ may each independently be C or N, and C1 to C4 may each independently be a substituted or unsubstituted hydrocarbon ring of 5 to 30 ring-forming carbon atoms, or a substituted or unsubstituted heterocycle of 2 to 30 ring-forming carbon atoms. In Formula M-b, $L_{21}$ to $L_{24}$ may each independently be a direct linkage,

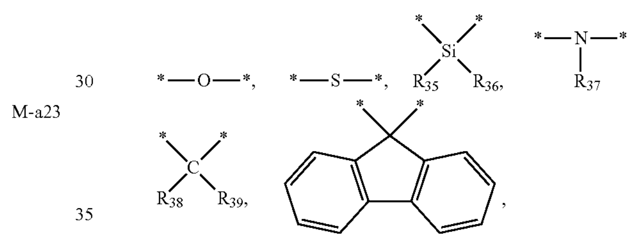

a substituted or unsubstituted divalent alkyl group of 1 to 20 carbon atoms, a substituted or unsubstituted arylene group of 6 to 30 ring-forming carbon atoms, or a substituted or unsubstituted heteroarylene group of 2 to 30 ring-forming carbon atoms, and e1 to e4 may each independently be 0 or 1. In Formula M-b, $R_{31}$ to $R_{39}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring, and d1 to d4 may each independently be an integer from 0 to 4.

The compound represented by Formula M-b may be used as a blue phosphorescence dopant or a green phosphorescence dopant.

The compound represented by Formula M-b may be any one selected from Compound M-b-1 to Compound M-b-12. However, Compound M-b-1 to Compound M-b-12 are examples, and the compound represented by Formula M-b is not limited to Compound M-b-1 to Compound M-b-12.

-continued
M-b-1
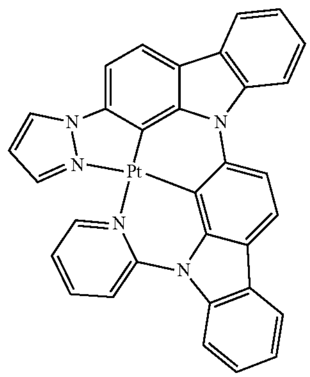
M-b-2
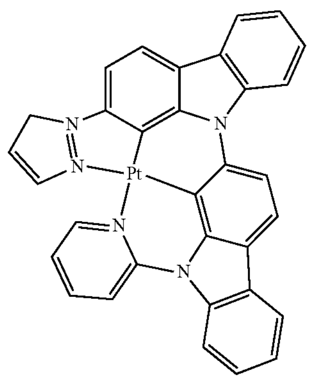
M-b-3
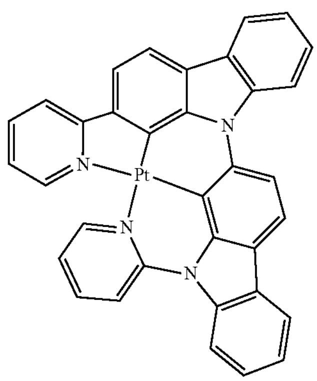
M-b-4
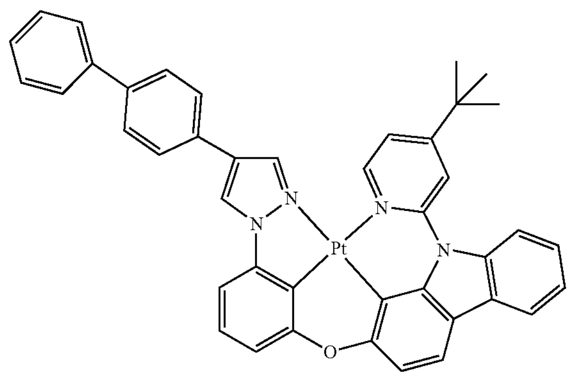
M-b-5
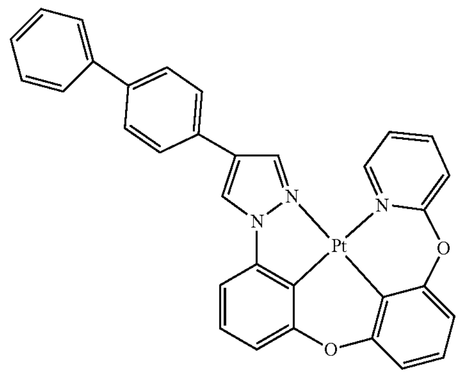
M-b-6
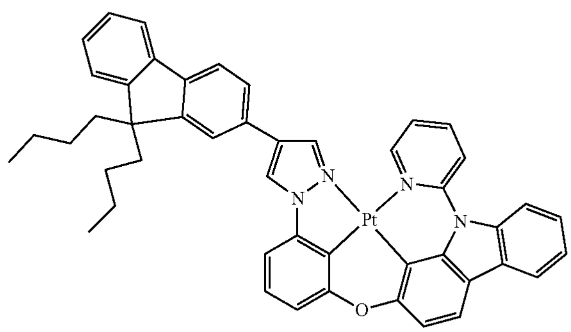
M-b-7
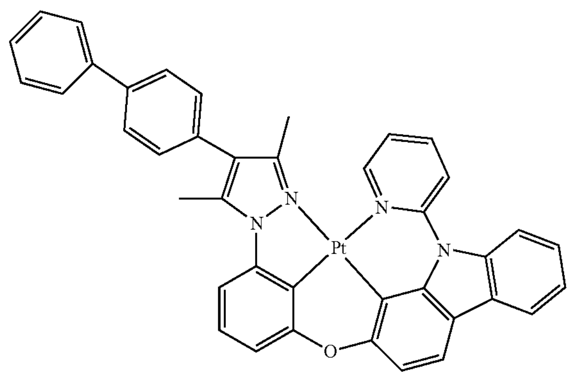
M-b-8
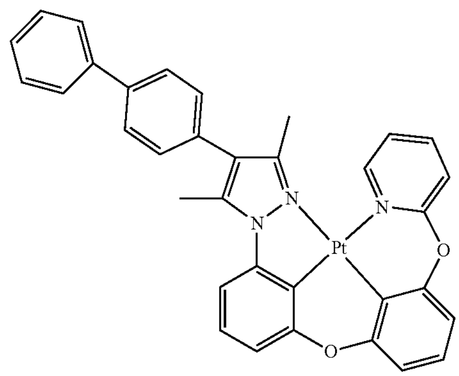

-continued

M-b-9

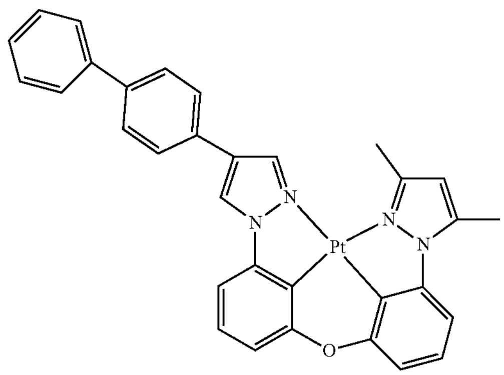

M-b-10

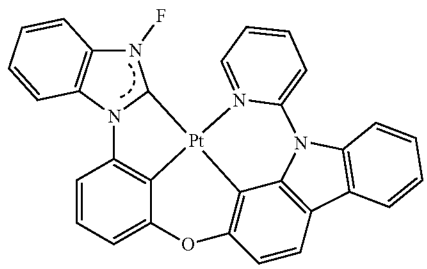

M-b-11

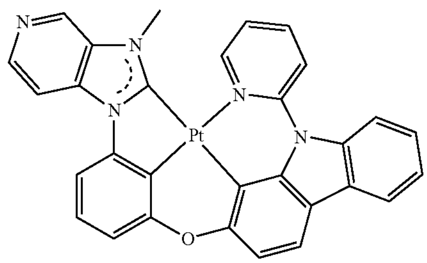

M-b-12

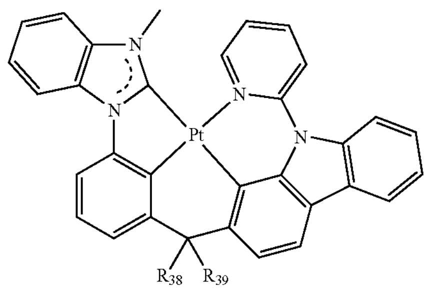

In Compound M-b-1 to Compound M-b-12, R, $R_{38}$, and $R_{39}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

The emission layer EML may include any one of Formula F-a to Formula F-c. The compounds represented by Formula F-a to Formula F-c may be used as fluorescence dopant materials.

[Formula F-a]

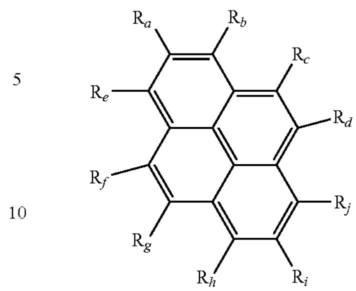

In Formula F-a, two selected from $R_a$ to $R_j$ may each independently be substituted with a group represented by $*$—$NAr_1Ar_2$. The remainder $R_a$ to $R_j$ which are not substituted with $*$—$NAr_1Ar_2$ m each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In the group represented by $*$—$NAr_1Ar_2$, $Ar_1$ and $Ar_2$ may each independently be a substituted or unsubstituted aryl group of 6 to 30 ring-forming carbon atoms, or a substituted or unsubstituted heteroaryl group of 2 to 30 ring-forming carbon atoms. For example, at least one of $Ar_1$ and $Ar_2$ may be a heteroaryl group including O or S as a ring-forming atom.

[Formula F-b]

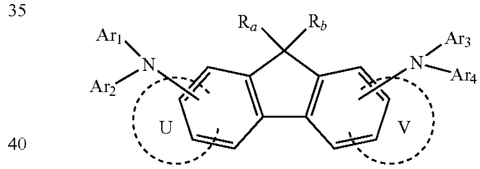

In Formula F-b, $R_a$ and $R_b$, may each independently be a hydrogen atom, a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. In Formula F-b, $Ar_1$ to $Ar_4$ may each independently be a substituted or unsubstituted aryl group of 6 to 30 ring-forming carbon atoms, or a substituted or unsubstituted heteroaryl group of 2 to 30 ring-forming carbon atoms.

In Formula F-b, U and V may each independently be a substituted or unsubstituted hydrocarbon ring of 5 to 30 ring-forming carbon atoms, or a substituted or unsubstituted heterocycle of 2 to 30 ring-forming carbon atoms.

In Formula F-b, the number of rings represented by U and V may each independently be 0 or 1. For example, in Formula F-b, if the number of U or V is 1, a fused ring may be present at the part designated by U or V, and if the number of U or V is 0, a ring may not be present at the part designated part U or V. When the number of U is 0 and the number of V is 1, or when the number of U is 1 and the number of V is 0, a fused ring having the fluorene core of Formula F-b may be a ring compound with four rings. When the number of both U and V is 0, the fused ring of Formula F-b may be a ring compound with three rings. When the number of both U and V is 1, a fused ring having the fluorene core of Formula F-b may be a ring compound with five rings.

[Formula F-c]

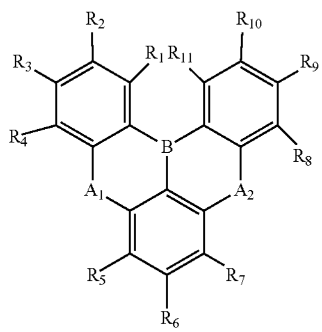

In Formula F-c, $A_1$ and $A_2$ may each independently be O, S, Se, or $N(R_m)$, and $R_m$ may be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms. In Formula F-c, $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In Formula F-c, $A_1$ and $A_2$ may each independently be combined with the substituents of an adjacent ring to form a fused ring. For example, if $A_1$ and $A_2$ are each independently $N(R_m)$, $A_1$ may be combined with $R_4$ or $R_5$ to form a ring. For example, $A_2$ may be combined with $R_7$ or $R_8$ to form a ring.

In an embodiment, the emission layer EML may include as a dopant material, styryl derivatives (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl)naphthalen-2-yl)vinyl)phenyl)-N-phenylbenzenamine (N-BDAVBi), and 4,4'-bis[2-(4-(N,N-diphenylamino)phenyl)vinyl]biphenyl (DPAVBi)), perylene and the derivatives thereof (for example, 2,5,8,11-tetra-t-butylperylene (TBP)), pyrene and the derivatives thereof (for example, 1,1-dipyrene, 1,4-dipyrenylbenzene, and 1,4-bis(N,N-diphenylamino)pyrene), etc.

The emission layer EML may include a phosphorescence dopant material. For example, the phosphorescence dopant may use a metal complex including iridium (Ir), platinum (Pt), osmium (Os), gold (Au), titanium (Ti), zirconium (Zr), hafnium (Hf), europium (Eu), terbium (Tb) or thulium (Tm). Particularly, iridium(III) bis(4,6-difluorophenylpyridinato-N,C2')picolinate (FIrpic), bis(2,4-difluorophenylpyridinato)-tetrakis(1-pyrazolyl)borate iridium(III) (Fir6), or platinum octaethyl porphyrin (PtOEP) may be used as the phosphorescence dopant. However, embodiments are not limited thereto.

The emission layer EML may include a quantum dot material. The quantum dot may be a Group II-VI compound, a Group III-VI compound, a Group 1-III-VI compound, a Group III-V compound, a Group III-II-V compound, a Group IV-VI compound, a Group IV element, a Group IV compound, and combinations thereof.

The Group II-VI compound may be a binary compound selected from the group consisting of CdSe, CdTe, CdS, ZnS, ZnSe, ZnTe, ZnO, HgS, HgSe, HgTe, MgSe, MgS, and mixtures thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof, a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof, or any combination thereof.

The Group III-V compound may be a binary compound such as $In_2S_3$, and $In_2Se_3$; a ternary compound such as $InGaS_3$, and $InGaSe_3$; or any combinations thereof.

The Group 1-III-VI compound may be a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$ and mixtures thereof, a quaternary compound such as $AgInGaS_2$, and $CuInGaS_2$; or any combination thereof.

The Group III-V compound may be a binary compound selected from the group consisting of GaN, GaP, GaAs, GaSb, AlN, AlP, AlAs, AlSb, InN, InP, InAs, InSb, and mixtures thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and mixtures thereof, a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof, or any combination thereof. The Group III-V compound may further include a Group II metal. For example, InZnP, etc. may be selected as a Group III-II-V compound.

The Group IV-VI compound may be a binary compound selected from the group consisting of SnS, SnSe, SnTe, PbS, PbSe, PbTe, and mixtures thereof, a ternary compound selected from the group consisting of SnSeS, SnSeTe, SnSTe, PbSeS, PbSeTe, PbSTe, SnPbS, SnPbSe, SnPbTe, and mixtures thereof, a quaternary compound selected from the group consisting of SnPbSSe, SnPbSeTe, SnPbSTe, and mixtures thereof, or any combination thereof. The Group IV element may be selected from the group consisting of Si, Ge, and a mixture thereof. The Group IV compound may be a binary compound selected from the group consisting of SiC, SiGe, and a mixture thereof.

A binary compound, a ternary compound, or a quaternary compound may be present in a particle at a uniform concentration or may be present in a particle at a partially different concentration distribution state. In an embodiment, the quantum dot may have a core/shell structure in which one quantum dot surrounds another quantum dot. The interface of the core and the shell may have a concentration gradient in which the concentration of an element that is present in the shell decreases toward the center.

In embodiments, the quantum dot may have a core-shell structure including a core including a nanocrystal and a shell surrounding the core. The shell of the quantum dot may be a protection layer that prevents chemical deformation of the core to maintain semiconductor properties and/or may be a charging layer that imparts electrophoretic properties to the quantum dot. The shell may be a single layer or a multilayer. Examples of the shell of the quantum dot may include a metal oxide, a non-metal oxide, a semiconductor compound, or combinations thereof.

For example, the metal oxide or non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $CO_3O_4$ and NiO; or a ternary compound such as $MgAl_2O_4$, $CoFe_2O_4$, $NiFe_2O_4$ and $CoMn_2O_4$, but embodiments are not limited thereto.

The semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments are not limited thereto.

The quantum dot may have a full width of half maximum (FWHM) of an emission wavelength spectrum equal to or less than about 45 nm. For example, the quantum dot may have a FWHM of an emission wavelength spectrum equal to or less than about 40 nm. For example, the quantum dot may have a FWHM of an emission wavelength spectrum equal to or less than about 30 nm. Within these ranges, color purity or color reproducibility may be improved. Light emitted through the quantum dot may be emitted in all directions, and light viewing angle properties may be improved.

The shape of the quantum dot may be a shape that is used in the art, without limitation. For example, a quantum dot may have a spherical shape, a pyramidal shape, a multi-arm shape, or a cubic shape, or the quantum dot may be in the form of a nanoparticle, a nanotube, a nanowire, a nanofiber, a nanoplate, etc.

The quantum dot may control the color of light emitted according to a particle size thereof, and accordingly, the quantum dot may have various emission colors such as blue, red, and green.

In the light emitting device ED of an embodiment, as shown in FIG. 3 to FIG. 6, the electron transport region ETR is provided on the emission layer EML. The electron transport region ETR may include at least one of a hole blocking layer HBL, an electron transport layer ETL, or an electron injection layer EIL. However, embodiments are not limited thereto.

The electron transport region ETR may be a layer formed of a single material, a layer formed of different materials, or a multilayer structure having layers formed of different materials.

For example, the electron transport region ETR may have a single layer structure of an electron injection layer EIL or an electron transport layer ETL, or a single layer structure formed of an electron injection material and an electron transport material. The electron transport region ETR may have a single layer structure formed of different materials, or may have a structure in which an electron transport layer ETL/electron injection layer EIL, or a hole blocking layer HBL/electron transport layer ETL/electron injection layer EIL are stacked in its respective stated order from the emission layer EML, but embodiments are not limited thereto. A thickness of the electron transport region ETR may be, for example, in a range of about 1,000 Å to about 1,500 Å.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

The electron transport region ETR may include a compound represented by Formula ET-1.

[Formula ET-1]

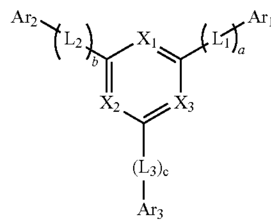

In Formula ET-1, at least one of $X_1$ to $X_3$ may be N, and the remainder of $X_1$ to $X_3$ may be $C(R_a)$. $R_a$ may be a hydrogen atom, a deuterium atom, a substituted or unsubstituted alkyl of 1 to 20 carbon atoms, a substituted or unsubstituted aryl group of 6 to 30 ring-forming carbon atoms, or a substituted or unsubstituted heteroaryl group of 2 to 30 ring-forming carbon atoms. In Formula ET-1, $Ar_1$ to $Ar_3$ may each independently be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula ET-1, a to c may each independently be an integer from 0 to 10. In Formula ET-1, $L_1$ to $L_3$ may each independently be a direct linkage, a substituted or unsubstituted arylene group of 6 to 30 ring-forming carbon atoms, or a substituted or unsubstituted heteroarylene group of 2 to 30 ring-forming carbon atoms. If a to c are 2 or more, $L_1$ to $L_3$ may each independently be a substituted or unsubstituted arylene group of 6 to 30 ring-forming carbon atoms, or a substituted or unsubstituted heteroarylene group of 2 to 30 ring-forming carbon atoms.

The electron transport region ETR may include an anthracene-based compound. However, embodiments are not limited thereto, and the electron transport region ETR may include, for example, diphenyl[4-(triphenylsilyl)phenyl] phosphine oxide (TSPO1), tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate ($Bebq_2$), 9,10-di(naphthalene-2-yl)anthracene (ADN), 1,3-bis[3,5-di(pyridin-3-yl)phenyl]benzene (BmPyPhB), and mixtures thereof, without limitation.

The electron transport region ETR may include at least one of Compounds ET1 to ET36.
ET1
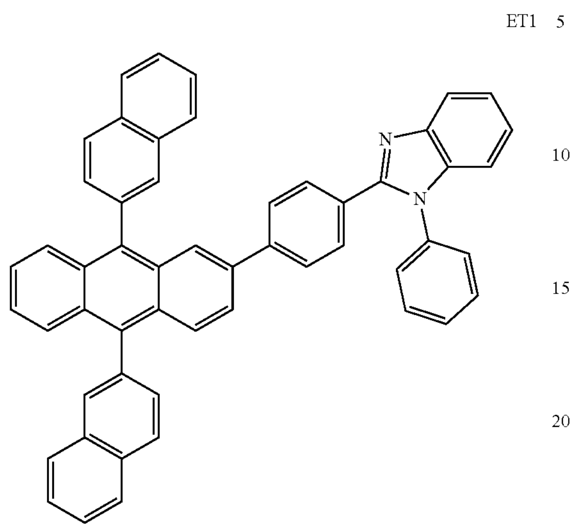
ET2
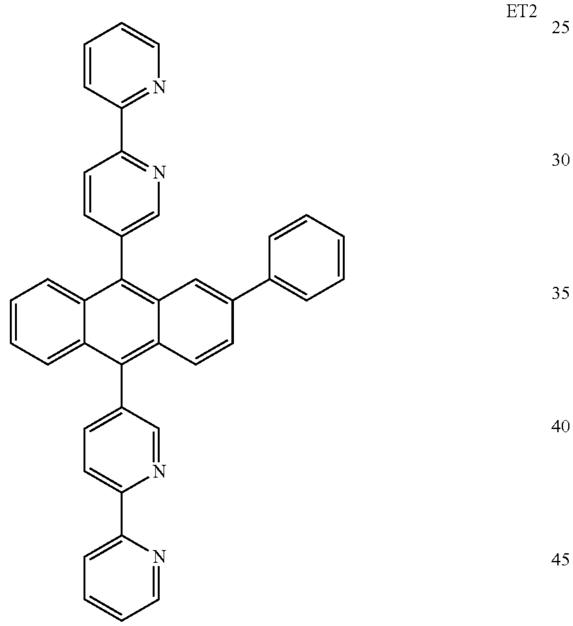
ET3
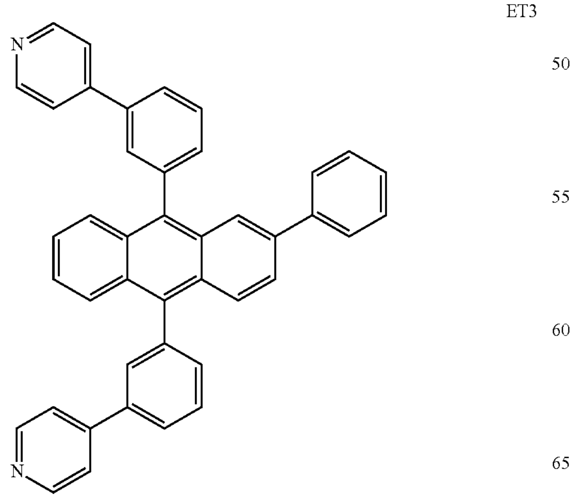
-continued
ET4
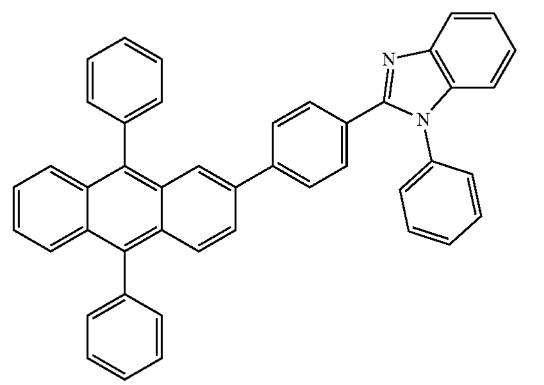
ET5
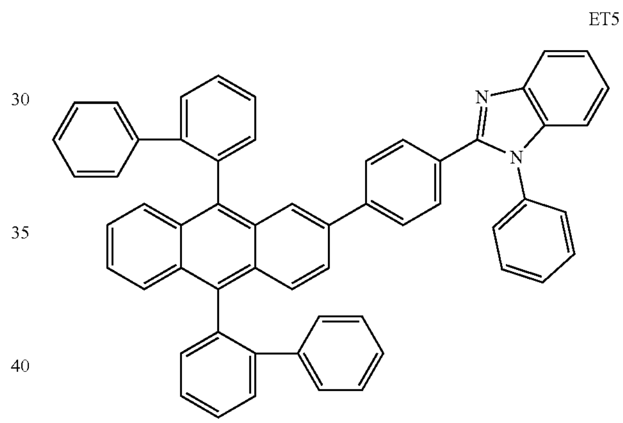
ET6
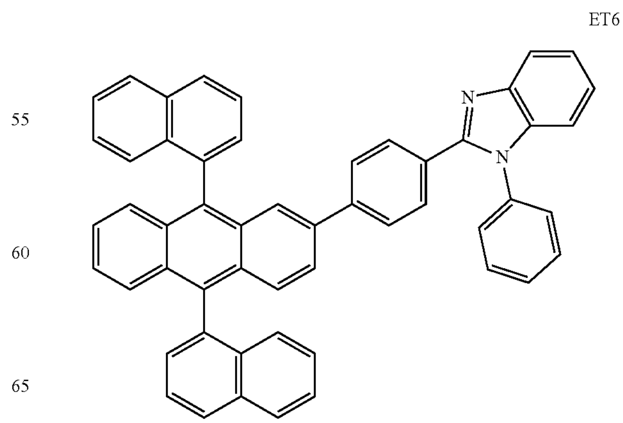

-continued
ET7
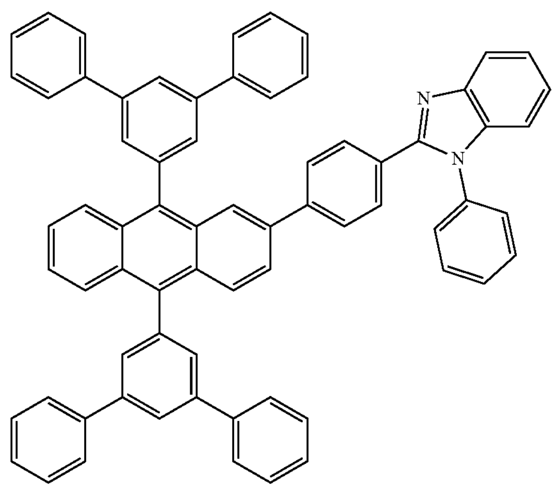
ET8
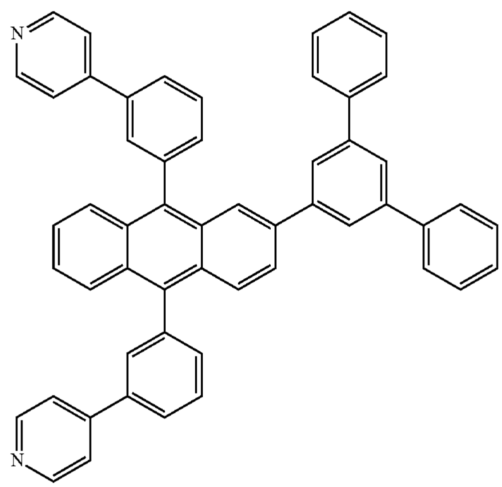
ET9
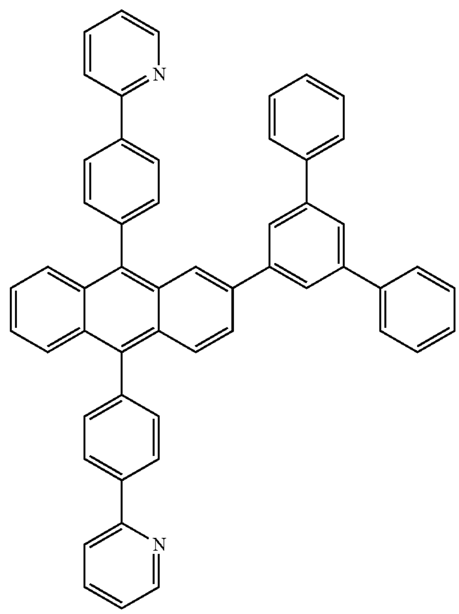
-continued
ET10
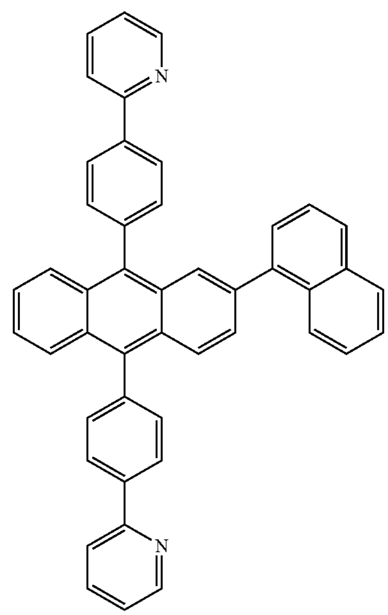
ET11
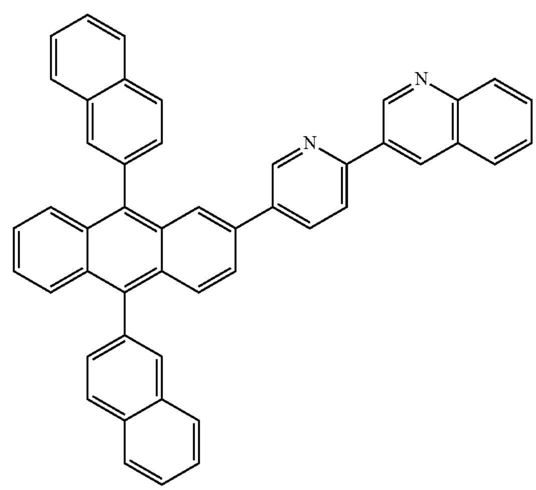
ET12
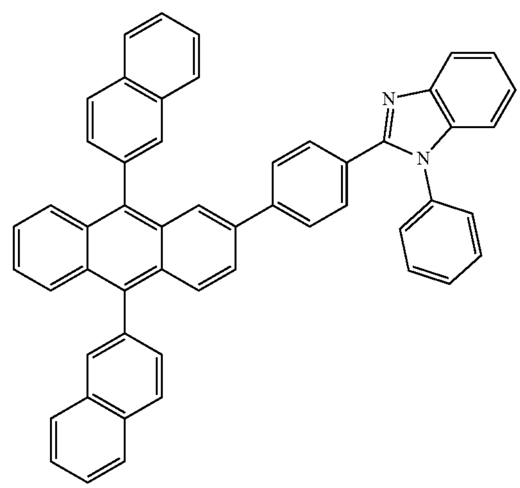

-continued
ET13
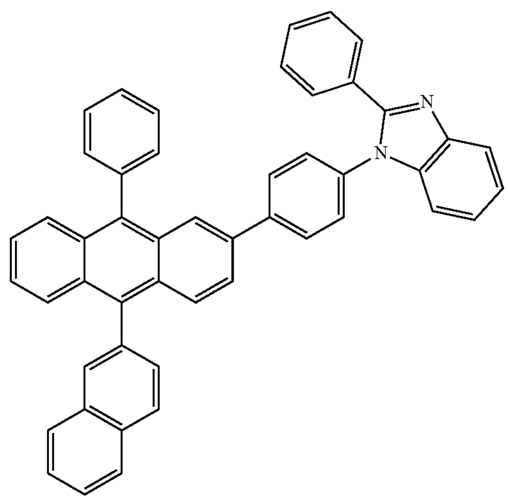
ET14
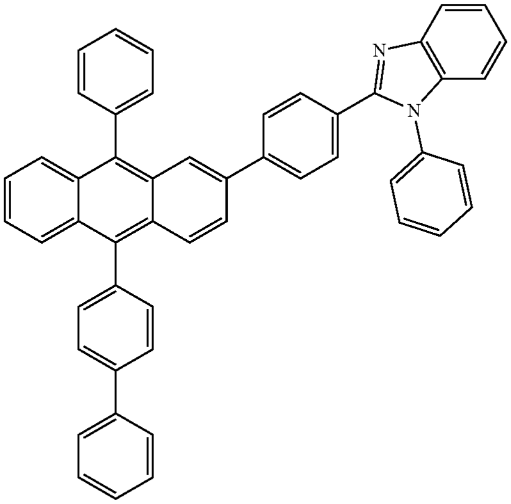
ET15
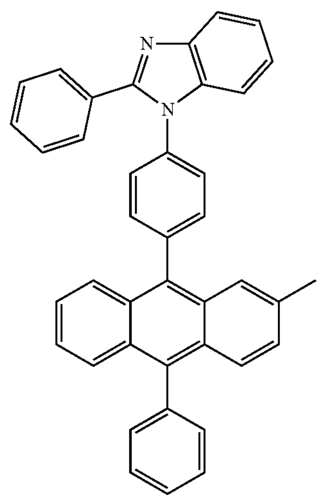
-continued
ET16
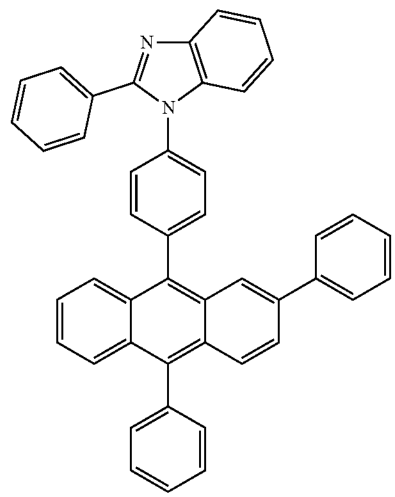
ET17
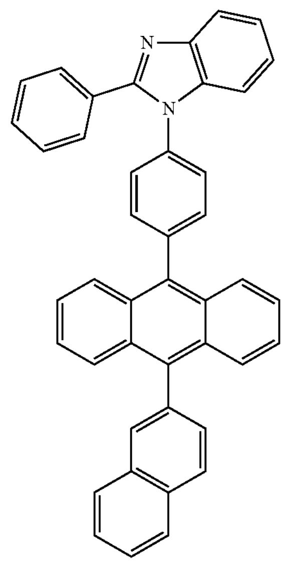
ET18
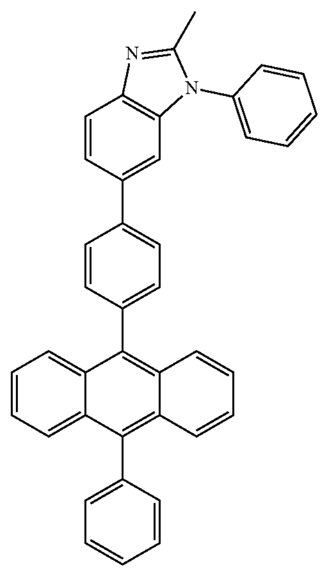

-continued
ET19
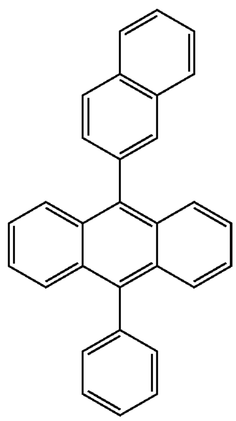
ET20
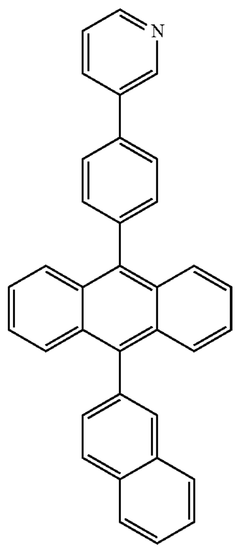
ET21
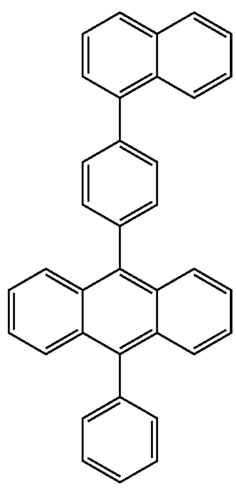
-continued
ET22
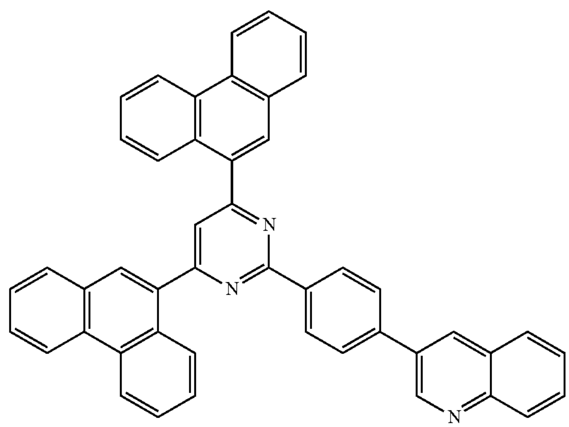
ET23
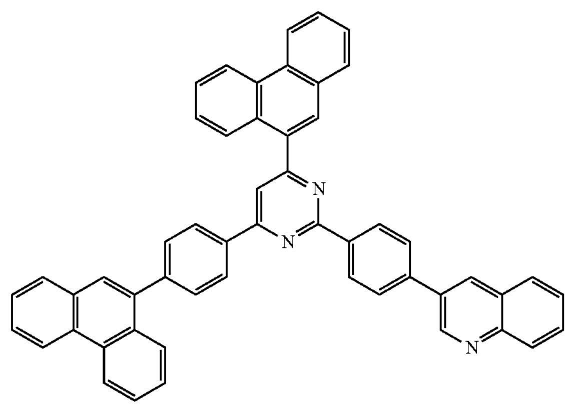
ET24
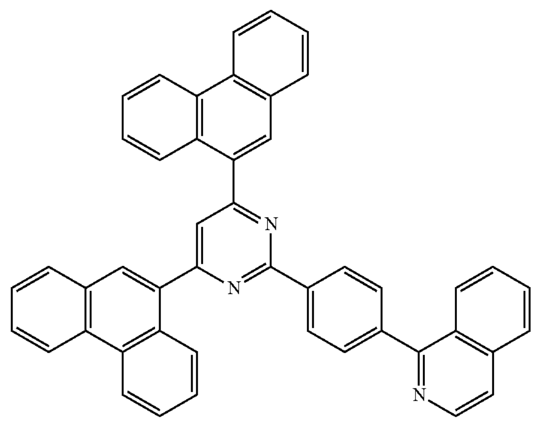

-continued
ET25
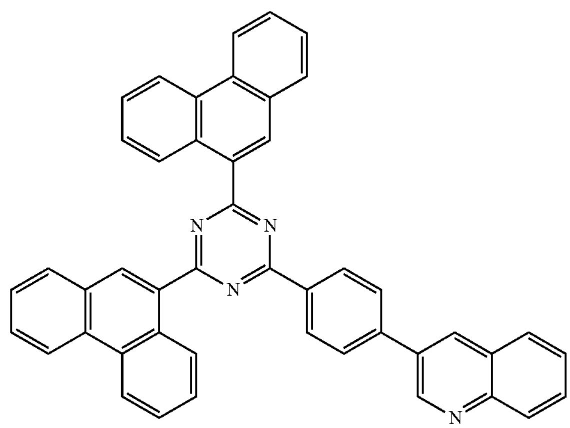
ET26
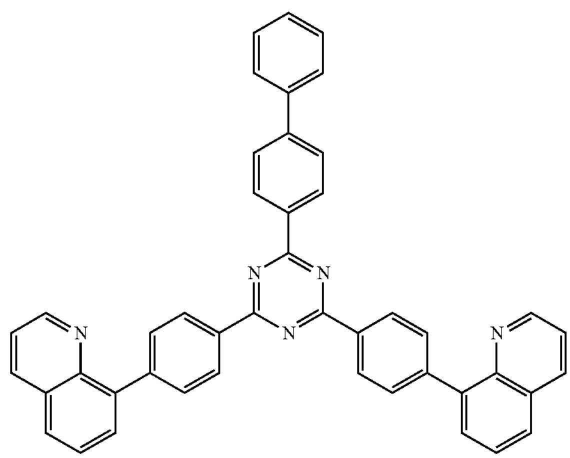
ET27
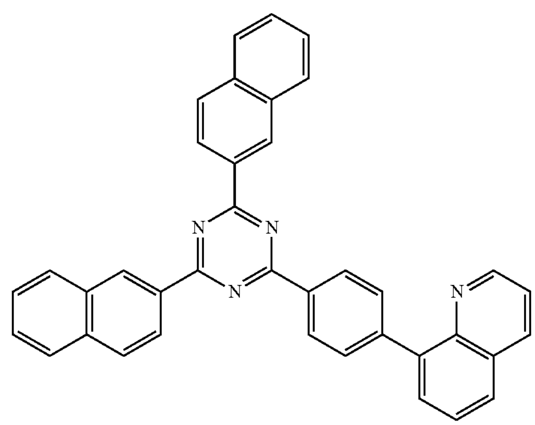
-continued
ET28
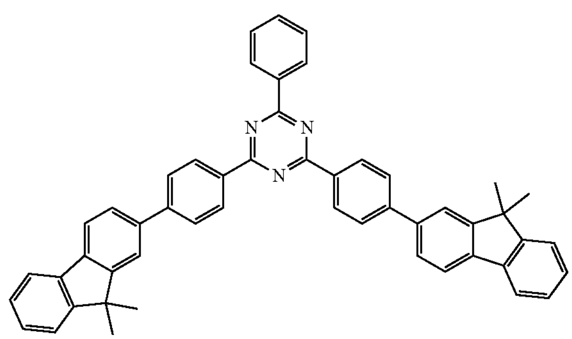
ET29
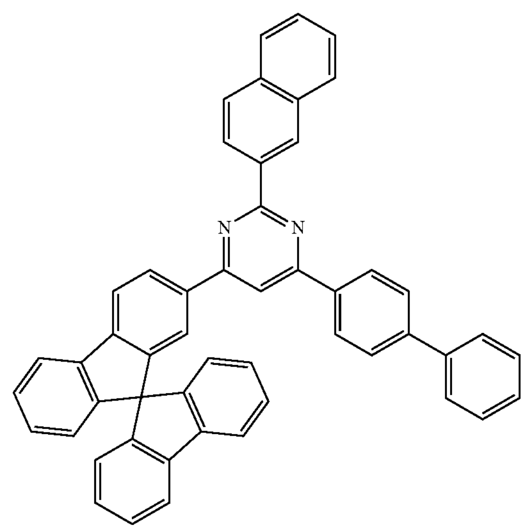
ET30
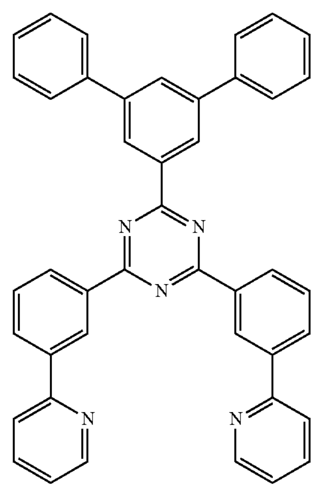

-continued

ET31

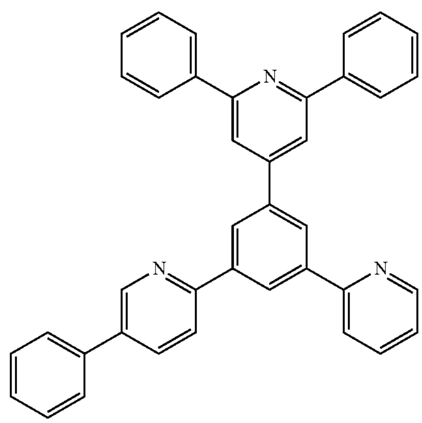

ET32

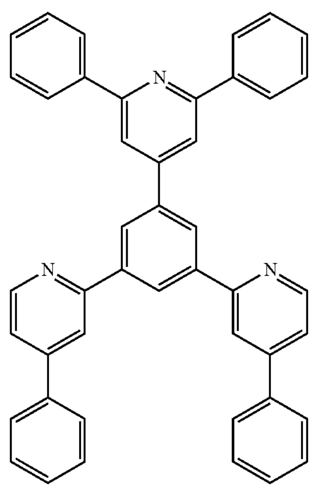

ET33

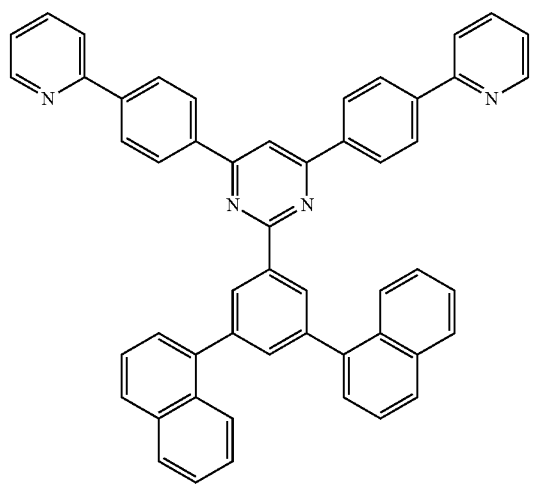

-continued

ET34

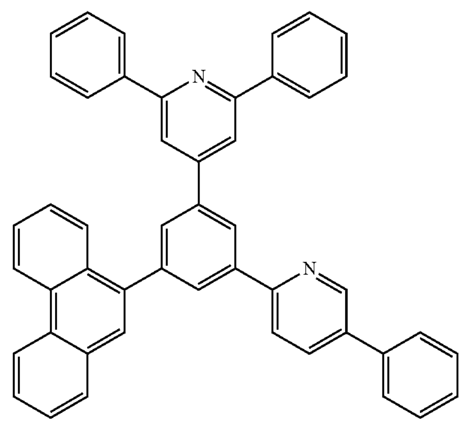

ET35

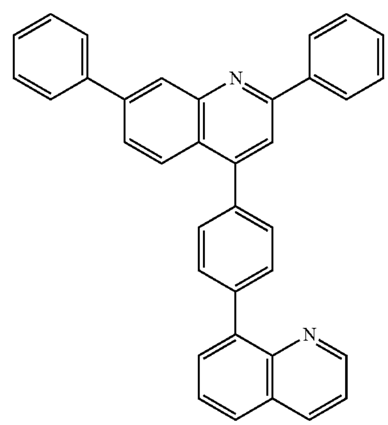

ET36

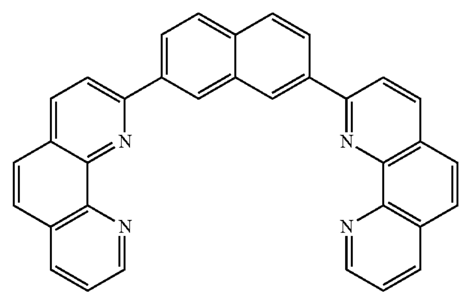

The electron transport region ETR may include a metal halide such as LiF, NaCl, CsF, RbCl, RbI, CuI, and KI, a lanthanide metal such as Yb, or a co-deposited material of the metal halide and the lanthanide metal. For example, the electron transport region ETR may include KI:Yb, RbI:Yb, etc., as a co-deposited material. The electron transport region ETR may include a metal oxide such as $Li_2O$ and BaO, or 8-hydroxy-lithium quinolate (Liq).

However, embodiments are not limited thereto. The electron transport region ETR may be formed using a mixture material of an electron transport material and an insulating organo metal salt. The organo metal salt may be a material having an energy band gap equal to or greater than about 4 eV. For example, the organo metal salt may include metal acetates, metal benzoates, metal acetoacetates, metal acetylacetonates, or metal stearates.

The electron transport region ETR may include at least one of 2,9-dimethyl-4,7-diphenyl-1,10-phenanthroline (BCP), or 4,7-diphenyl-1,10-phenanthroline (Bphen) in addition to the aforementioned materials. However, embodiments are not limited thereto.

The electron transport region ETR may include the compounds of the electron transport region in at least one of an electron injection layer EIL, an electron transport layer ETL, or a hole blocking layer HBL.

If the electron transport region ETR includes an electron transport layer ETL, a thickness of the electron transport layer ETL may be in a range of about 100 Å to about 1,000 Å. For example, the thickness of the electron transport layer ETL may be in a range of about 150 Å to about 500 Å. If the thickness of the electron transport layer ETL satisfies the above-described range, satisfactory electron transport properties may be obtained without a substantial increase of driving voltage. If the electron transport region ETR includes an electron injection layer EIL, a thickness of the electron injection layer EIL may be in a range of about 1 Å to about 100 Å. For example, the thickness of the electron injection layer EIL may be in a range of about 3 Å to about 90 Å. If the thickness of the electron injection layer EIL satisfies the above described range, satisfactory electron injection properties may be obtained without a substantial increase of driving voltage.

The second electrode EL2 is provided on the electron transport region ETR. The second electrode EL2 may be a common electrode. The second electrode EL2 may be a cathode or an anode, but embodiments are not limited thereto. For example, if the first electrode EL1 is an anode, the second electrode EL2 may be a cathode, and if the first electrode EL1 is a cathode, the second electrode EL2 may be an anode.

The second electrode EL2 may be a transmissive electrode, a transflective electrode, or a reflective electrode. If the second electrode EL2 is a transmissive electrode, the second electrode EL2 may include a transparent metal oxide, for example, ITO, IZO, ZnO, ITZO, etc.

If the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, compounds thereof, or mixtures thereof (for example, AgMg, AgYb, or MgAg). In another embodiment, the second electrode EL2 may have a multi-layered structure including a reflective layer or a transflective layer formed using the above-described materials and a transparent conductive layer formed using ITO, IZO, ZnO, ITZO, etc. For example, the second electrode EL2 may include the aforementioned metal materials, combinations of two or more metal materials selected from the aforementioned metal materials, or oxides of the aforementioned metal materials.

Although not shown in the drawings, the second electrode EL2 may be electrically connected to an auxiliary electrode. If the second electrode EL2 is electrically connected to the auxiliary electrode, the resistance of the second electrode EL2 may decrease.

In an embodiment, the light emitting device ED may further include a capping layer CPL disposed on the second electrode EL2. The capping layer CPL may be a multilayer or a single layer.

In an embodiment, the capping layer CPL may include an organic layer or an inorganic layer. For example, if the capping layer CPL includes an inorganic material, the inorganic material may include an alkali metal compound such as LiF, an alkaline earth metal compound such as $MgF_2$, SiON, SiNx, SiOy, etc.

For example, if the capping layer CPL includes an organic material, the organic material may include α-NPD, NPB, TPD, m-MTDATA, $Alq_3$, CuPc, N4,N4,N4',N4'-tetra(biphenyl-4-yl) biphenyl-4,4'-diamine (TPD15), 4,4',4"-tris(carbazol sol-9-yl) triphenylamine (TCTA), etc., or may include an epoxy resin, or acrylate such as methacrylate.

The capping layer CPL may include at least one of Compounds P1 to P5, but embodiments are not limited thereto.

P1

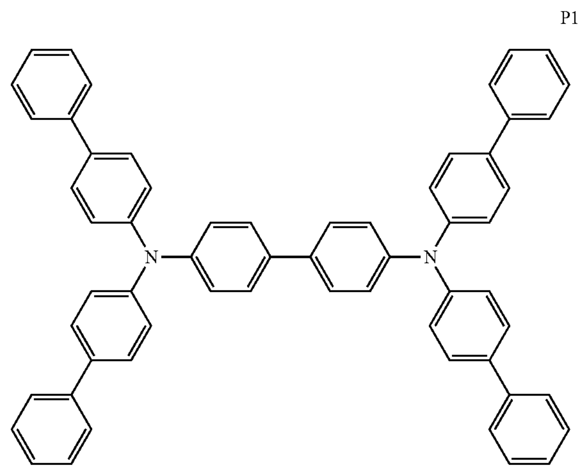

P2

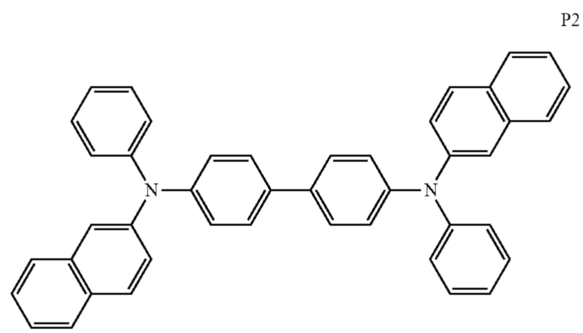

P3

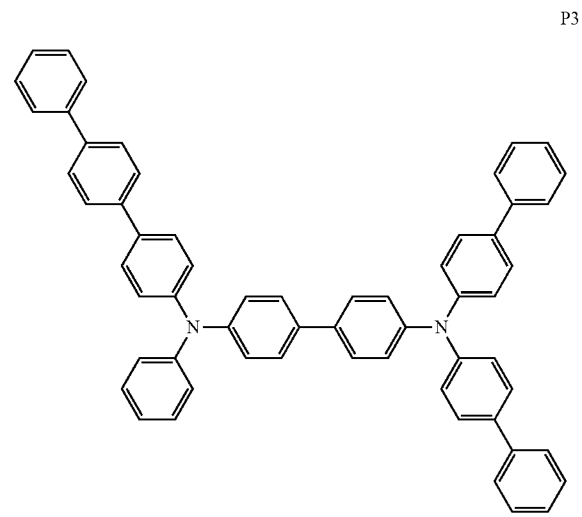

-continued

P4

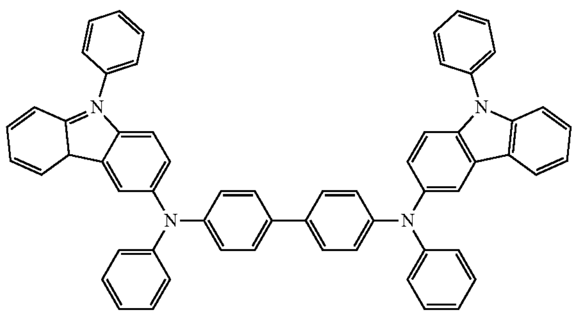

P5

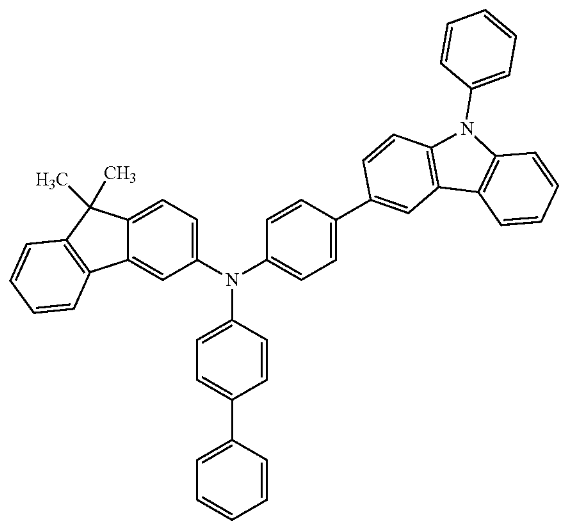

A refractive index of the capping layer CPL may be equal to or greater than about 1.6. For example, the capping layer CPL may have a refractive index equal to or greater than about 1.6 with respect to light in a wavelength range of about 550 nm to about 660 nm.

Figure 7:
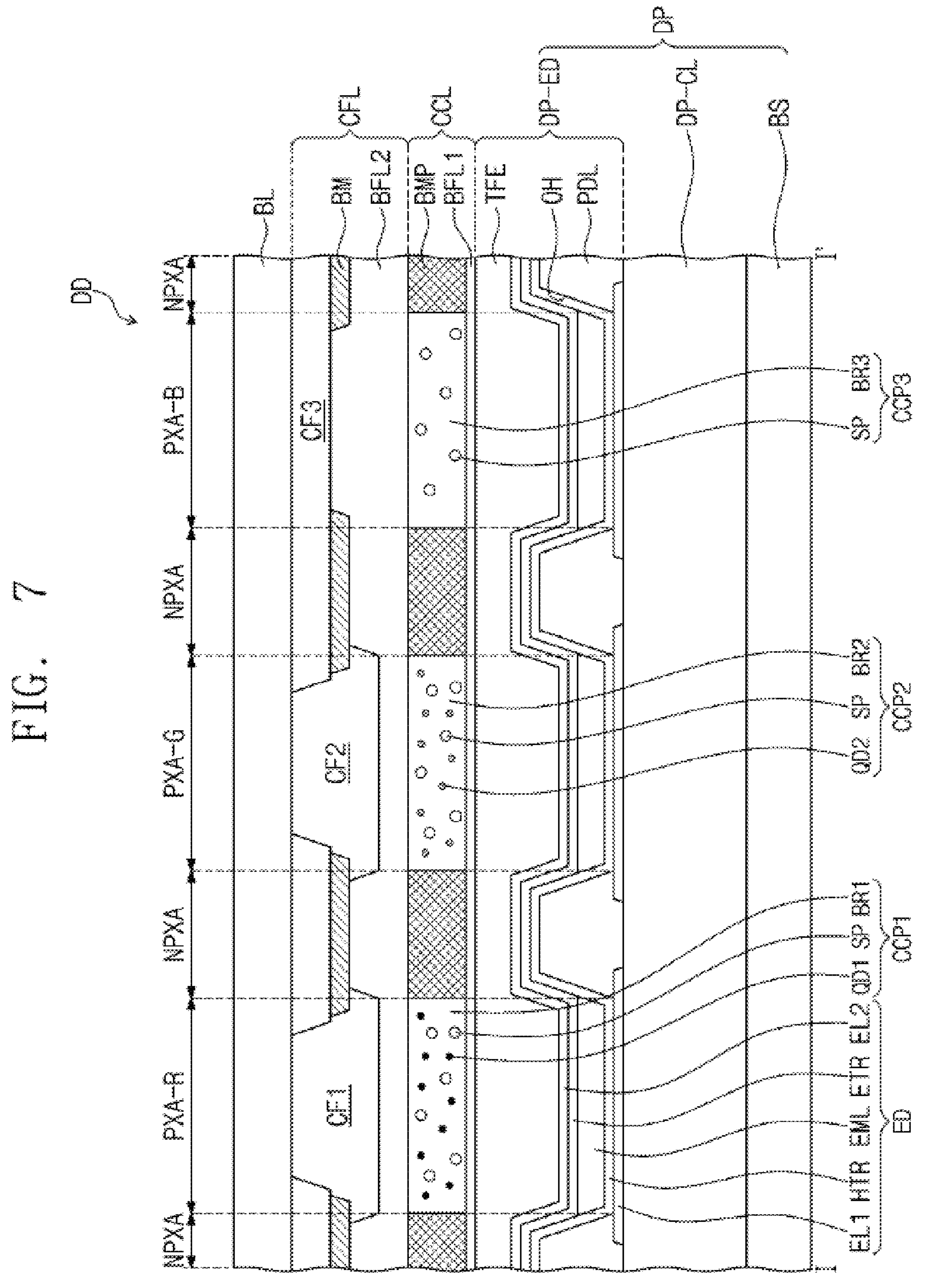
FIG. 7 is a schematic cross-sectional view illustrating a display apparatus according to an embodiment.
Figure 8:
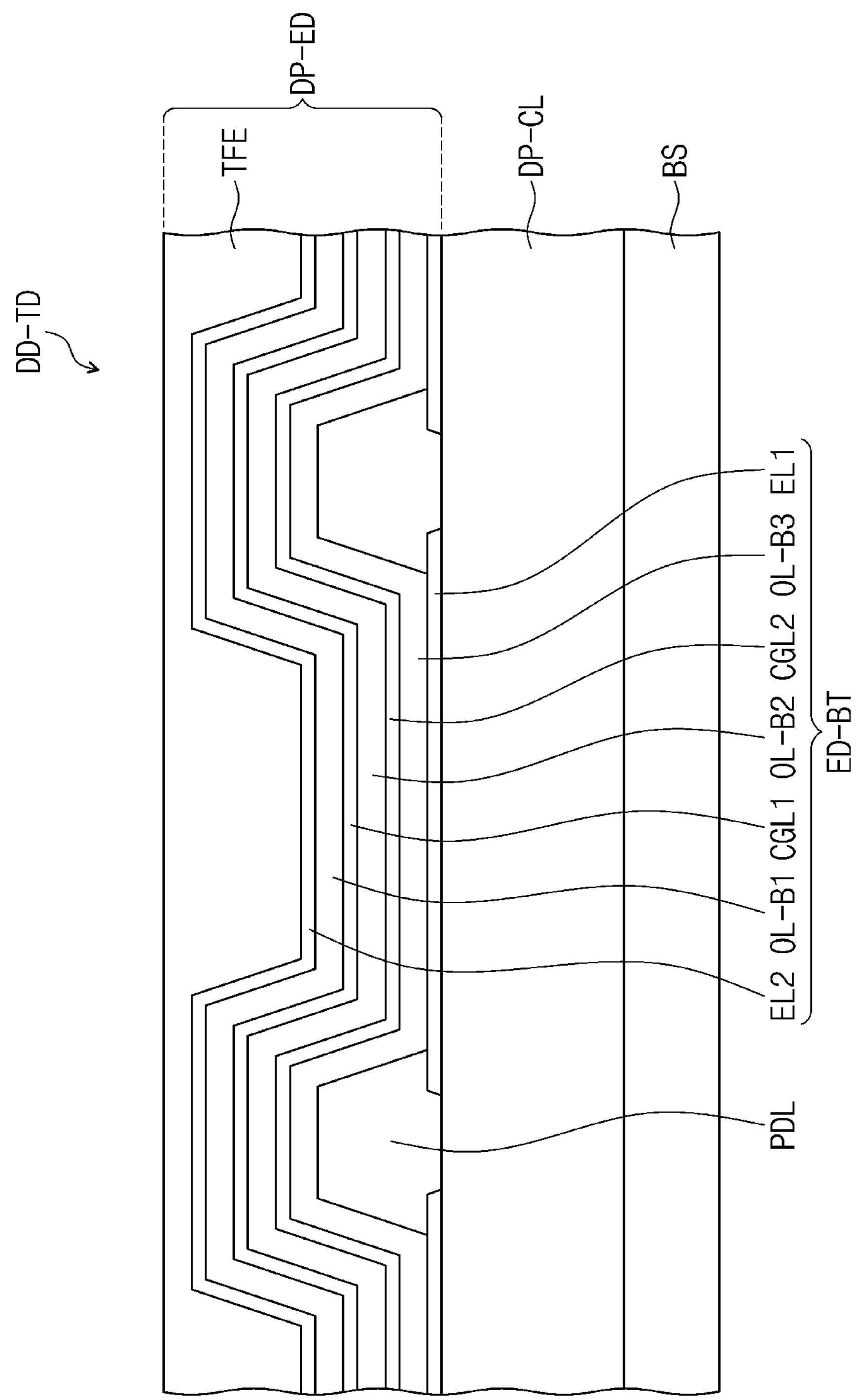
FIG. 8 is a schematic cross-sectional view illustrating a display apparatus according to an embodiment.

FIG. 7 and FIG. 8 are each a schematic cross-sectional view of a display apparatus according to embodiments. In the explanation on the display apparatuses of embodiments according to FIG. 7 and FIG. 8, the overlapping parts with the explanation on FIG. 1 to FIG. 6 will not be explained again, and the different features will be explained.

Referring to FIG. 7, the display apparatus DD according to an embodiment may include a display panel DP including a display device layer DP-ED, a light controlling layer CCL disposed on the display panel DP, and a color filter layer CFL.

In an embodiment shown in FIG. 7, the display panel DP may include a base layer BS, a circuit layer DP-CL provided on the base layer BS, and a display device layer DP-ED, and the display device layer DP-ED may include a light emitting device ED.

The light emitting device ED may include a first electrode EL1, a hole transport region HTR disposed on the first electrode EL1, an emission layer EML disposed on the hole transport region HTR, an electron transport region ETR disposed on the emission layer EIL, and a second electrode EL2 disposed on the electron transport region ETR. A structure of the light emitting device according to FIG. 3 to FIG. 6 may be applied to the structure of the light emitting device ED shown in FIG. 7.

Referring to FIG. 7, the emission layer EMIL may be disposed in openings OH defined in a pixel definition layer PDL. For example, the emission layer EIL which is divided by the pixel definition layer PDL and correspondingly provided to each of the luminous areas PXA-R, PXA-G, and PXA-B may emit light in a same wavelength region. In the display apparatus DD of an embodiment, the emission layer EIL may emit blue light. Although not shown in the drawings, in an embodiment, the emission layer EIL may be provided as a common layer for all luminous areas PXA-R, PXA-G, and PXA-B.

The light controlling layer CCL may be disposed on the display panel DP. The light controlling layer CCL may include a light converter. The light converter may include a quantum dot or a phosphor. The light converter may convert the wavelength of a provided light and may emit the converted light. For example, the light controlling layer CCL may be a layer including a quantum dot or a layer including a phosphor.

The light controlling layer CCL may include light controlling parts CCP1, CCP2, and CCP3. The light controlling parts CCP1, CCP2, and CCP3 may be separated from one another.

Referring to FIG. 7, a partition pattern BMP may be disposed between the separated light controlling parts CCP1, CCP2, and CCP3, but embodiments are not limited thereto. FIG. 7 illustrates that the partition pattern BMP does not overlap the light controlling parts CCP1, CCP2, and CCP3, but at least a portion of the edge of the light controlling parts CCP1, CCP2, and CCP3 may overlap the partition pattern BMP.

The light controlling layer CCL may include a first light controlling part CCP1 including a first quantum dot QD1 that converts first color light provided from the light emitting device ED into second color light, a second light controlling part CCP2 including a second quantum dot QD2 that converts first color light into third color light, and a third light controlling part CCP3 that transmits first color light.

In an embodiment, the first light controlling part CCP1 may provide red light which is the second color light, and the second light controlling part CCP2 may provide green light which is the third color light. The third light controlling part CCP3 may transmit and provide blue light, which is the first color light provided from the light emitting device ED. For example, the first quantum dot QD1 may be a red quantum dot, and the second quantum dot QD2 may be a green quantum dot. The same descriptions as provided above with respect to quantum dots may be applied to the quantum dots QD1 and QD2.

The light controlling layer CCL may further include a scatterer SP. The first light controlling part CCP1 may include the first quantum dot QD1 and the scatterer SP, the second light controlling part CCP2 may include the second quantum dot QD2 and the scatterer SP, and the third light controlling part CCP3 may not include a quantum dot but may include the scatterer SP.

The scatterer SP may be an inorganic particle. For example, the scatterer SP may include at least one of $TiO_2$, ZnO, $Al_2O_3$, $SiO_2$, and hollow silica. The scatterer SP may include at least one of $TiO_2$, ZnO, $Al_2O_3$, $SiO_2$, and hollow silica, or may be a mixture of two or more materials selected from $TiO_2$, ZnO, $Al_2O_3$, $SiO_2$, and hollow silica.

The first light controlling part CCP1, the second light controlling part CCP2, and the third light controlling part CCP3 may each include base resins BR1, BR2, and BR3 dispersing the quantum dots QD1 and QD2 and the scatterer SP. In an embodiment, the first light controlling part CCP1 may include the first quantum dot QD1 and the scatterer SP dispersed in the first base resin BR1, the second light controlling part CCP2 may include the second quantum dot QD2 and the scatterer SP dispersed in the second base resin BR2, and the third light controlling part CCP3 may include the scatterer particle SP dispersed in the third base resin BR3. The base resins BR1, BR2, and BR3 may each be a medium in which the quantum dots QD1 and QD2 and the scatterer SP are dispersed, and may be composed of various resin compositions which may be generally referred to as a binder. For example, the base resins BR1, BR2, and BR3 may each independently be acrylic resins, urethane-based resins, silicone-based resins, epoxy-based resins, etc. The base resins BR1, BR2, and BR3 may each be transparent resins. In an embodiment, the first base resin BR1, the second base resin BR2, and the third base resin BR3 may be the same as or different from each other.

The light controlling layer CCL may include a barrier layer BFL1. The barrier layer BFL1 may block penetration of moisture and/or oxygen (hereinafter, will be referred to as "humidity/oxygen"). The barrier layer BFL1 may be disposed on the light controlling parts CCP1, CCP2, and CCP3 to block the exposure of the light controlling parts CCP1, CCP2, and CCP3 to humidity/oxygen. The barrier layer BFL1 may cover the light controlling parts CCP1, CCP2, and CCP3. For example, the barrier layer BFL2 may be provided between the light controlling parts CCP1, CCP2, and CCP3 and a color filter layer CFL.

The barrier layers BFL1 and BFL2 may each include at least one inorganic layer. For example, the barrier layers BFL1 and BFL2 may each be formed by including an inorganic material. For example, the barrier layers BFL1 and BFL2 may each independently include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or a metal thin film securing light transmittance. The barrier layers BFL1 and BFL2 may each further include an organic layer. The barrier layers BFL1 and BFL2 may each be formed of a single layer or of multiple layers.

In the display apparatus DD of an embodiment, the color filter layer CFL may be disposed on the light controlling layer CCL. In an embodiment, the color filter layer CFL may be disposed directly on the light controlling layer CCL. For example, the barrier layer BFL2 may be omitted.

The color filter layer CFL may include a light blocking part BM and filters CF1, CF2, and CF3. The color filter layer CFL may include a first filter CF1 that transmits second color light, a second filter CF2 that transmits third color light, and a third filter CF3 that transmits first color light. For example, the first filter CF1 may be a red filter, the second filter CF2 may be a green filter, and the third filter CF3 may be a blue filter. Each of the filters CF1, CF2, and CF3 may include a polymer photosensitive resin and a pigment or dye. The first filter CF1 may include a red pigment or dye, the second filter CF2 may include a green pigment or dye, and the third filter CF3 may include a blue pigment or dye. However, embodiments are not limited thereto, and the third filter CF3 may not include a pigment or dye. The third filter CF3 may include a polymer photosensitive resin and may not include a pigment or dye. The third filter CF3 may be transparent. The third filter CF3 may be formed of a transparent photosensitive resin.

In an embodiment, the first filter CF1 and the second filter CF2 may each be a yellow filter. The first filter CF1 and the second filter CF2 may be provided in one body without distinction.

The light blocking part BM may be a black matrix. The light blocking part BM may include an organic light blocking material or an inorganic light blocking material including a black pigment or a black dye. The light blocking part BM may prevent light leakage and may separate the boundaries between adjacent filters CF1, CF2, and CF3. In an embodiment, the light blocking part BM may be formed as a blue filter.

The first to third filters CF1, CF2, and CF3 may be disposed corresponding to each of a red luminous area PXA-R, a green luminous area PXA-G, and a blue luminous area PXA-B.

A base substrate BL may be disposed on the color filter layer CFL. The base substrate BL may provide a base surface on which the color filter layer CFL, the light controlling layer CCL, etc. are disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawing, in an embodiment, the base substrate BL may be omitted.

FIG. 8 is a schematic cross-sectional view showing a portion of the display apparatus according to an embodiment. In FIG. 8, a schematic cross-sectional view of a portion corresponding to the display panel DP in FIG. 7 is shown. In a display apparatus DD-TD of an embodiment, the light emitting device ED-BT may include multiple light emitting structures OL-B1, OL-B2, and OL-B3. The light emitting device ED-BT may include a first electrode EL1 and an oppositely disposed second electrode EL2, and the light emitting structures OL-B1, OL-B2, and OL-B3 stacked in a thickness direction and between the first electrode EL1 and the second electrode EL2. Each of the light emitting structures OL-B1, OL-B2, and OL-B3 may include an emission layer EML (FIG. 7), and a hole transport region HTR and an electron transport region ETR disposed with the emission layer EML (FIG. 7) therebetween.

For example, the light emitting device ED-BT included in the display apparatus DD-TD of an embodiment may be a light emitting device having a tandem structure and including multiple emission layers.

In an embodiment shown in FIG. 8, light emitted from the light emitting structures OL-B1, OL-B2, and OL-B3 may be all blue light. However, embodiments are not limited thereto, and light emitted from the light emitting structures OL-B1, OL-B2, and OL-B3 may have different wavelength regions from each other. For example, the light emitting device ED-BT including the light emitting structures OL-B1, OL-B2, and OL-B3 emitting light in different wavelength regions may emit white light.

Charge generating layers CGL1 and CGL2 may be disposed between neighboring light emitting structures among OL-B1, OL-B2, and OL-B3. The charge generating layers CGL1 and CGL2 may each independently include a p-type charge generating layer and/or an n-type charge generating layer.

Hereinafter, the fused polycyclic compound according to an embodiment and the light emitting device of an embodiment will be explained with reference to the Examples and the Comparative Examples. The Examples below are only illustrations for understanding the disclosure, and the scope thereof is not limited thereto.

Examples

1. Synthesis of Fused Polycyclic Compound

A synthesis method of the fused polycyclic compound according to an embodiment will be explained by illustrating the synthesis methods of Compounds 1, 6, 12, 19, 21 and 29.

The synthesis methods of the fused polycyclic compounds explained hereinafter are only provided as examples, and the synthesis method of the fused polycyclic compound according to an embodiment is not limited to the examples below.

(1) Synthesis of Compound 1

(Synthesis of Intermediate 1-1)

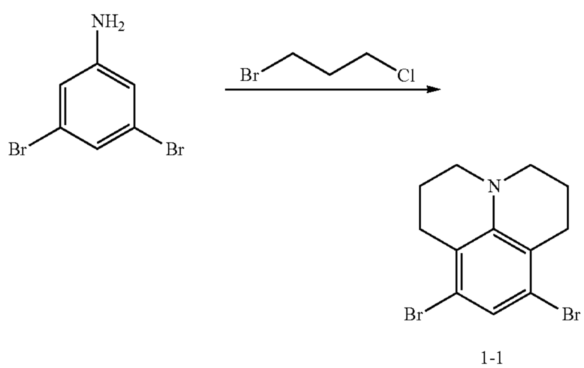

1-1

3,5-dibromoaniline (1 eq), 1-bromo-3-chloropropane (8 eq), and $Na_2CO_3$ (4 eq) were stirred at about 140° C. for about 48 hours. After cooling, an organic layer extracted with methylene chloride was dried with $MgSO_4$ and dried under a reduced pressure. The resultant product was redissolved in N,N-dimethylformamide (DMF) and stirred at about 160° C. for about 24 hours. After drying under a reduced pressure, the resultant product was extracted with methylene chloride and water, and dried with $MgSO_4$ and dried under a reduced pressure.

The crude product thus obtained was separated and purified by column chromatography using ethyl acetate and n-hexane to obtain Intermediate 1-1 (yield: 65%).

(Synthesis of Intermediate 1-2)

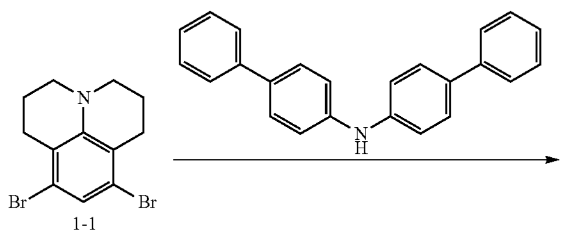

1-1

-continued

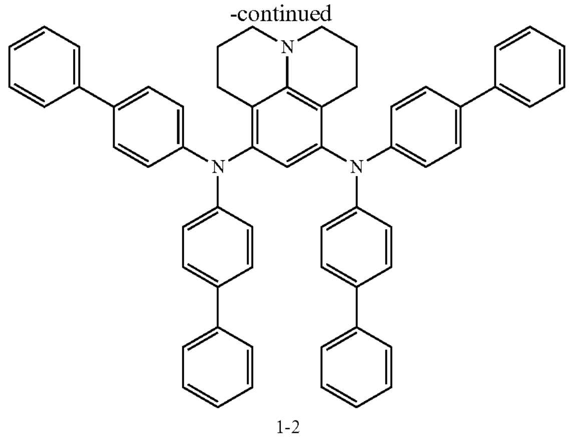

1-2

Intermediate 1-1 (1 eq), di([1,1'-biphenyl]-4-yl)amine (2 eq), tris(dibenzylideneacetone)dipalladium(0) (0.05 eq), tri-tert-butylphosphine (0.1 eq), and sodium tert-butoxide (3 eq) were dissolved in toluene and stirred at about 110 degrees centigrade for about 16 hours. After cooling, an organic layer obtained by separating liquid layers after washing with ethyl acetate and water three times, was dried with $MgSO_4$ and dried under a reduced pressure. The crude product thus obtained was separated by column chromatography using methylene chloride and n-hexane to obtain Intermediate 1-2 (yield: 72%).

(Synthesis of Compound 1)

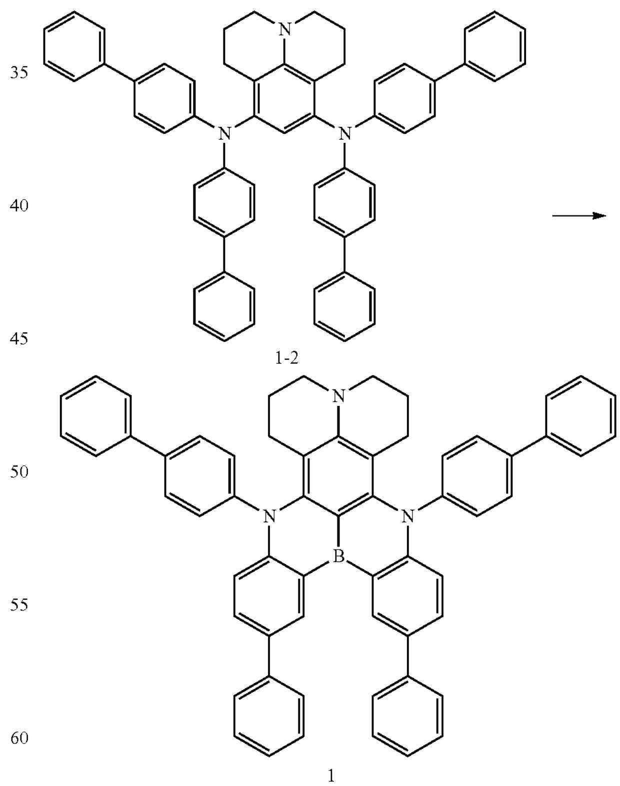

1-2

1

Intermediate 1-2 (1 eq) was dissolved in o-dichlorobenzene and cooled to about 0 degrees centigrade, and under a nitrogen atmosphere, $BBr_3$ (5 eq) was slowly injected thereto. After finishing the dropwise addition, the temperature was raised to about 150 degrees centigrade and stirring was performed for about 24 hours. After cooling, triethylamine was added dropwise and slowly to a flask containing the resultant product to finish the reaction, and ethyl alcohol was added to the resultant product to precipitate. The precipitate was filtered to obtain a reaction product. The solid content thus obtained was separated by column chromatography using methylene chloride and n-hexane and recrystallized using toluene and acetone to obtain Compound 1 (yield: 16%).

(2) Synthesis of Compound 6

(Synthesis of Intermediate 6-1)

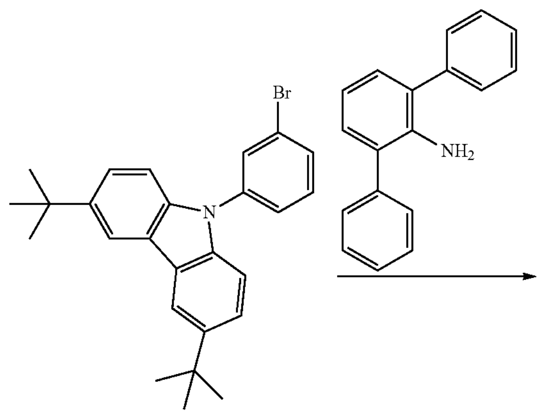

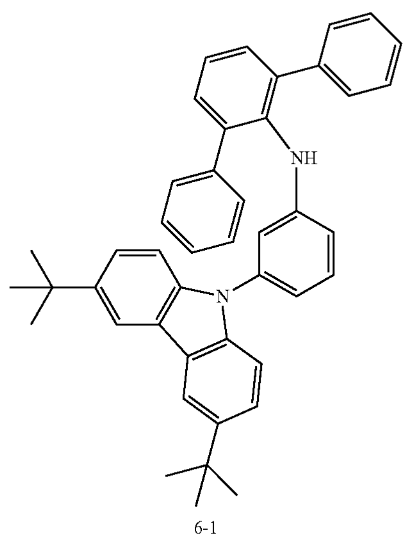

6-1

9-(3-bromophenyl)-3,6-di-tert-butyl-9H-carbazole (1 eq), [1,1':3',1"-terphenyl]-2'-amine (1.1 eq), tris(dibenzylideneacetone)dipalladium(0) (0.05 eq), tri-tert-butylphosphine (0.1 eq), and sodium tert-butoxide (3 eq) were dissolved in o-xylene and stirred at about 140 degrees centigrade for about 12 hours. After cooling, an organic layer obtained by separating liquid layers after washing with ethyl acetate and water three times was dried with $MgSO_4$ and dried under a reduced pressure. The resultant product was separated by column chromatography using methylene chloride and n-hexane to obtain Intermediate 6-1 (yield: 55%).

(Synthesis of Intermediate 6-2)

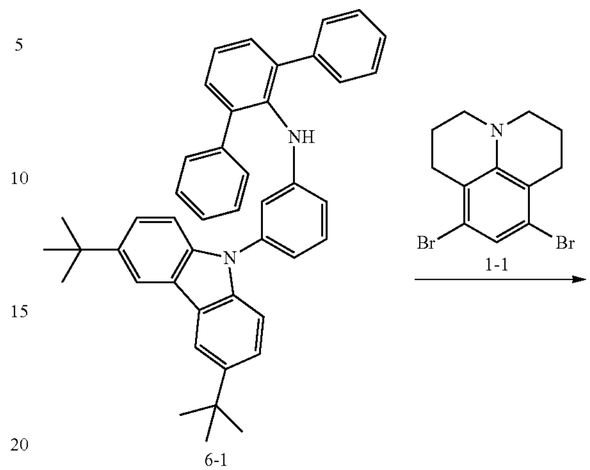

6-1

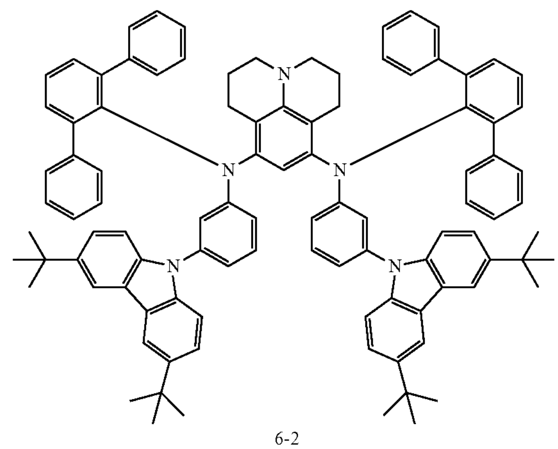

6-2

Intermediate 6-1 (1 eq), Intermediate 1-1 (2 eq), tris(dibenzylideneacetone)dipalladium(0) (0.05 eq), tri-tert-butylphosphine (0.1 eq), and sodium tert-butoxide (3 eq) were dissolved in toluene and stirred at about 110 degrees centigrade for about 16 hours. After cooling, an organic layer obtained by separating liquid layers after washing with ethyl acetate and water three times was dried with $MgSO_4$ and dried under a reduced pressure. The crude product thus obtained was separated by column chromatography using methylene chloride and n-hexane to obtain Intermediate 6-2 (yield: 45%).

(Synthesis of Compound 6)
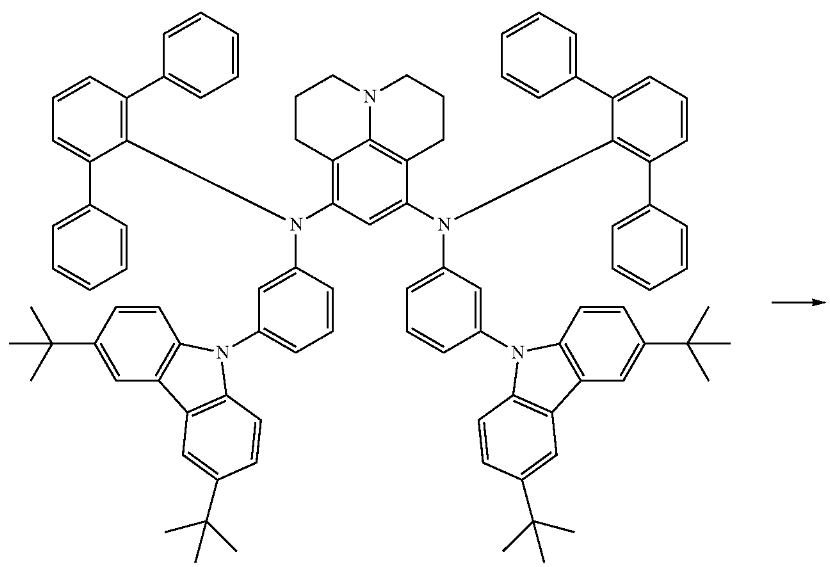
6-2
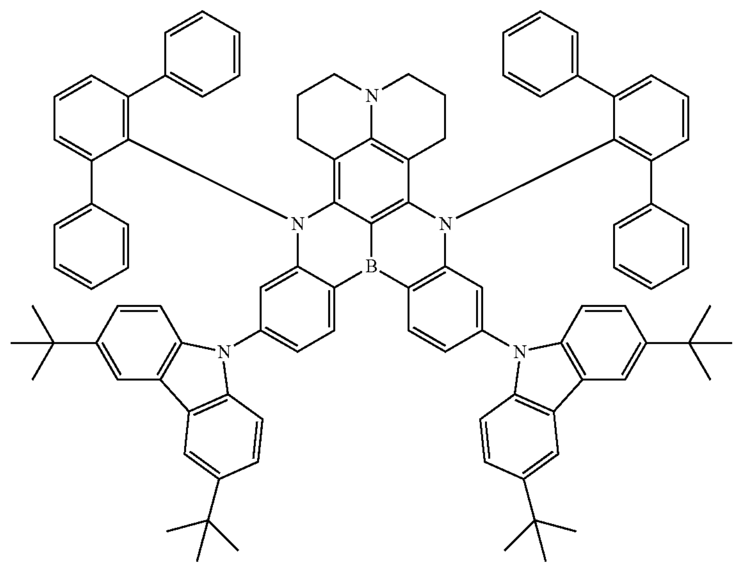
6

Intermediate 6-2 (1 eq) was dissolved in o-dichlorobenzene and cooled to about 0 degrees centigrade, and under a nitrogen atmosphere, $BBr_3$ (5 eq) was slowly injected thereto. After finishing the dropwise addition, the temperature was raised to about 150 degrees centigrade and stirring was performed for about 24 hours. After cooling, triethylamine was added dropwise and slowly to a flask containing the resultant product to finish the reaction, and ethyl alcohol was added to the resultant product to precipitate. The precipitate was filtered to obtain a reaction product. The solid content thus obtained was separated by column chromatography using methylene chloride and n-hexane and recrystallized using toluene and acetone to obtain Compound 6 (yield: 23%).

(3) Synthesis of Compound 12

(Synthesis of Intermediate 12-1)

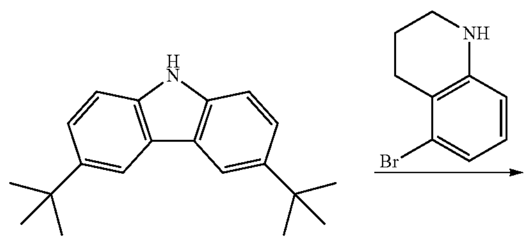

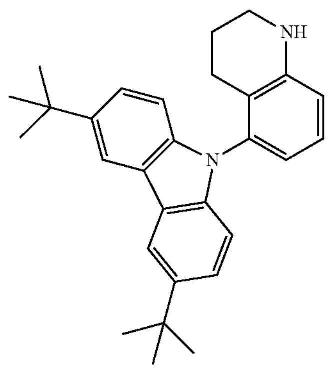

12-1

3,6-di-tert-butyl-9H-carbazole (1 eq), 5-bromo-1,2,3,4-tetrahydroquinoline (0.6 eq), tris(dibenzylideneacetone)dipalladium(0) (0.05 eq), tri-tert-butylphosphine (0.1 eq), and sodium tert-butoxide (3eq) were dissolved in toluene and stirred at about 90 degrees centigrade for about 4 hours. After cooling, an organic layer obtained by separating liquid layers after washing with ethyl acetate and water three times was dried with $MgSO_4$ and dried under a reduced pressure. The resultant product was separated by column chromatography using methylene chloride and n-hexane to obtain Intermediate 12-1 (yield: 33%).

(Synthesis of Intermediate 12-2)

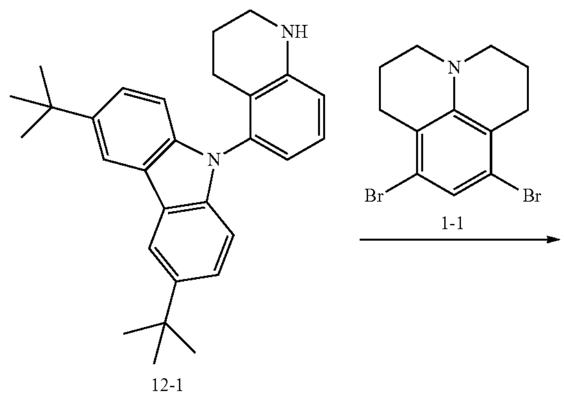

12-1

1-1

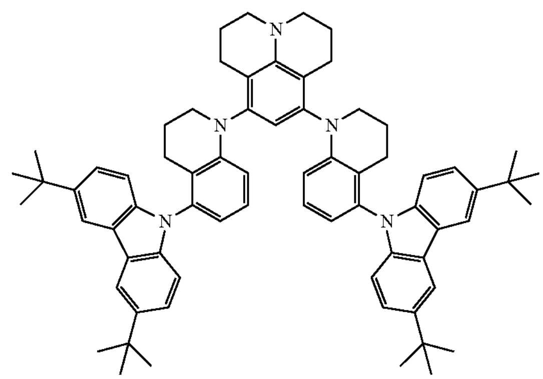

12-2

Intermediate 12-1 (1 eq), Intermediate 1-1 (2 eq), tris(dibenzylideneacetone)dipalladium(0) (0.05 eq), tri-tert-butylphosphine (0.1 eq), and sodium tert-butoxide (3 eq) were dissolved in toluene and stirred at about 110 degrees centigrade for about 16 hours. After cooling, an organic layer obtained by separating liquid layers after washing with ethyl acetate and water three times was dried with $MgSO_4$ and dried under a reduced pressure. The crude product thus obtained was separated by column chromatography using methylene chloride and n-hexane to obtain Intermediate 12-2 (yield: 59%).

(Synthesis of Compound 12)
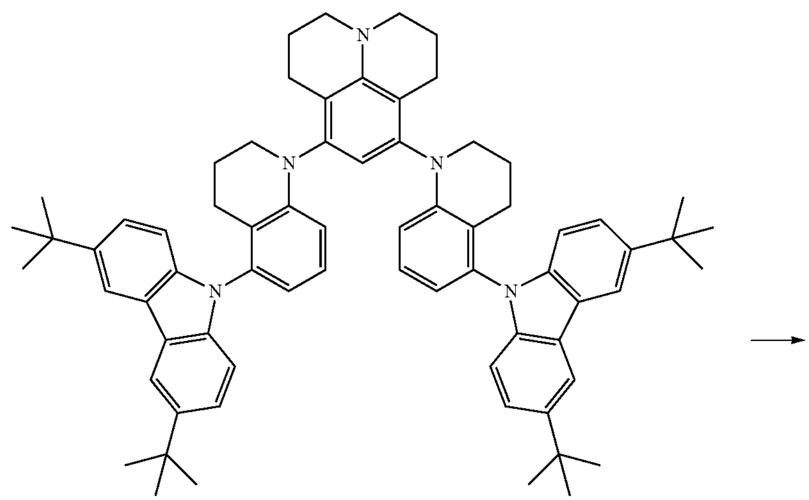
12-2
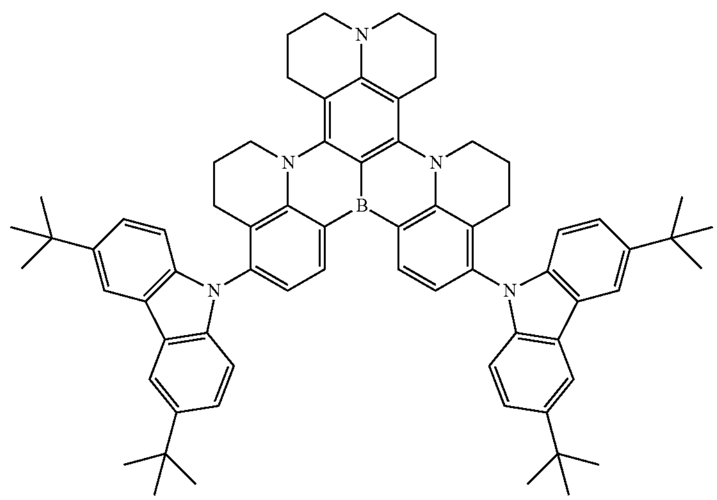
12

Intermediate 12-2 (1 eq) was dissolved in o-dichlorobenzene and cooled to about 0 degrees centigrade, and under a nitrogen atmosphere, $BBr_3$ (5 eq) was slowly injected thereto. After finishing the dropwise addition, the temperature was raised to about 150 degrees centigrade and stirring was performed for about 24 hours. After cooling, triethylamine was added dropwise and slowly to a flask containing the resultant product to finish the reaction, and ethyl alcohol was added to the resultant product to precipitate. The precipitate was filtered to obtain a reaction product. The solid content thus obtained was separated by column chromatography using methylene chloride and n-hexane and recrystallized using toluene and acetone to obtain Compound 12 (yield: 19%).

(4) Synthesis of Compound 19

(Synthesis of Intermediate 19-1)

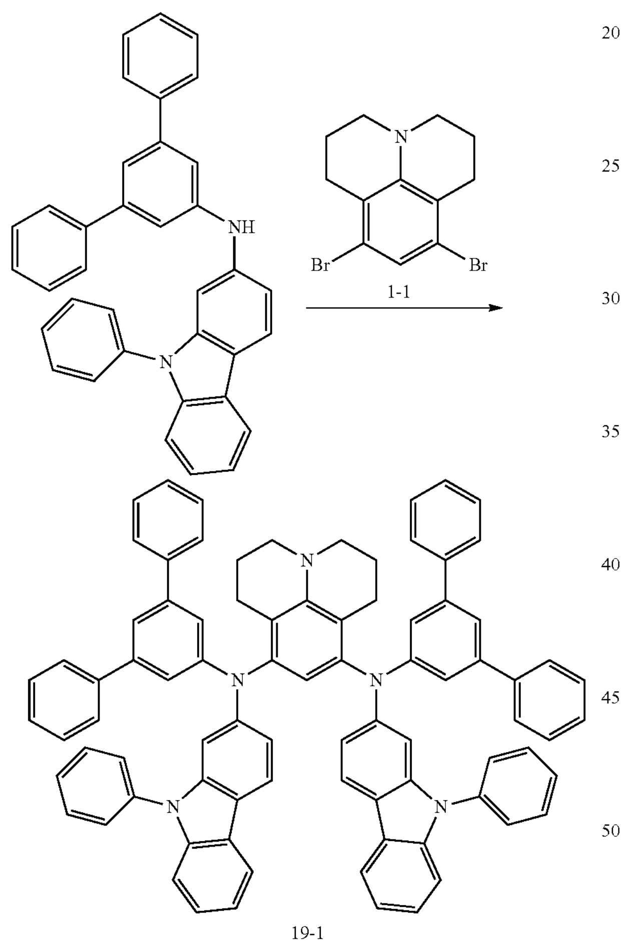

1-1

19-1

N-([1,1':3',1"-terphenyl]-5'-yl)-9-Phenyl-9H-carbazol-2-amine (1 eq), Intermediate 1-1 (2 eq), tris(dibenzylideneacetone)dipalladium(0) (0.05 eq), tri-tert-butylphosphine (0.1 eq), and sodium tert-butoxide (3eq) were dissolved in toluene and stirred at about 110 degrees centigrade for about 16 hours. After cooling, an organic layer obtained by separating liquid layers after washing with ethyl acetate and water three times was dried with $MgSO_4$ and dried under a reduced pressure. The resultant product was separated by column chromatography using methylene chloride and n-hexane to obtain Intermediate 19-1 (yield. 66%).

(Synthesis of Compound 19)

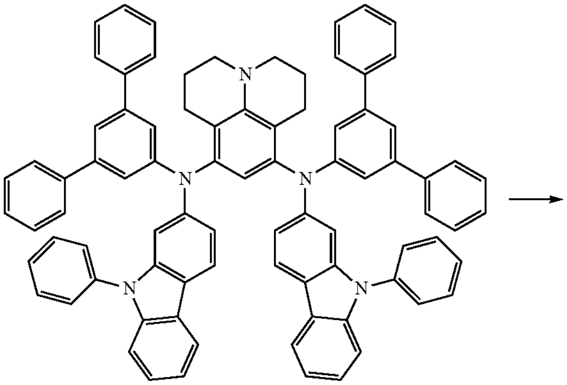

19-1

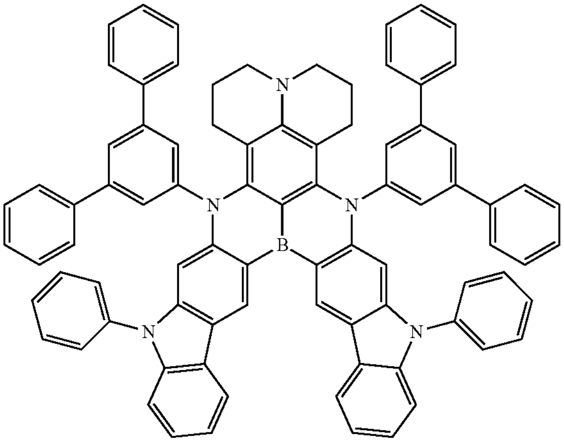

19

Intermediate 19-1 (1 eq) was dissolved in o-dichlorobenzene and cooled to about 0 degrees centigrade, and under a nitrogen atmosphere, $BBr_3$ (5 eq) was slowly injected thereto. After finishing the dropwise addition, the temperature was raised to about 150 degrees centigrade and stirring was performed for about 24 hours. After cooling, triethylamine was added dropwise and slowly to a flask containing the resultant product to finish the reaction, and ethyl alcohol was added to the resultant product to precipitate. The precipitate was filtered to obtain a reaction product. The solid content thus obtained was separated by column chromatography using methylene chloride and n-hexane and recrystallized using toluene and acetone to obtain Compound 19 (yield: 21%).

(5) Synthesis of Compound 21

(Synthesis of Intermediate 21-1)

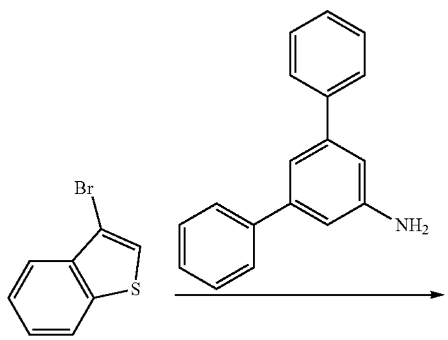

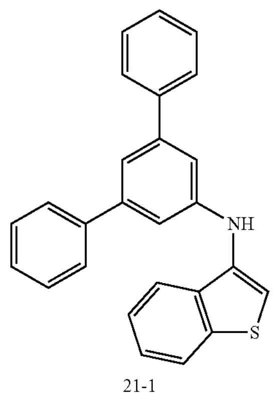

21-1

3-bromobenzo[b]thiophene (1 eq), [1,1':3',1"-terphenyl]-5'-amine (1.2 eq), tris(dibenzylideneacetone)dipalladium(0) (0.05 eq), tri-tert-butylphosphine (0.1 eq), and sodium tert-butoxide (3eq) were dissolved in toluene and stirred at about 100 degrees centigrade for about 5 hours. After cooling, an organic layer obtained by separating liquid layers after washing with ethyl acetate and water three times was dried with $MgSO_4$ and dried under a reduced pressure. The resultant product was separated by column chromatography using methylene chloride and n-hexane to obtain Intermediate 21-1 (yield: 74%).

(Synthesis of Intermediate 21-2)

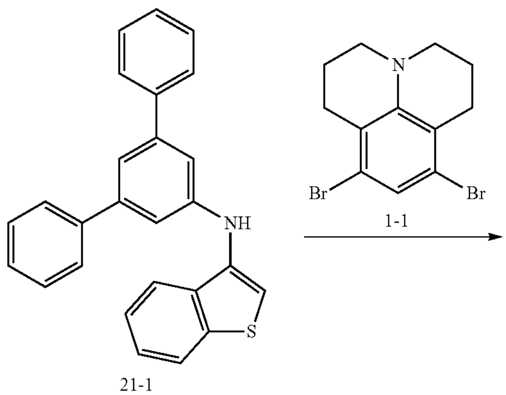

21-1

1-1

-continued

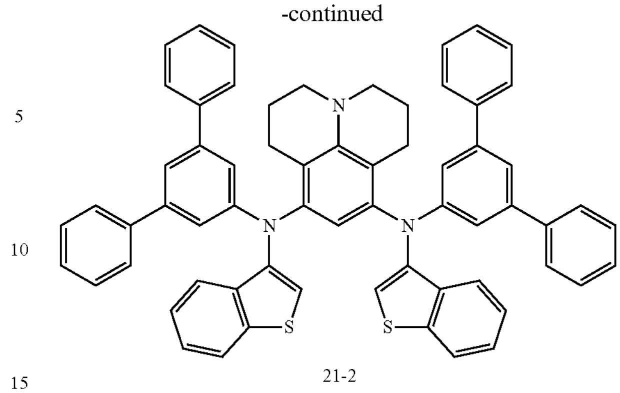

21-2

Intermediate 21-1 (1 eq), Intermediate 1-1 (2 eq), tris(dibenzylideneacetone)dipalladium(0) (0.05 eq), tri-tert-butylphosphine (0.1 eq), and sodium tert-butoxide (3 eq) were dissolved in toluene and stirred at about 110 degrees centigrade for about 16 hours. After cooling, an organic layer obtained by separating liquid layers after washing with ethyl acetate and water three times was dried with $MgSO_4$ and dried under a reduced pressure. The crude product thus obtained was separated by column chromatography using methylene chloride and n-hexane to obtain Intermediate 21-2 (yield. 52%).

(Synthesis of Compound 21)

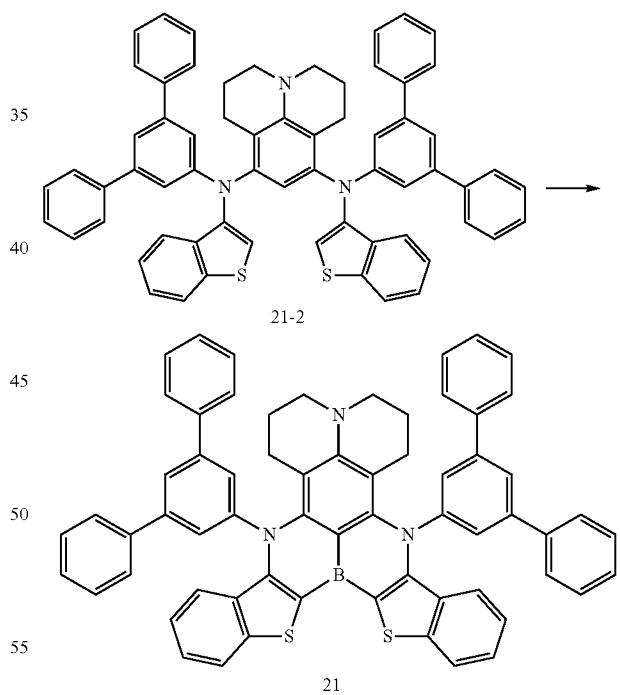

21-2

21

Intermediate 21-2 (1 eq) was dissolved in o-dichlorobenzene and cooled to about 0 degrees centigrade, and under a nitrogen atmosphere, $BBr_3$ (5 eq) was slowly injected thereto. After finishing the dropwise addition, in temperature was raised to about 150 degrees centigrade and stirring was performed for about 24 hours. After cooling, triethylamine was added dropwise and slowly to a flask containing the resultant product to finish the reaction, and ethyl alcohol was added to the resultant product to precipitate. The precipitate was filtered to obtain a reaction product. The solid content thus obtained was separated by column chromatography using methylene chloride and n-hexane and recrystallized using toluene and acetone to obtain Compound 21 (yield: 13%).

(6) Synthesis of Compound 29

(Synthesis of Intermediate 29-1)

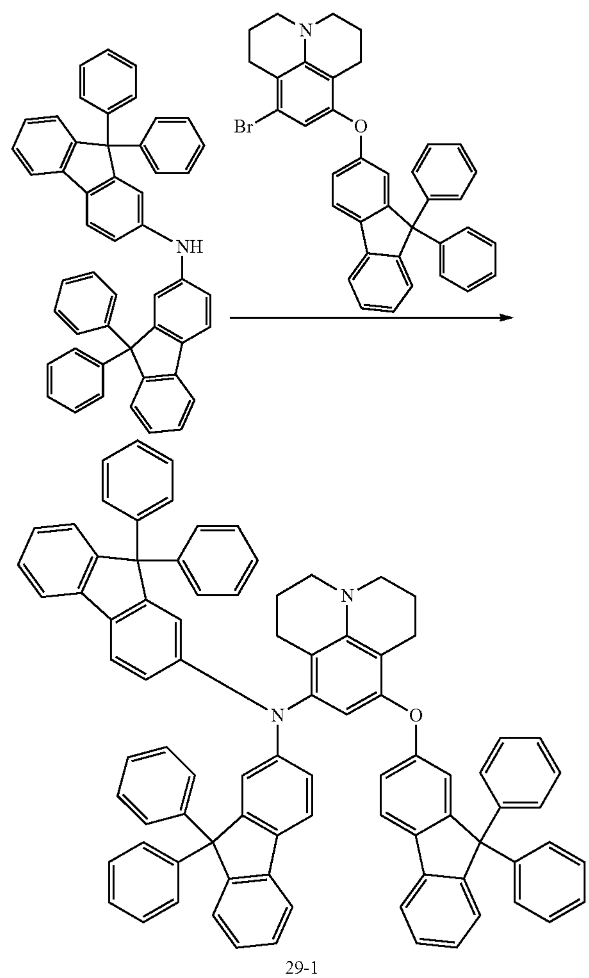

29-1

Bis(9,9-diphenyl-9H-fluoren-2-yl)amine (1 eq), 8-bromo-10-((9,9-diphenyl-9H-fluoren-2-yl)oxy)-1,2,3,5,6,7-hexahydropyrido[3,2,1-ij]quinoline (1 eq), tris(dibenzylideneacetone)dipalladium(0) (0.05 eq), tri-tert-butylphosphine (0.1 eq), and sodium tert-butoxide (3eq) were dissolved in toluene and stirred at about 100 degrees centigrade for about 6 hours. After cooling, an organic layer obtained by separating liquid layers after washing with ethyl acetate and water three times was dried with $MgSO_4$ and dried under a reduced pressure. The resultant product was separated by column chromatography using methylene chloride and n-hexane to obtain Intermediate 29-1 (yield: 43%).

(Synthesis of Compound 29)

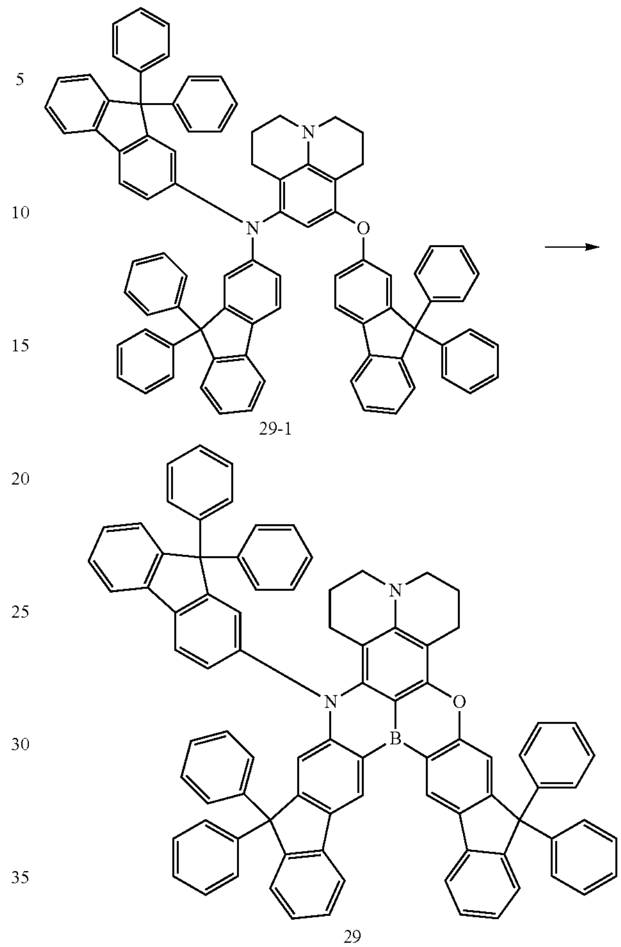

29-1

29

Intermediate 29-1 (1 eq) was dissolved in o-dichlorobenzene and cooled to about 0 degrees centigrade, and under a nitrogen atmosphere, $BBr_3$ (5 eq) was slowly injected thereto.

After finishing the dropwise addition, the temperature was raised to about 150 degrees centigrade and stirring was performed for about 24 hours. After cooling, triethylamine was added dropwise and slowly to a flask containing the resultant product to finish the reaction, and ethyl alcohol was added to the resultant product to precipitate. The precipitate was filtered to obtain a reaction product. The solid content thus obtained was separated by column chromatography using methylene chloride and n-hexane and recrystallized using toluene and acetone to obtain Compound 29 (yield: 11%)

$^1H$ NMR and MS/FAB of the compounds synthesized in Examples (1) to (6) are shown in Table 1 below. Referring to the aforementioned synthesis procedures and raw materials, synthesis methods of other compounds may be readily recognized by a person skilled in the art.

TABLE 1

| | NMR | Cal | Meas. |
|---|---|---|---|
| 1 | 9.36-9.31 (2H, s), 7.83-7.71 (12H, m), 7.61-7.41 (18H, m), 7.04-7.01 (2H, m), 3.13-3.10 (4H, m), 2.73-2.69 (4H, m), 2.11-1.92 (4H, m) | 819.378 | 819.377 |
| 6 | 8.99-8.92 (2H, d), 8.15-8.11 (4H, s), 7.61-7.33 (24H, d), 7.38-7.32 (4H, t), 7.15-7.04 (6H, d), 6.83-6.77 (2H, t), 6.62-6.55 (2H, m), 3.19-3.13 (4H, m), 2.77-2.72 (4H, m), 2.11-1.94 (4H, m), 1.52-1.39 (36H, m) | 1373.745 | 1373.743 |

TABLE 1-continued

| | NMR | Cal | Meas. |
|---|---|---|---|
| 12 | 8.98-8.89 (2H, d), 8.10-8.04 (4H, s), 7.53-7.46 (4H, m), 7.42-7.31 (4H, m), 7.13-7.06 (2H, d), 3.19-3.15 (4H, m), 3.06-3.01 (4H, m), 2.78-2.72 (8H, m), 2.10-1.91 (8H, m), 1.53-1.39 (36H, m) | 997.619 | 997.617 |
| 19 | 9.10-9.04 (2H, s), 8.08-8.03 (2H, d), 7.87-7.82 (2H, m), 7.71-7.57 (18H, m), 7.53-7.38 (16H, m), 7.36-7.32 (4H, m), 7.22-7.16 (2H, m), 6.96-6.89 (2H, m), 3.14-3.11 (4H, m), 2.77-2.71 (4H, m), 2.05-1.88 (4H, m) | 1149.494 | 1149.493 |
| 21 | 8.17-8.14 (2H, d), 7.85-7.81 (2H, m), 7.73-7.61 (10H, m) 7.55-7.50 (2H, m), 7.47-7.31 (18H, m), 3.15-3.10 (4H, m), 2.80-2.74 (4H, m), 2.11-1.95 (4H, m) | 931.323 | 931.321 |
| 29 | 9.31-9.26 (2H, s), 8.87-8.84 (4H, m), 7.46-7.27 (41H, m), 7.22-7.11 (2H, m), 3.17-3.12 (4H, m), 2.77-2.72 (4H, m), 2.09-1.84 (4H, m) | 1160.488 | 1160.479 |

2. Manufacture and Evaluation of Light Emitting Device Including Fused Polycyclic Compound (Manufacture of Light Emitting Device)

Light emitting devices of Examples 1 to 6 were manufactured using Compounds 1, 6, 12, 19, 21, and 29 as dopant materials of an emission layer.

Example Compounds

1

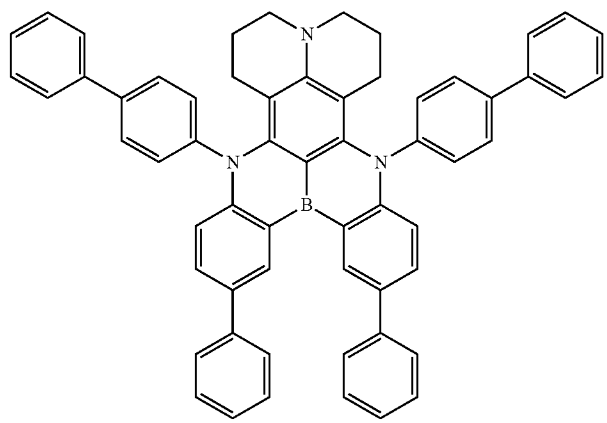

6

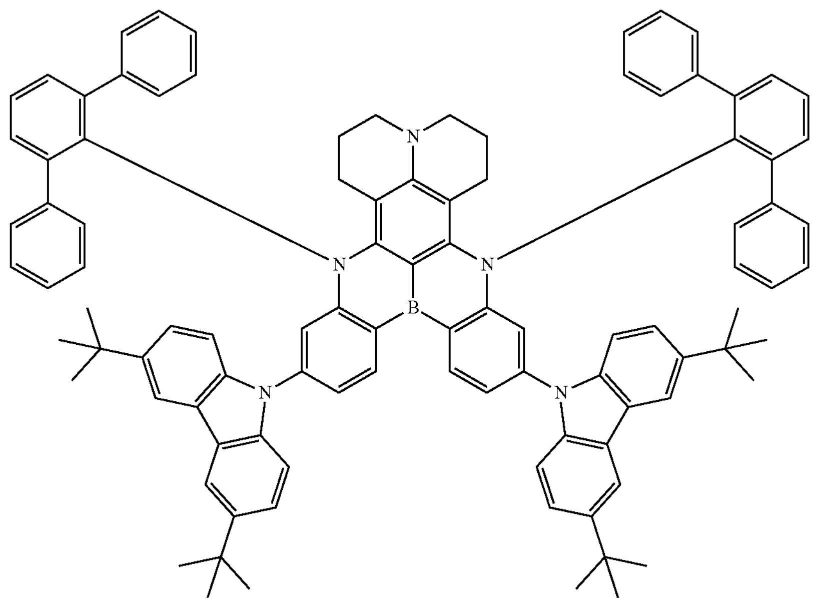

-continued
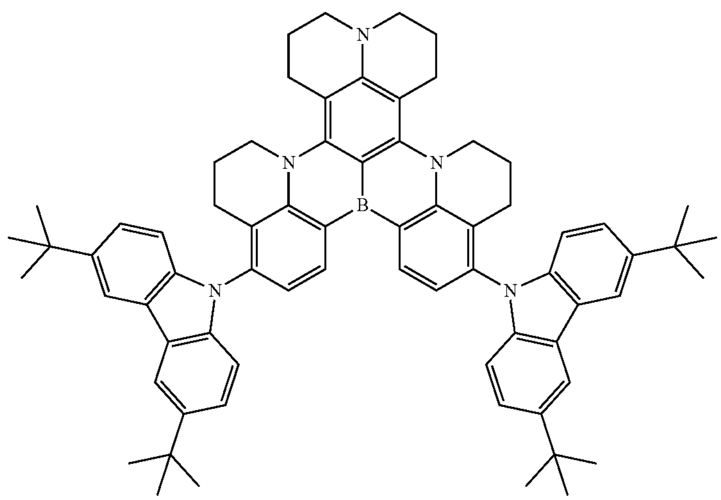
12
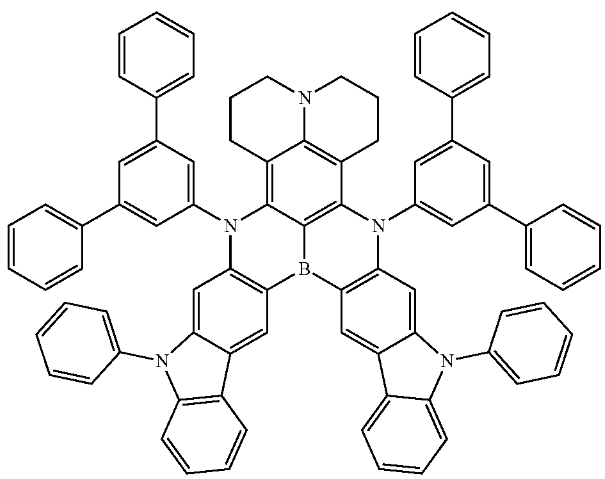
19
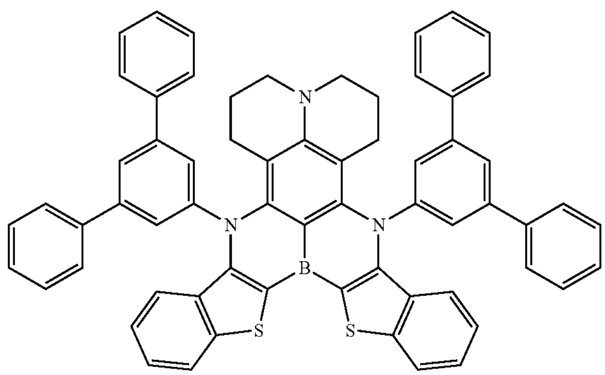
21

-continued
29
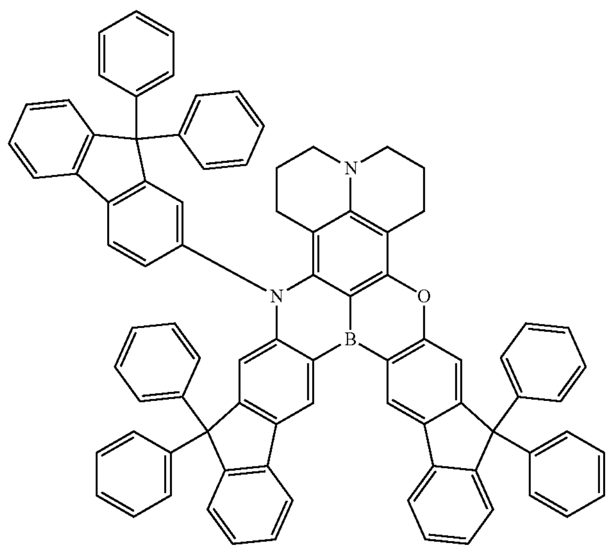
Comparative Compound X-1 to Comparative Compound X-4 below were used for the manufacture of devices of the Comparative Example 1 to Comparative Example 4.
[Comparative Compounds]
X-1
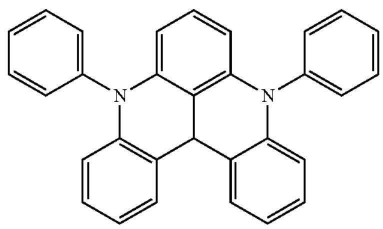
X-2
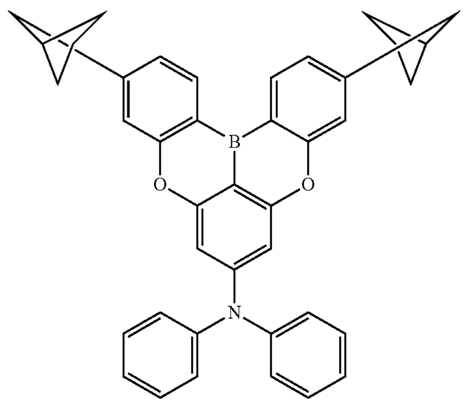
-continued
X-3
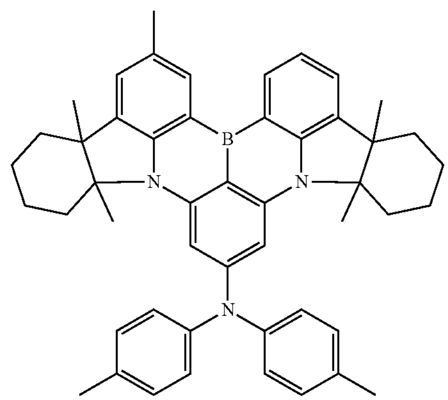
X-4
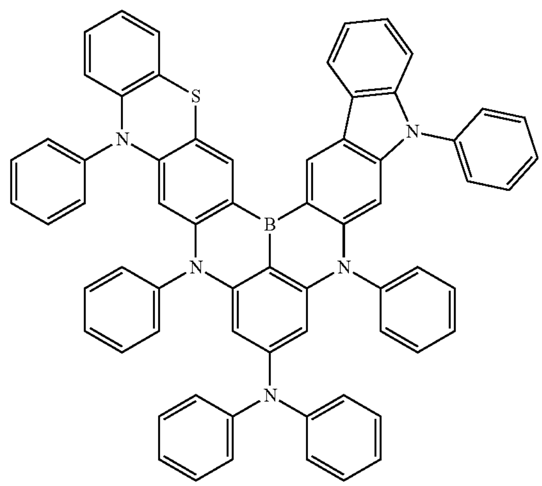

Example 1 to Example 6

A light emitting device of an embodiment, including the fused polycyclic compound of an embodiment in an emission layer was manufactured by a method which will be explained below. Example 1 to Example 6 correspond to light emitting devices manufactured by using Compounds 1, 6, 12, 19, 21, and 29, which are aforementioned Example Compounds, as light emitting materials.

ITO with a thickness of about 1,200 Å was patterned on a glass substrate to form a first electrode, washed by ultrasonic waves using isopropyl alcohol and pure water for about 5 minutes, respectively, and cleaned by exposing to ultraviolet rays for about 30 minutes and exposed to ozone. On the glass substrate on which ITO was formed, N,N'-di (1-naphthyl)-N,N'-diphenyl-(1,1'-biphenyl)-4,4'-diamine (NPD) was vacuum deposited to a thickness of about 300 Å to form a hole injection layer. H-1-1 was vacuum deposited to a thickness of about 200 Å to form a hole transport layer. On the hole transport layer, a hole transport compound of 9-(4-tert-butylphenyl)-3,6-bis(triphenylsilyl)-9H-carbazole (CzSi) was vacuum deposited to a thickness of about 100 Å to form an emission auxiliary layer.

The fused polycyclic compound of an embodiment and 1,3-bis(N-carbazolyl)benzene (mCP) were co-deposited in a ratio of 1:99 to form an emission layer with a thickness of about 200 Å.

On the emission layer, diphenyl[4-(triphenylsilyl)phenyl] phosphineoxide (TSPO1) as a compound of an electron transport layer was formed to a thickness of about 200 Å, and 2,2',2"-(1,3,5-benzenetriyl)-tris(1-phenyl-1-H-benzimidazole) (TPBI) as a compound of an electron injection layer was deposited to a thickness of about 300 Å. On the emission layer, an alkali metal halide of LiF was deposited to a thickness of about 10 Å as an electron injection layer, and Al was vacuum deposited to a thickness of about 3000 Å to form a second electrode of LiF/Al, thereby manufacturing a light emitting device.

Comparative Example 1 to Comparative Example 4

Comparative Example 1 to Comparative Example 4 correspond to light emitting devices manufactured by using Comparative Compound X-1 to Comparative Compound X-4 as light emitting materials.

The light emitting devices were manufactured by a same method as in Example 1 to Example 6 except for using the Comparative Compounds instead of the fused polycyclic compound of an embodiment as materials for forming an emission layer, in Example 1 to Example 6.

Comparative Example 5 to Comparative Example 7

Comparative Example 5 to Comparative Example 7 correspond to light emitting devices manufactured by using Compounds 6, 19, and 21, which are the Example Compounds, as light emitting materials and NPD as a material for a hole transport layer.

The light emitting devices were manufactured by the same method as in Example 1 to Example 6 except for using NPD instead of H-1-1 as the material for a hole transport layer, in Example 1 to Example 6.

The compounds used for the manufacture of the light emitting devices of the Examples and the Comparative Example are shown below. The materials are those which are common in the art, and commercial materials were purified by sublimation and used for the manufacture of the devices.

NPD

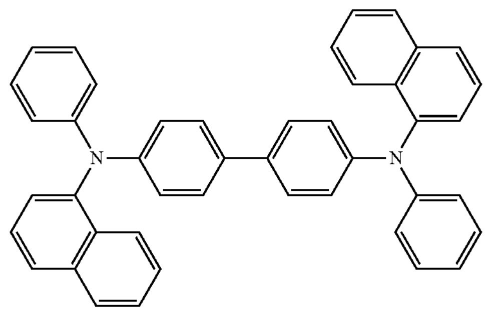

H-1-1

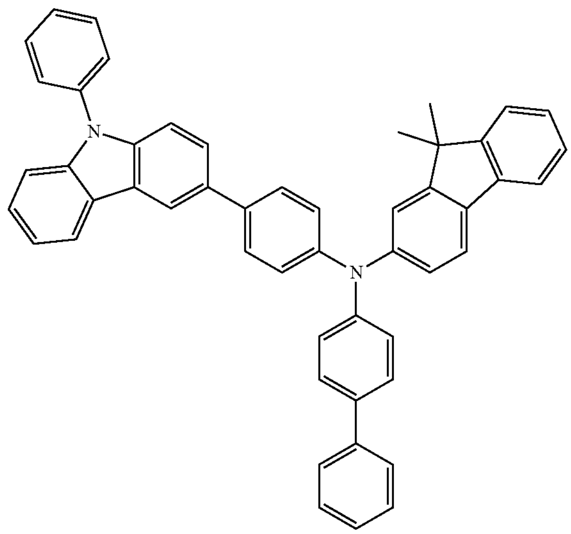

-continued

CzSi

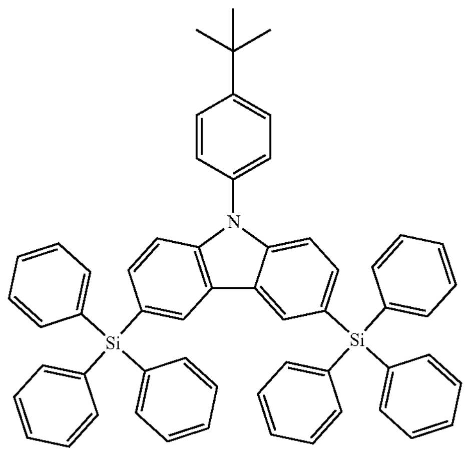

mCP

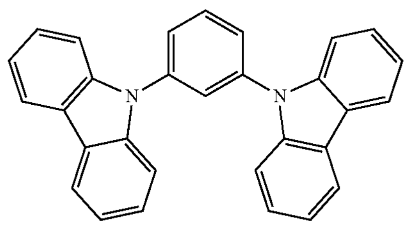

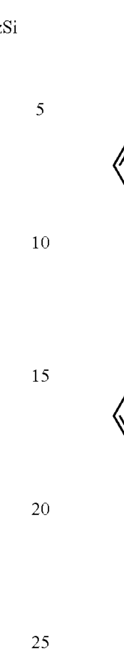

-continued

TSPO1

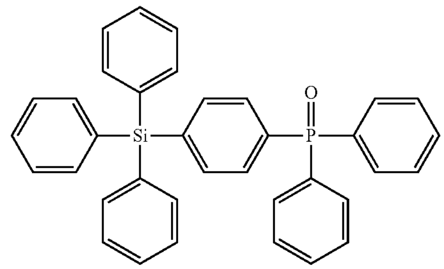

TPBi

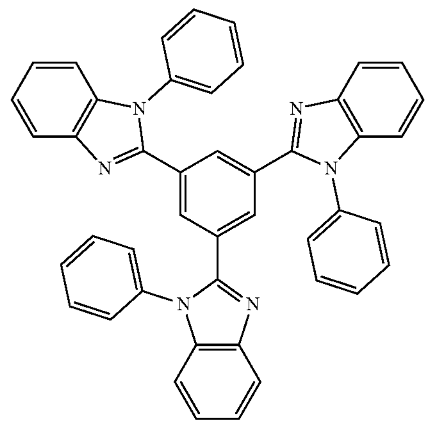

Experimental Examples

The device efficiency of the light emitting devices manufactured using Compounds 1, 6, 12, 19, 21, and 29, and Comparative Compound X-1 to Comparative Compound X-4 were evaluated. Evaluation results are shown in Table 2 below. In the device evaluation, the driving voltage at a current density of about 10 mA/$cm^2$, and device efficiency (cd/A) were measured.

TABLE 1

| | Hole transport layer material | Dopant in emission layer | Driving voltage (V) | Emission efficiency (Cd/A) | Maximum external quantum efficiency (%) | Emission color |
|---|---|---|---|---|---|---|
| Example 1 | HT-1-1 | Compound 1 | 5.0 | 20.8 | 20.4 | Blue |
| Example 2 | HT-1-1 | Compound 6 | 4.8 | 22.4 | 21.3 | Blue |
| Example 3 | HT-1-1 | Compound 12 | 5.1 | 21.2 | 20.3 | Blue |
| Example 4 | HT-1-1 | Compound 19 | 4.9 | 21.6 | 20.7 | Blue |
| Example 5 | HT-1-1 | Compound 21 | 5.0 | 21.9 | 21.0 | Blue |
| Example 6 | HT-1-1 | Compound 29 | 5.2 | 20.5 | 19.6 | Blue |
| Comparative Example 1 | HT-1-1 | Comparative Compound X-1 | 5.8 | 15.1 | 14.6 | Blue |
| Comparative Example 2 | HT-1-1 | Comparative Compound X-2 | 6.1 | 9.3 | 13.7 | Deep blue |
| Comparative Example 3 | HT-1-1 | Comparative Compound X-3 | 5.9 | 12.6 | 14.1 | Deep blue |
| Comparative Example 4 | HT-1-1 | Comparative Compound X-4 | 5.5 | 16.3 | 15.9 | Blue |
| Comparative Example 5 | NPD | Compound 6 | 5.4 | 18.1 | 16.9 | Blue |
| Comparative Example 6 | NPD | Compound 19 | 5.5 | 17.3 | 16.1 | Blue |
| Comparative Example 7 | NPD | Compound 21 | 5.3 | 18.3 | 17.0 | Blue |

Referring to the results of Table 2, it could be confirmed that the Examples of the light emitting devices using the fused polycyclic compounds according to embodiments as light emitting materials showed reduced driving voltages and improved emission efficiency while maintaining the emission wavelength of blue light when compared with the Comparative Examples. The Example Compounds have a structure including at least one julolidine group in a plate type skeleton structure with one boron atom as a center. Since the julolidine group includes a cyclized alkyl amine group, electron donating properties may be improved when compared to an aryl amine substituent. Accordingly, if introduced in the polycyclic compound according to an embodiment, multiple resonance effects may be improved, a high oscillator strength value and a small $\Delta E_{ST}$ value may be shown, and improved delayed fluorescence emission properties may be expected. Since the cyclized alkyl amine is included as an electron donor, more rigid core structure may be achieved when compared to a non-cyclized amine group having a single bond, and the chemical stability of a material itself may be improved. The rigidity in a molecule may be improved by the julolidine group, stokes shift may be reduced, and effects of increasing the wavelength of an absorption band may be achieved. Accordingly, if the polycyclic compound of an embodiment is used as a thermally activated delayed fluorescence dopant, energy transition efficiency with a host material may be improved, and emission efficiency may be increased further. The light emitting device of an embodiment includes the fused polycyclic compound of an embodiment as the dopant of a thermally activated delayed fluorescence (TADF) light emitting device, and high device efficiency particularly in a blue light wavelength region may be achieved.

Comparative Compound X-1 to Comparative Compound X-4, included in Comparative Example 1 to Comparative Example 4 included a plate type skeleton structure with one boron atom as a center, but did not include a julolidine group including a cyclized alkyl amine group in a plate type skeleton, and it could be confirmed that rigidity and electron donating properties in a molecule were reduced, and a driving voltage was high, and emission efficiency was degraded when compared to the Examples.

When comparing the results of the Examples with those of Comparative Example 2 to Comparative Example 4, in Comparative Compound X-2 to Comparative Compound X-4, it could be confirmed that emission efficiency was degraded though an aryl amine group which was an electron donor was substituted at the para position of a benzene ring to which a boron atom was bonded. It is thought that by substituting the aryl amine group instead of the cyclized alkyl amine group, molecular stability was reduced, the absorption band of a molecule was formed in a shorter wavelength region than the Example compounds, and energy transition with a host material became difficult.

In Comparative Examples 5 to 7, though the compound of an embodiment was included as a light emitting material, the monoamine compound of an embodiment was not included as a hole transport material, and it could be confirmed that a driving voltage was high, and emission efficiency was degraded when compared to the Examples.

The light emitting device of an embodiment may show improved device properties of high efficiency.

The fused polycyclic compound of an embodiment may be included in the emission layer of a light emitting device and may increase the efficiency of the light emitting device.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A light emitting device, comprising:

a first electrode;

a hole transport region disposed on the first electrode;

an emission layer disposed on the hole transport region;

an electron transport region disposed on the emission layer; and a second electrode disposed on the electron transport region, wherein the emission layer comprises a fused polycyclic compound represented by Formula 1, and the hole transport region comprises a compound represented by Formula H-a:

[Formula 1]

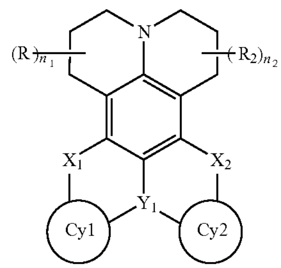

wherein in Formula 1, $X_1$ and $X_2$ are each independently $N(R_3)$, O, or S, when $X_1$ is S then $X_2$ is $N(R_3)$ and when $X_2$ is S then $X_1$ is $N(R_3)$, $Y_1$ is B, $R_1$ and $R_2$ are each independently a hydrogen atom, a deuterium atom, a halogen atom, a cyano group, a substituted or unsubstituted amine group, a substituted or unsubstituted alkyl group of 1 to 30 carbon atoms, a substituted or unsubstituted aryl group of 6 to 60 ring-forming carbon atoms, or a substituted or unsubstituted heteroaryl group of 2 to 60 ring-forming carbon atoms, $R_3$ is a hydrogen atom, a deuterium atom, a halogen atom, a substituted or unsubstituted alkyl group of 1 to 30 carbon atoms, a substituted or unsubstituted aryl group of 6 to 60 ring-forming carbon atoms, or a substituted or unsubstituted heteroaryl group of 2 to 60 ring-forming carbon atoms, or is combined with an adjacent group to form a ring, $n_1$ and $n_2$ are each independently an integer from 0 to 6, and Cy1 and Cy2 are each independently a substituted or unsubstituted aromatic hydrocarbon ring of 6 to 60 ring-forming carbon atoms, or a substituted or unsubstituted aromatic heterocycle of 2 to 60 ring-forming carbon atoms, or are combined with an adjacent group to form a ring:

[Formula H-a]

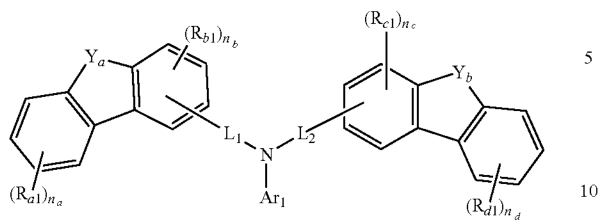

wherein in Formula H-a, $Y_a$ and $Y_b$ are each independently $C(R_{e1})(R_{f1})$, $N(R_{g1})$, O, or S, $Ar_1$ s a substituted or unsubstituted aryl group of 6 to 30 ring-forming carbon atoms, or a substituted or unsubstituted heteroaryl group of 2 to 30 ring-forming carbon atoms, $L_1$ and $L_2$ are each independently a direct linkage, a substituted or unsubstituted arylene group of 6 to 30 ring-forming carbon atoms, or a substituted or unsubstituted heteroarylene group of 2 to 30 ring-forming carbon atoms, $R_{a1}$ to $R_{g1}$ are each independently a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, $n_a$ and $n_d$ are each independently an integer from 0 to 4, and $n_b$ and $n_c$ are each independently an integer from 0 to 3.

2. The light emitting device of claim 1, wherein Cy1 and Cy2 are each independently a group represented by Formula 2 or Formula 3:

[Formula 2]

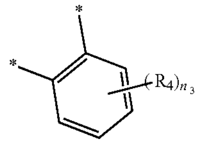

wherein in Formula 2, $R_4$ is a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or is combined with an adjacent group to form a ring, $n_3$ is an integer from 0 to 4, and —* indicates positions connected with $X_1$ and $Y_1$ of Formula 1, or indicates positions connected with $X_2$ and $Y_1$ of Formula 1, respectively,

[Formula 3]

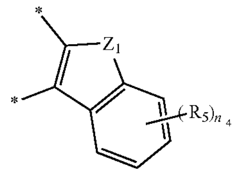

wherein in Formula 3, $Z_1$ is $N(R_6)$, O, or S, $R_5$ is a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or is combined with an adjacent group to form a ring, $R_6$ is a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, $n_4$ is an integer from 0 to 4, and —* indicate positions connected with $X_1$ and $Y_1$ of Formula 1, or indicate positions connected with $X_2$ and $Y_1$ of Formula 1, respectively.

3. The light emitting device of claim 2, wherein if Cy1 and Cy2 are each a group represented by Formula 2, then Cy1 and Cy2 are each independently a group represented by one of Formula 2-1 to Formula 2-3:

[Formula 2-1]

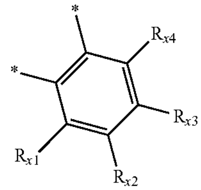

wherein in Formula 2-1, $R_{x1}$ to $R_{x4}$ are each independently a hydrogen atom, a deuterium atom, a halogen atom, a substituted or unsubstituted alkyl group of 1 to 10 carbon atoms, a substituted or unsubstituted phenyl group, a substituted or unsubstituted carbazole group, or a substituted or unsubstituted amine group, or are combined with an adjacent group to form a ring, and —* indicates positions connected with $X_1$ and $Y_1$ of Formula 1, or indicates positions connected with $X_2$ and $Y_1$ of Formula 1, respectively,

[Formula 2-2]

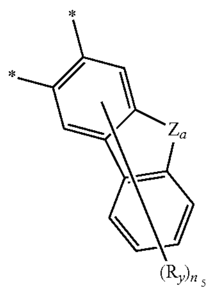

wherein in Formula 2-2, $Z_a$ is $C(R_7)(R_8)$, $N(R_9)$, O, or S, $R_y$, $R_7$, and $R_8$ are each independently a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, $R_9$ is a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, $n_5$ is an integer from 0 to 6, and —* indicates positions connected with $X_1$ and $Y_1$ of Formula 1, or indicates positions connected with $X_2$ and $Y_1$ of Formula 1, respectively,

[Formula 2-3]

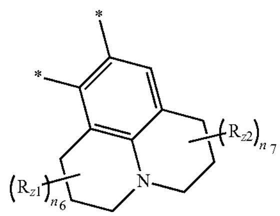

wherein in Formula 2-3, $R_{z1}$ and $R_{z2}$ are each independently a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, $n_6$ and $n_7$ are each independently an integer from 0 to 6, and —* indicates positions connected with $X_1$ and $Y_1$ of Formula 1, or indicates positions connected with $X_2$ and $Y_1$ of Formula 1, respectively.

4. The light emitting device of claim 1, wherein the emission layer emits delayed fluorescence.

5. The light emitting device of claim 1, wherein the emission layer is a delayed fluorescence emission layer comprising a host and a dopant, and the dopant comprises the fused polycyclic compound.

6. The light emitting device of claim 5, wherein the host comprises a compound represented by Formula E-2a or Formula E-2b:

[Formula E-2a]

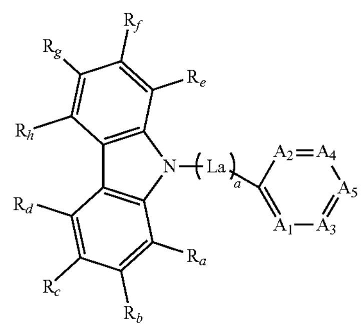

[Formula E-2b]

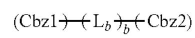

wherein in Formula E-2a, a is an integer from 0 to 10, $L_a$ is a direct linkage, a substituted or unsubstituted arylene group of 6 to 30 ring-forming carbon atoms, or a substituted or unsubstituted heteroarylene group of 2 to 30 ring-forming carbon atoms, $A_1$ to $A_5$ are each independently N or $C(R_i)$, $R_a$ to $R_i$ are each independently a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, two or three of $A_1$ to $A_5$ are N, and the remainder of $A_1$ to $A_5$ are $C(R_i)$, and wherein in Formula E-2b, Cbz1 and Cbz2 are each independently an unsubstituted carbazole group, or a carbazole group substituted with an aryl group of 6 to 30 ring-forming carbon atoms, $L_b$ is a direct linkage, a substituted or unsubstituted arylene group of 6 to 30 ring-forming carbon atoms, or a substituted or unsubstituted heteroarylene group of 2 to 30 ring-forming carbon atoms, and b is an integer from 0 to 10.

7. The light emitting device of claim 1, wherein the emission layer emits light having a central wavelength in a range of about 430 nm to about 490 nm.

8. The light emitting device of claim 1, wherein the fused polycyclic compound represented by Formula 1 is represented by one of Formula 4-1 to Formula 4-3:

[Formula 4-1]

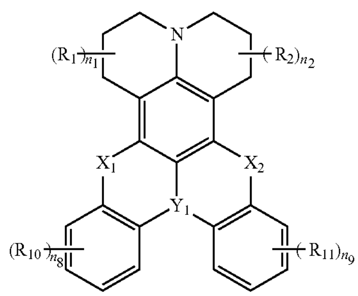

[Formula 4-2]

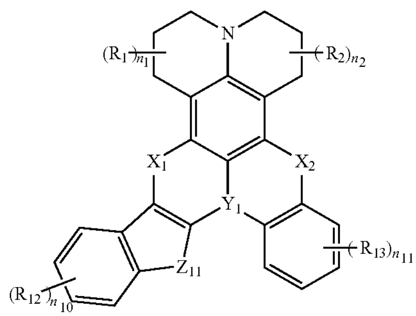

[Formula 4-3]

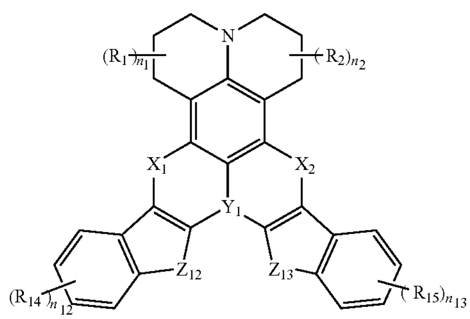

wherein in Formula 4-1 to Formula 4-3, $Z_{11}$ to $Z_{13}$ are each independently $N(R_{16})$, O, or S, $R_{10}$ to $R_{15}$ are each independently a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, $R_{16}$ is a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, $n_8$ to $n_{13}$ are each independently an integer from 0 to 4, and $X_1$, $X_2$, $Y_1$, $R_1$, $R_2$, $n_1$, and $n_2$ are the same as defined in Formula 1.

9. The light emitting device of claim 1, wherein the fused polycyclic compound represented by Formula 1 is represented by one of Formula 5-1 to Formula 5-3:

[Formula 5-1]

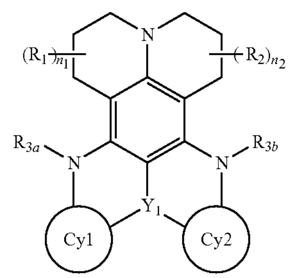

[Formula 5-2]

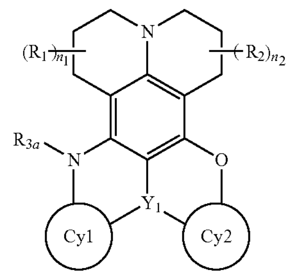

[Formula 5-3]

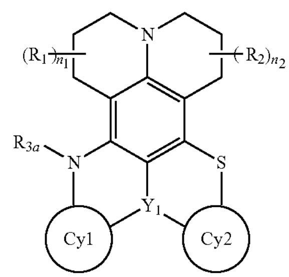

wherein in Formula 5-1 to Formula 5-3, $R_{3a}$ and $R_{3b}$ are each independently a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, and Cy1, Cy2, $Y_1$, $R_1$, $R_2$, $n_1$, and $n_2$ are the same as defined in Formula 1.

10. The light emitting device of claim 1, wherein the fused polycyclic compound represented by Formula 1 is represented by one of Formula 6-1 to Formula 6-3:

[Formula 6-1]

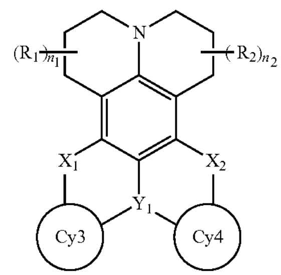

-continued

[Formula 6-2]

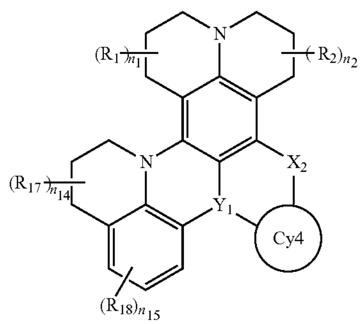

[Formula 6-3]

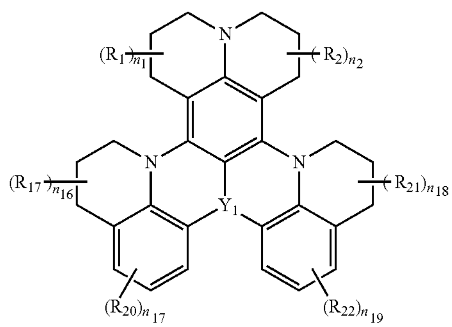

wherein in Formula 6-1 to Formula 6-3,

Cy3 and Cy4 are each independently a substituted or unsubstituted aromatic hydrocarbon ring of 6 to 30 ring-forming carbon atoms, or a substituted or unsubstituted aromatic heterocycle of 2 to 30 ring-forming carbon atoms, $R_{17}$ to $R_{22}$ are each independently a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, $n_{14}$, $n_{16}$, and $n_{18}$ are each independently an integer from 0 to 6, $n_{15}$, $n_{17}$, and $n_{19}$ are each independently an integer from 0 to 3, and $X_1$, $X_2$, $Y_1$, $R_1$, $R_2$, $n_1$, and $n_2$ are the same as defined in Formula 1.

11. The light emitting device of claim 1, wherein in Formula 1, if $X_1$ and $X_2$ are each $N(R_3)$, then $R_3$ is a substituted or unsubstituted alkyl group of 1 to 10 carbon atoms, a substituted or unsubstituted phenyl group, a substituted or unsubstituted biphenyl group, a substituted or unsubstituted terphenyl group, a substituted or unsubstituted fluorenyl group, a substituted or unsubstituted naphthyl group, or a substituted or unsubstituted tetrahydronaphthyl group.

12. The light emitting device of claim 1, wherein the fused polycyclic compound comprises at least one selected from Compound Group 1:

[Compound Group 1]

1

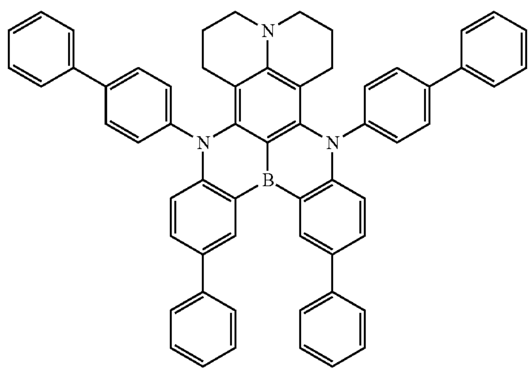

2

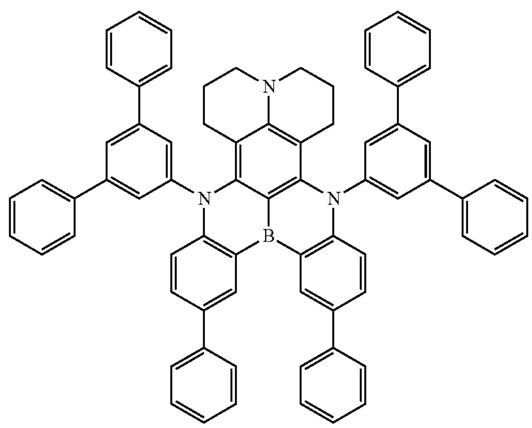

3

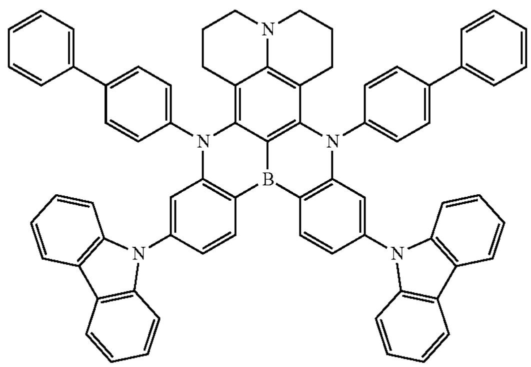

4

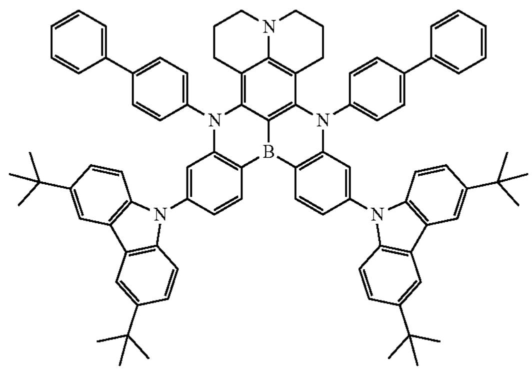

-continued
5
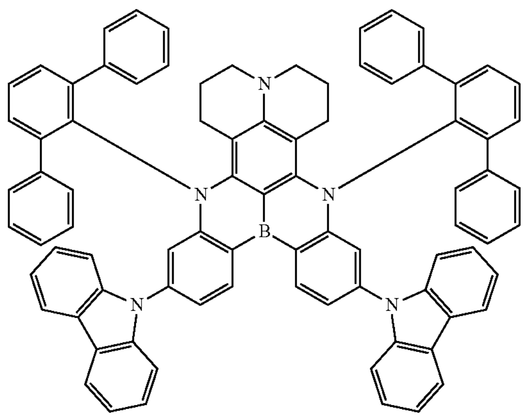
6
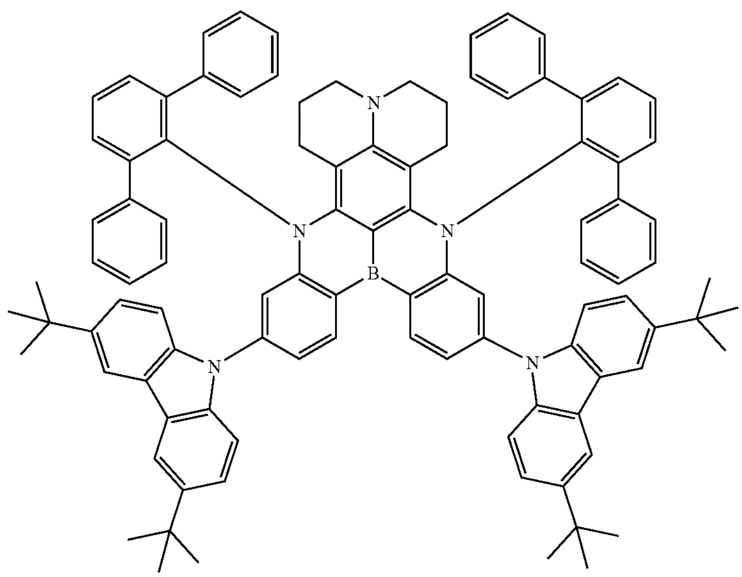
7
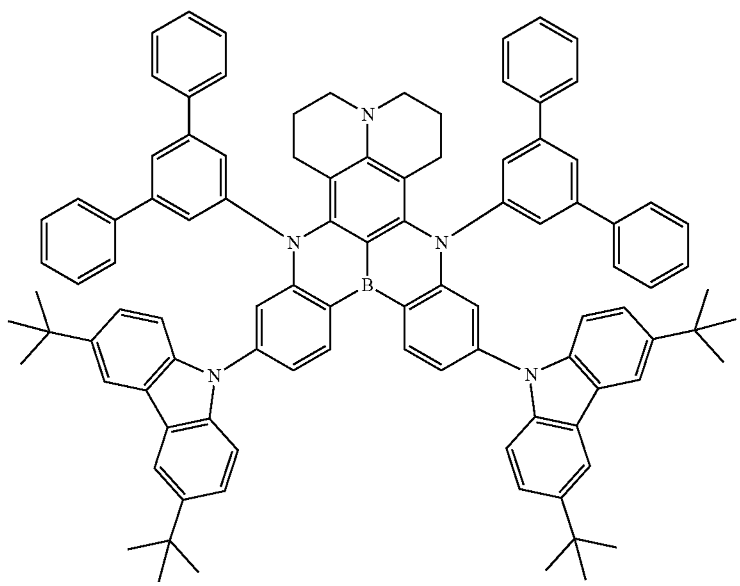

-continued
8
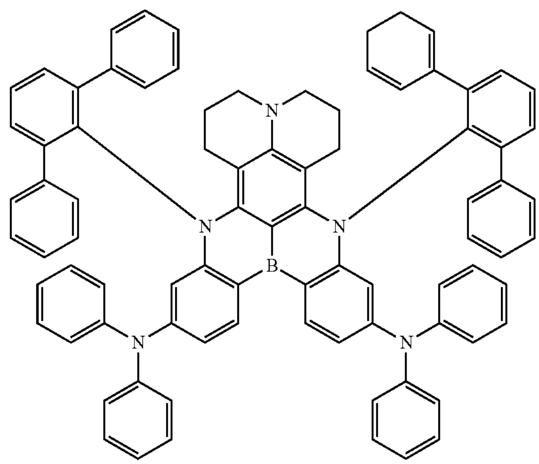
9
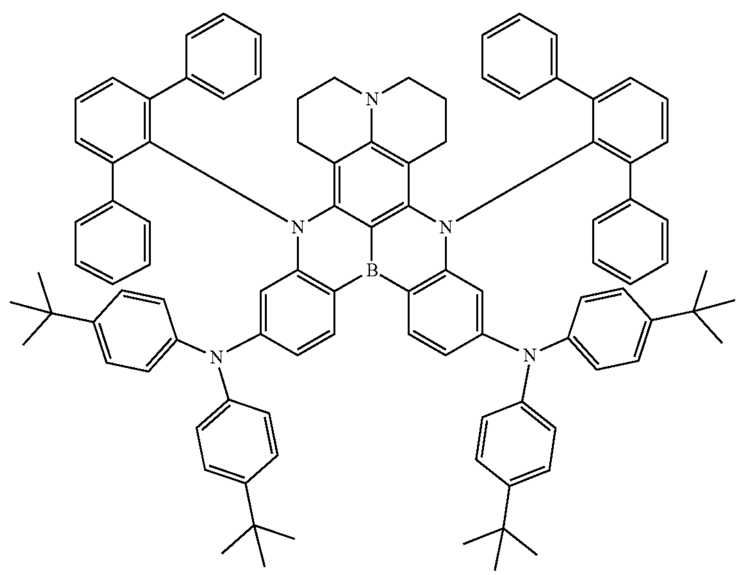
10
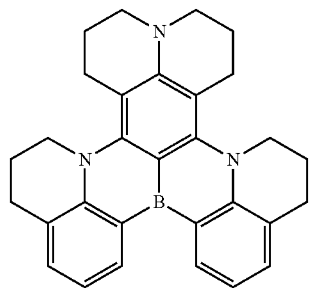
11
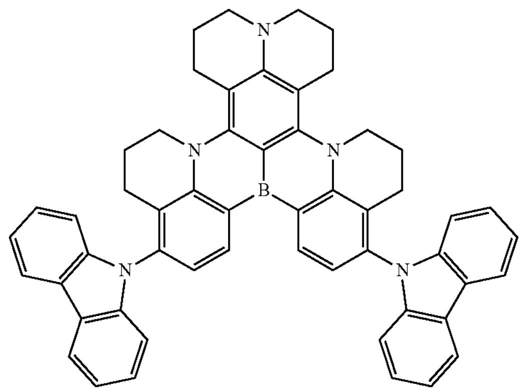

-continued
12
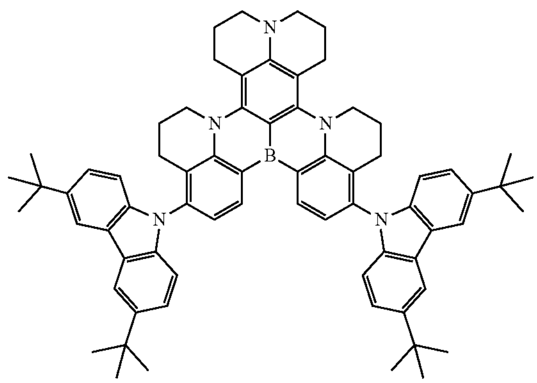
13
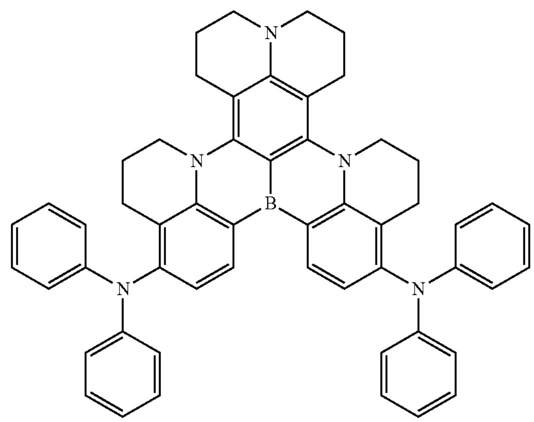
14
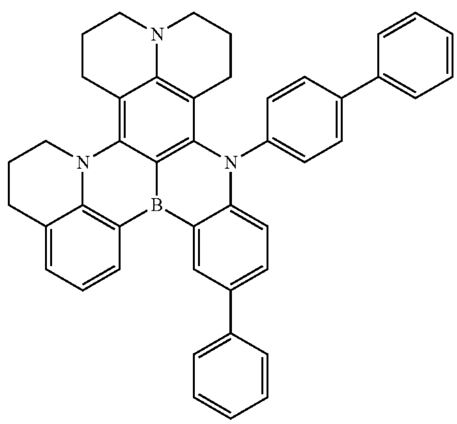
15
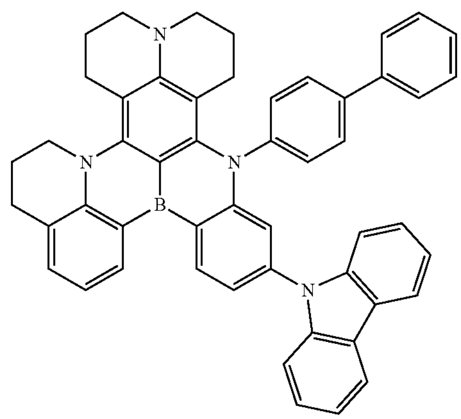
16
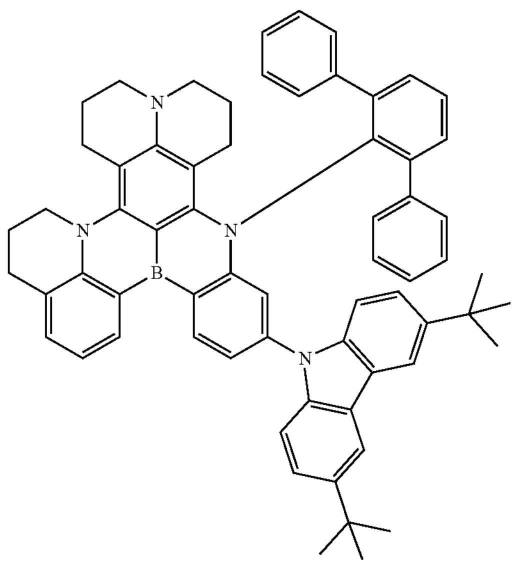
17
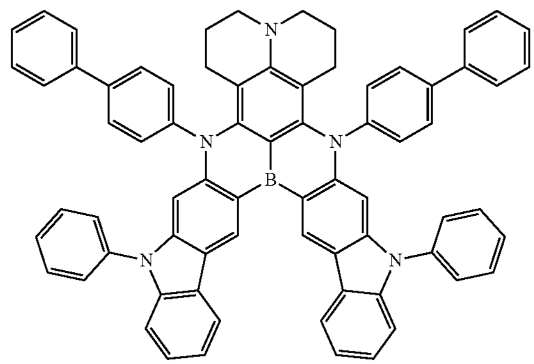

-continued
18
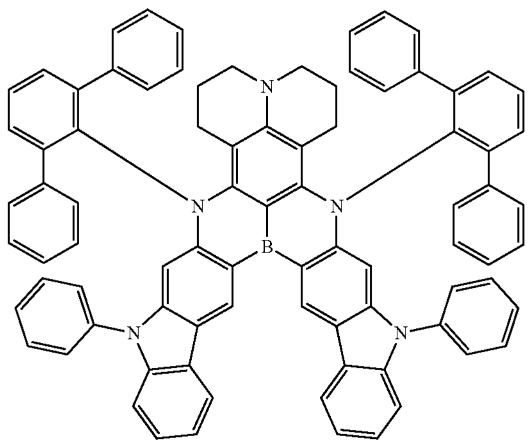
19
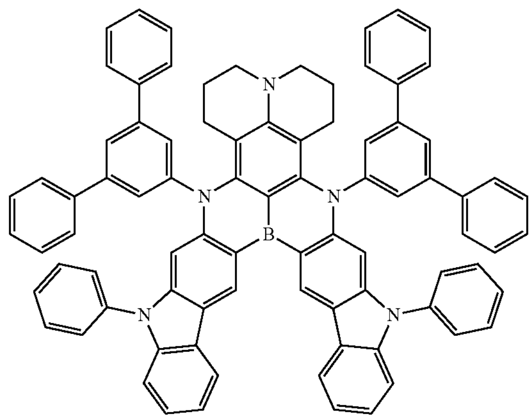
20
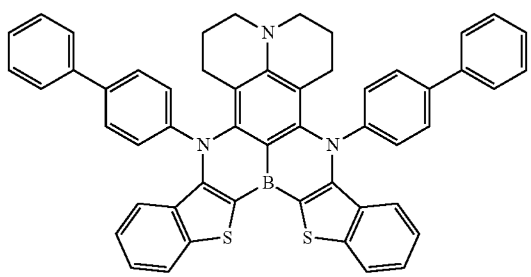
21
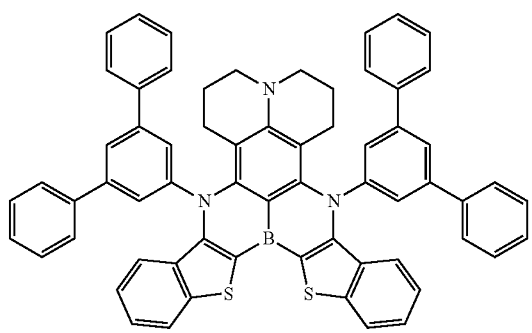
22
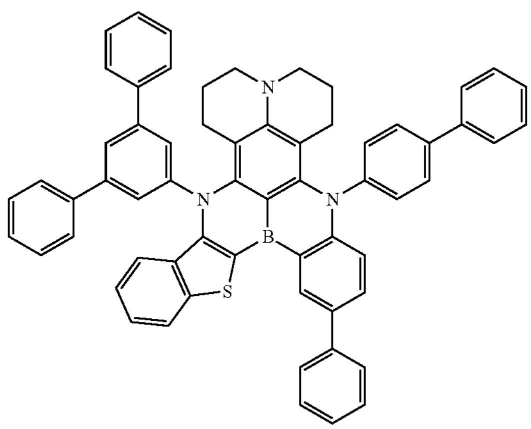
23
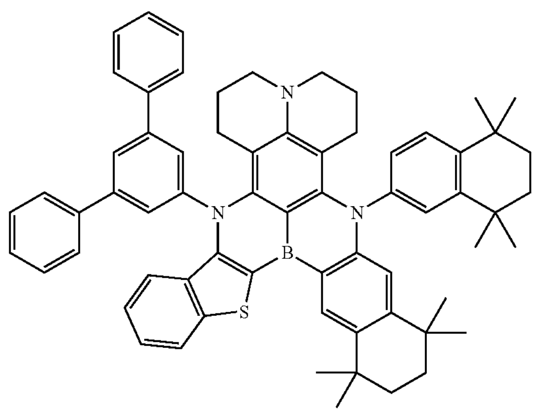
24
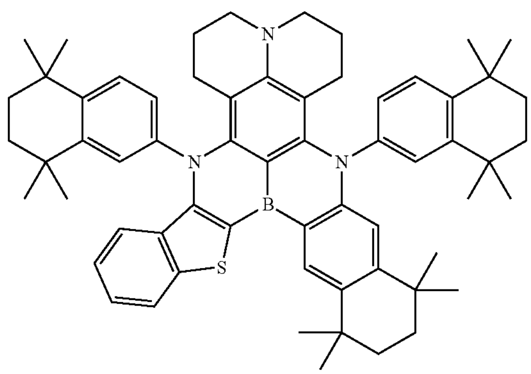

-continued
25
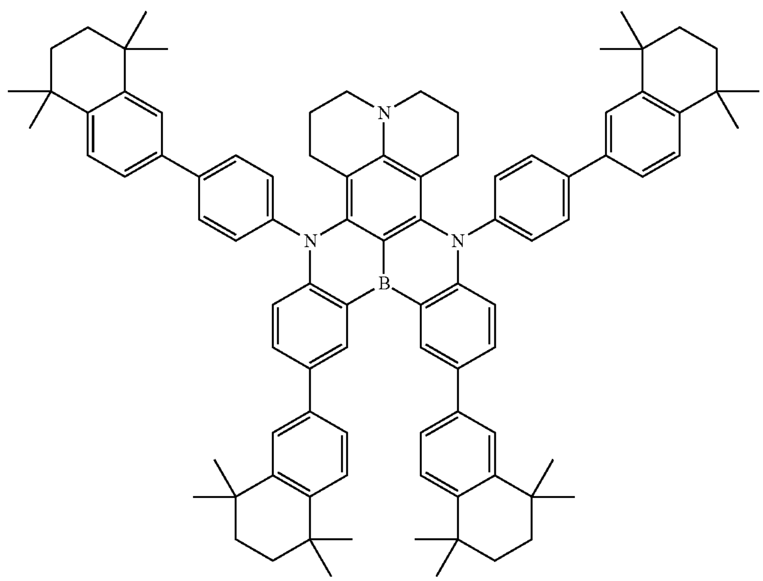
26
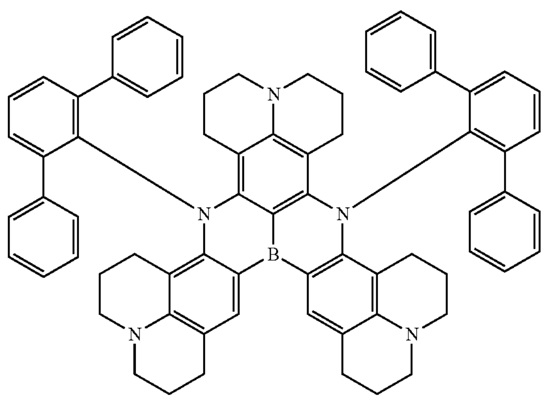
27
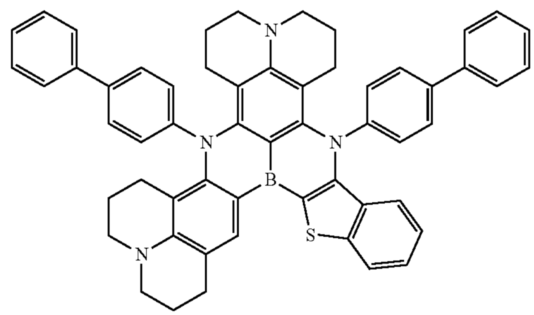
28
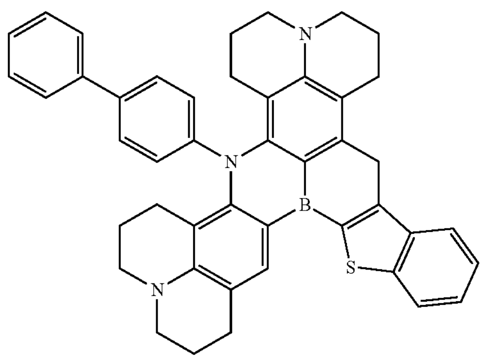
29
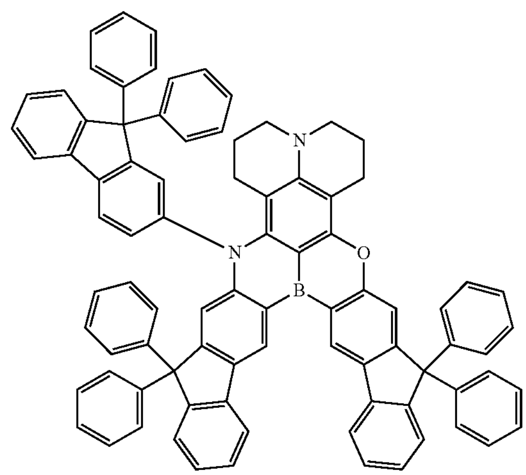
.

13. A light emitting device, comprising:

a first electrode;

a second electrode facing the first electrode; and an emission layer disposed between the first electrode and the second electrode, wherein the emission layer comprises a host and a delayed fluorescence dopant, the host comprises a compound represented by Formula E-2a or Formula E-2b, and the delayed fluorescence dopant comprises a fused polycyclic compound represented by Formula 1:

[Formula 1]

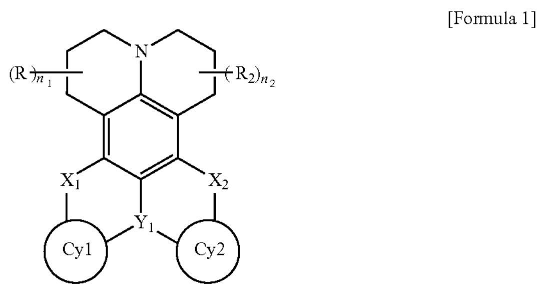

wherein in Formula 1, $X_1$ and $X_2$ are each independently $N(R_3)$, O, or S, when $X_1$ is S then $X_2$ is $N(R_3)$ and when $X_2$ is S then $X_1$ is $N(R_3)$, $Y_1$ is B, $R_1$ and $R_2$ are each independently a hydrogen atom, a deuterium atom, a halogen atom, a cyano group, a substituted or unsubstituted amine group, a substituted or unsubstituted alkyl group of 1 to 30 carbon atoms, a substituted or unsubstituted aryl group of 6 to 60 ring-forming carbon atoms, or a substituted or unsubstituted heteroaryl group of 2 to 60 ring-forming carbon atoms, $R_3$ is a hydrogen atom, a deuterium atom, a halogen atom, a substituted or unsubstituted alkyl group of 1 to 30 carbon atoms, a substituted or unsubstituted aryl group of 6 to 60 ring-forming carbon atoms, or a substituted or unsubstituted heteroaryl group of 2 to 60 ring-forming carbon atoms, or is combined with an adjacent group to form a ring, $n_1$ and $n_2$ are each independently an integer from 0 to 6, and Cy1 and Cy2 are each independently a substituted or unsubstituted aromatic hydrocarbon ring of 6 to 60 ring-forming carbon atoms, or a substituted or unsubstituted aromatic heterocycle of 2 to 60 ring-forming carbon atoms, or are combined with an adjacent group to form a ring:

[Formula E-2a]

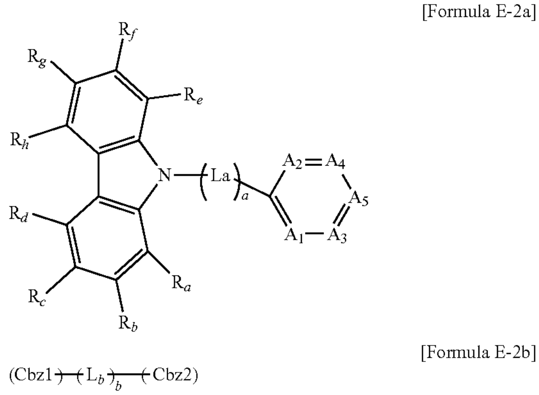

[Formula E-2b]

$(Cbz1)-(L_b)_b-(Cbz2)$ wherein in Formula E-2a, a is an integer from 0 to 10, $L_a$ is a direct linkage, a substituted or unsubstituted arylene group of 6 to 30 ring-forming carbon atoms, or a substituted or unsubstituted heteroarylene group of 2 to 30 ring-forming carbon atoms, $A_1$ to $A_5$ are each independently N or $C(R_i)$, $R_a$ to $R_i$ are each independently a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, and two or three of $A_1$ to $A_5$ are N, and the remainder of $A_1$ to $A_5$ are $C(R_i)$, and wherein in Formula E-2b, Cbz1 and Cbz2 are each independently an unsubstituted carbazole group, or a carbazole group substituted with an aryl group of 6 to 30 ring-forming carbon atoms, $L_b$ is a direct linkage, a substituted or unsubstituted arylene group of 6 to 30 ring-forming carbon atoms, or a substituted or unsubstituted heteroarylene group of 2 to 30 ring-forming carbon atoms, and b is an integer from 0 to 10.

14. The light emitting device of claim 13, further comprising a hole transport region disposed between the first electrode and the emission layer, wherein the hole transport region comprises a compound represented by Formula H-a:

[Formula H-a]

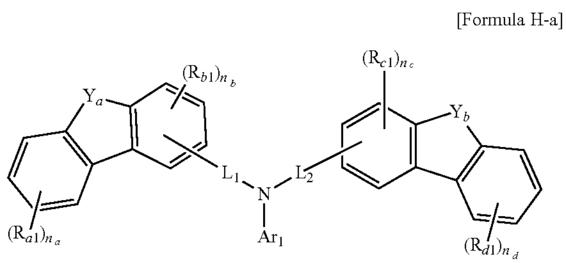

wherein in Formula H-a, $Y_a$ and $Y_b$ are each independently $C(R_{e1})(R_{f1})$, $N(R_{g1})$, O, or S, $Ar_1$ is a substituted or unsubstituted aryl group of 6 to 30 ring-forming carbon atoms, or a substituted or unsubstituted heteroaryl group of 2 to 30 ring-forming carbon atoms, $L_1$ and $L_2$ are each independently a direct linkage, a substituted or unsubstituted arylene group of 6 to 30 ring-forming carbon atoms, or a substituted or unsubstituted heteroarylene group of 2 to 30 ring-forming carbon atoms, $R_{a1}$ to $R_{g1}$ are each independently a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, $n_a$ and $n_d$ are each independently an integer from 0 to 4, and $n_b$ and $n_c$ are each independently an integer from 0 to 3.

15. The light emitting device of claim 13, wherein Cy1 and Cy2 are each independently a group represented by Formula 2 or Formula 3:

[Formula 2]

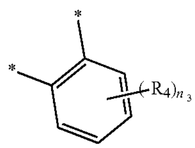

wherein in Formula 2, $R_4$ is a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or is combined with an adjacent group to form a ring, $n_3$ is an integer from 0 to 4, and ——* indicates positions connected with $X_1$ and $Y_1$ of Formula 1, or indicates positions connected with $X_2$ and $Y_1$ of Formula 1, respectively,

[Formula 3]

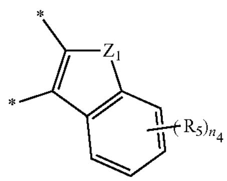

wherein in Formula 3, $Z_1$ is $N(R_6)$, O, or S, $R_5$ is a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or is combined with an adjacent group to form a ring, $R_6$ is a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, $n_4$ is an integer from 0 to 4, and ——* indicates positions connected with $X_1$ and $Y_1$ of Formula 1, or indicates positions connected with $X_2$ and $Y_1$ of Formula 1, respectively.

16. The light emitting device of claim 15, wherein in Formula 1, if Cy1 and Cy2 are each a group represented by Formula 2, then Cy1 and Cy2 are each independently a group represented by one of Formula 2-1 to Formula 2-3:

[Formula 2-1]

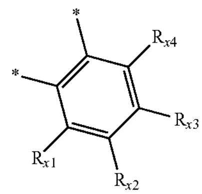

wherein in Formula 2-1, $R_{x1}$ to $R_{x4}$ are each independently a hydrogen atom, a deuterium atom, a halogen atom, a substituted or unsubstituted alkyl group of 1 to 10 carbon atoms, a substituted or unsubstituted phenyl group, a substituted or unsubstituted carbazole group, or a substituted or unsubstituted amine group, or are combined with an adjacent group to form a ring, and ——* indicates positions connected with $X_1$ and $Y_1$ of Formula 1, or indicates positions connected with $X_2$ and $Y_1$ of Formula 1, respectively,

[Formula 2-2]

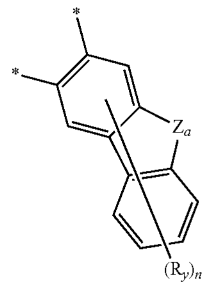

wherein in Formula 2-2, $Z_a$ is $C(R_7)$ $(R_8)$, $N(R_9)$, O, or S, $R_y$, $R_7$, and $R_8$ are each independently a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, $R_9$ is a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, $n_5$ is an integer from 0 to 6, and ——* indicates positions connected with $X_1$ and $Y_1$ of Formula 1, or indicates positions connected with $X_2$ and $Y_1$ of Formula 1, respectively,

[Formula 2-3]

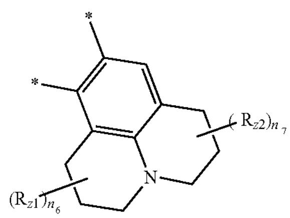

wherein in Formula 2-3, $R_{z1}$ and $R_{z2}$ are each independently a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, $n_6$ and $n_7$ are each independently an integer from 0 to 6, and ——* indicates positions connected with $X_1$ and $Y_1$ of Formula 1, or indicates positions connected with $X_2$ and $Y_1$ of Formula 1, respectively.

17. The light emitting device of claim 13, wherein the fused polycyclic compound represented by Formula 1 is represented by one of Formula 4-1 to Formula 4-3:

[Formula 4-1]

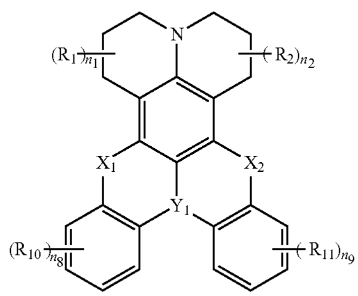

[Formula 4-2]

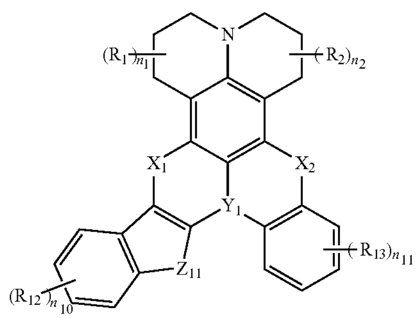

-continued

[Formula 4-3]

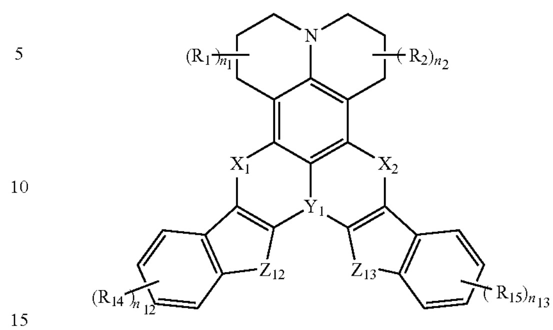

wherein in Formula 4-1 to Formula 4-3, $Z_{11}$ to $Z_{13}$ are each independently $N(R_{16})$, O, or S, $R_{10}$ to $R_{15}$ are each independently a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, $R_{16}$ is a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, $n_8$ to $n_{13}$ are each independently an integer from 0 to 4, and $X_1$, $X_2$, $Y_1$, $R_1$, $R_2$, $n_1$, and $n_2$ are the same as defined in Formula 1.

18. The light emitting device of claim 13, wherein the fused polycyclic compound represented by Formula 1 is represented by one of Formula 5-1 to Formula 5-3:

[Formula 5-1]

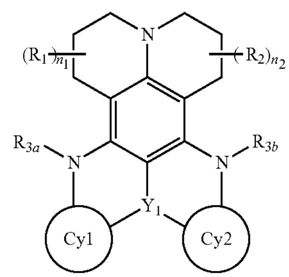

-continued

[Formula 5-2]

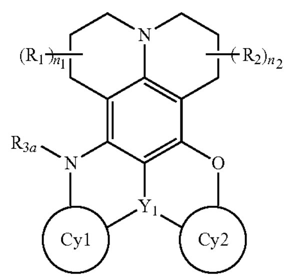

[Formula 5-3]

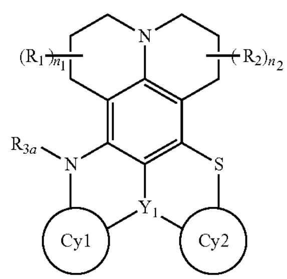

wherein in Formula 5-1 to Formula 5-3, $R_{3a}$ and $R_{3b}$ are each independently a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, and Cy1, Cy2, $Y_1$, $R_1$, $R_2$, $n_1$, and $n_2$ are the same as defined in Formula 1.

19. The light emitting device of claim 13, wherein the fused polycyclic compound represented by Formula 1 is represented by one of Formula 6-1 to Formula 6-3:

[Formula 6-1]

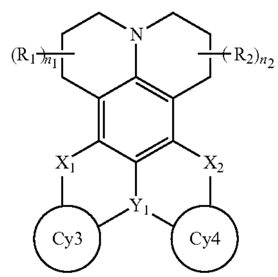

-continued

[Formula 6-2]

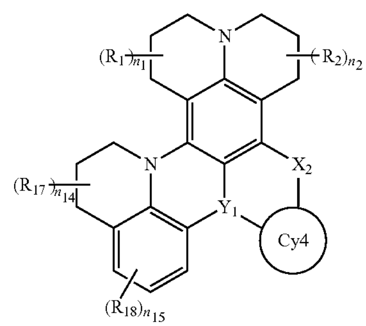

[Formula 6-3]

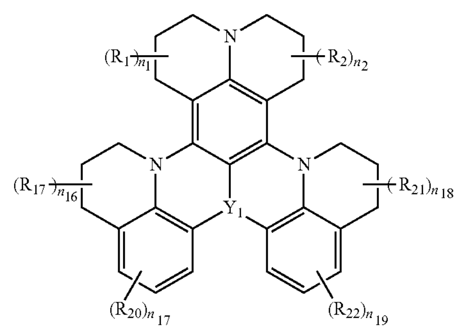

wherein in Formula 6-1 to Formula 6-3,

Cy3 and Cy4 are each independently a substituted or unsubstituted aromatic hydrocarbon ring of 6 to 30 ring-forming carbon atoms, or a substituted or unsubstituted aromatic heterocycle of 2 to 30 ring-forming carbon atoms, $R_{17}$ to $R_{22}$ are each independently a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, $n_{14}$, $n_{16}$, and $n_{18}$ are each independently an integer from 0 to 6, $n_{15}$, $n_{17}$, and $n_{19}$ are each independently an integer from 0 to 3, and $X_1$, $X_2$, $Y_1$, $R_1$, $R_2$, $n_1$, and $n_2$ are the same as defined in Formula 1.

20. The light emitting device of claim 13, wherein the fused polycyclic compound comprises at least one selected from Compound Group 1:

[Compound Group 1]
1
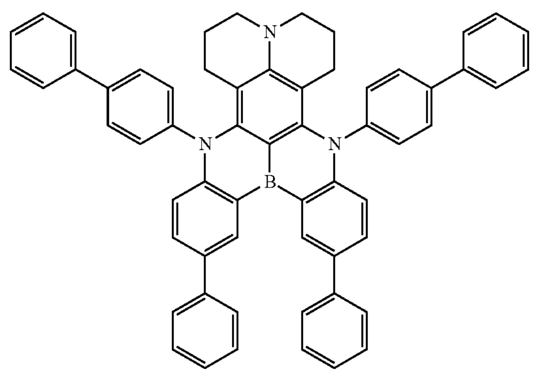
2
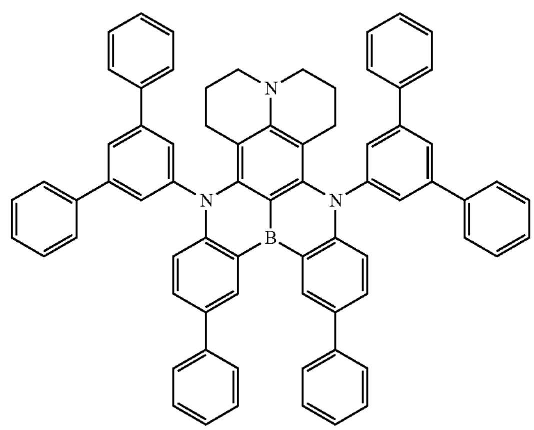
3
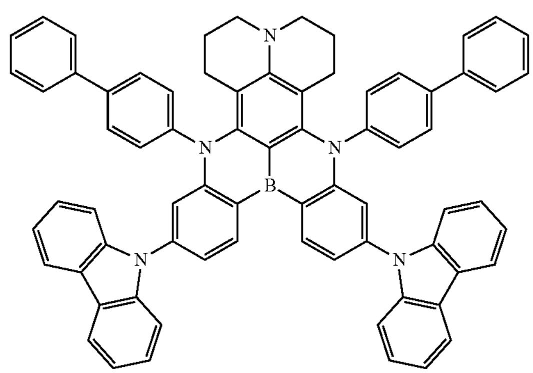
4
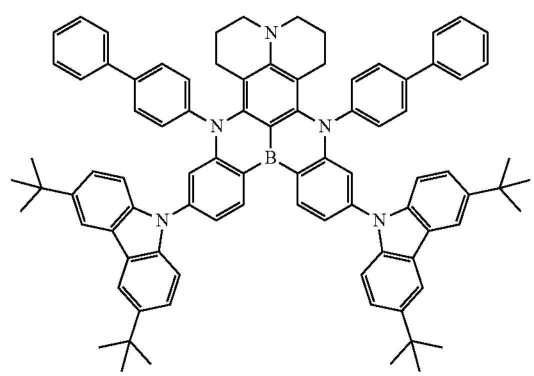
5
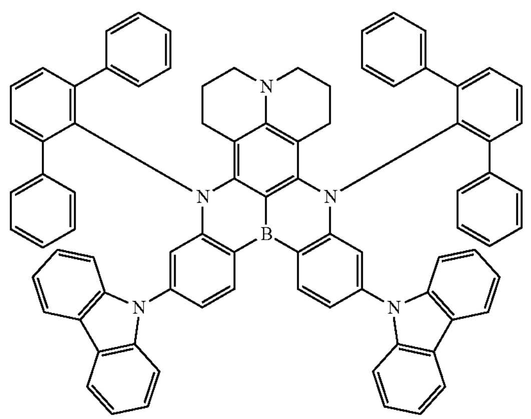

-continued
6
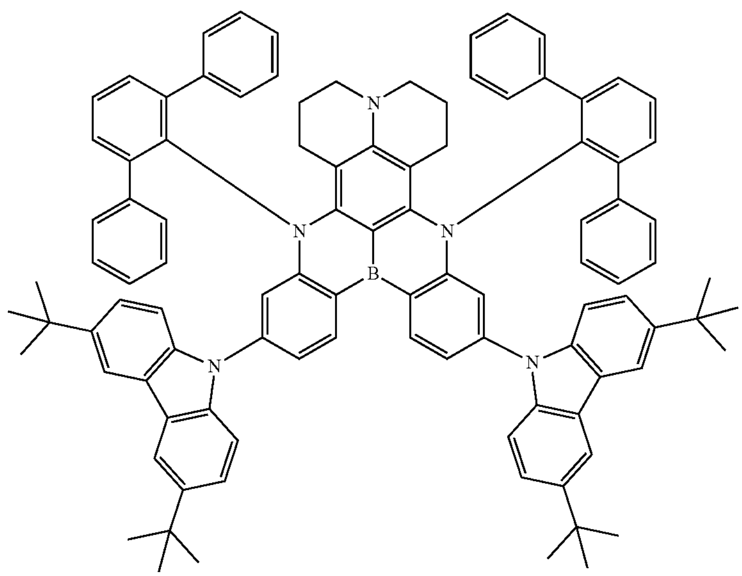
7
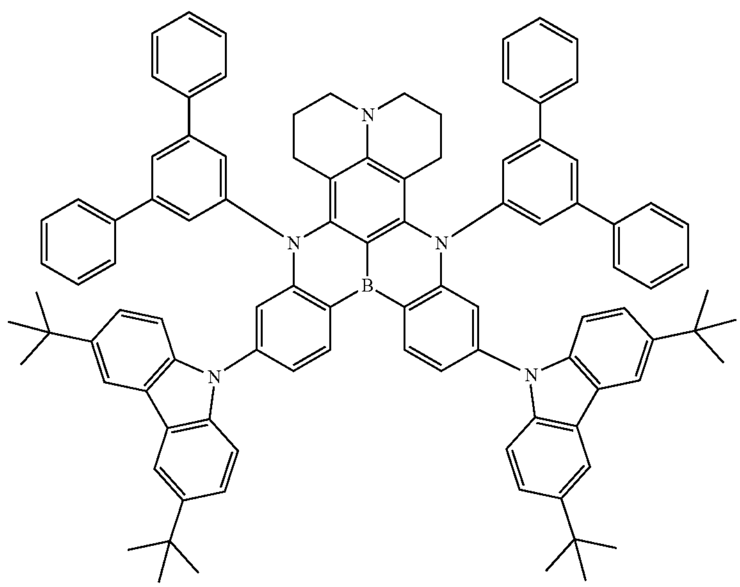
8
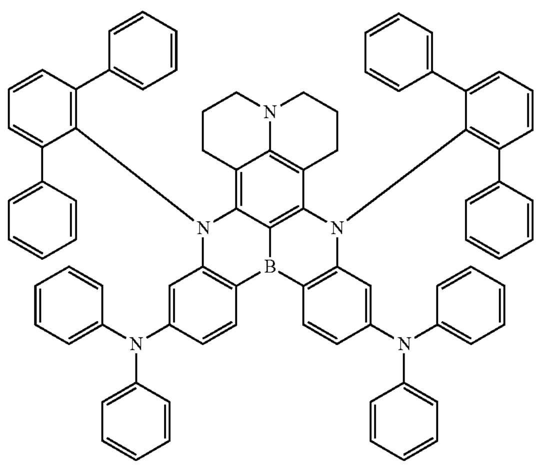

-continued
9
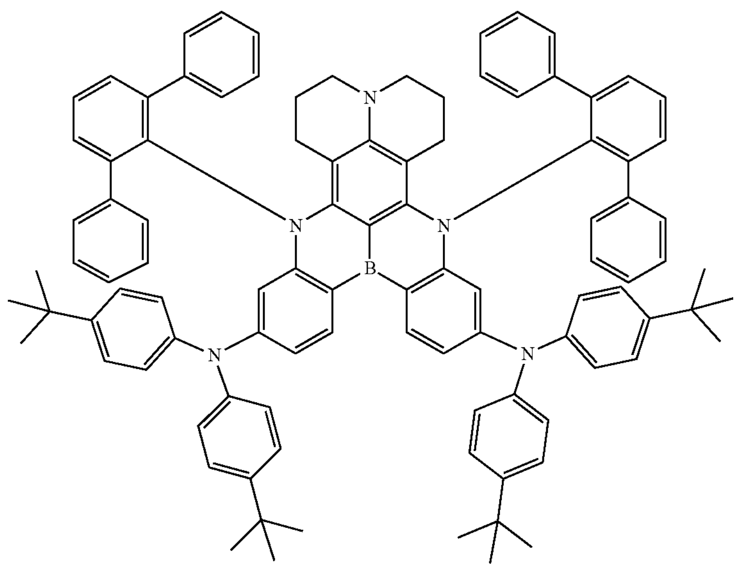
10
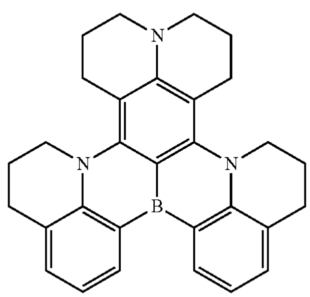
11
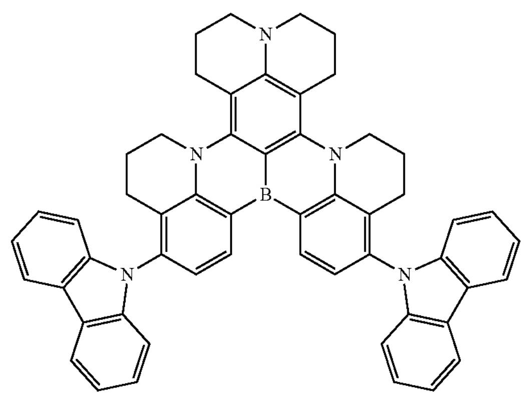
12
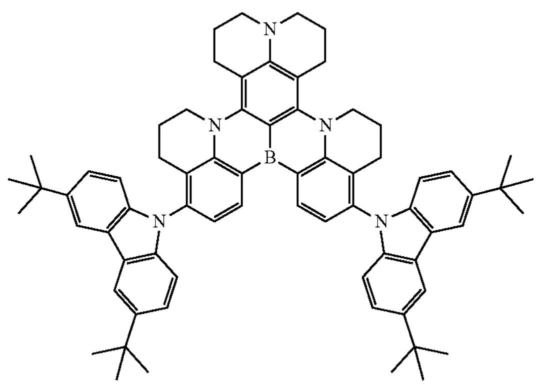
13
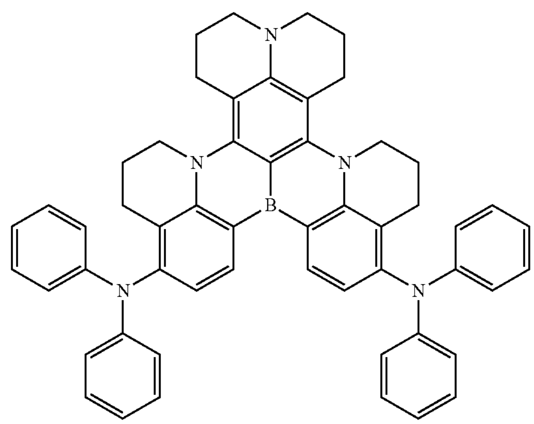

-continued
14
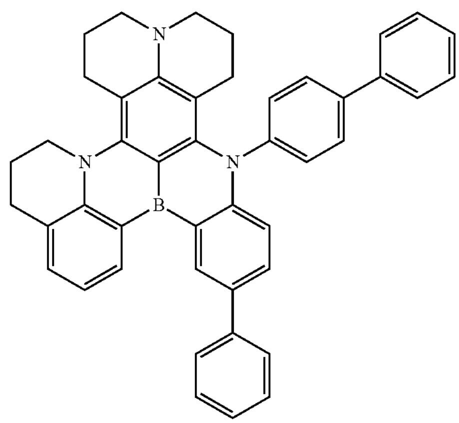
15
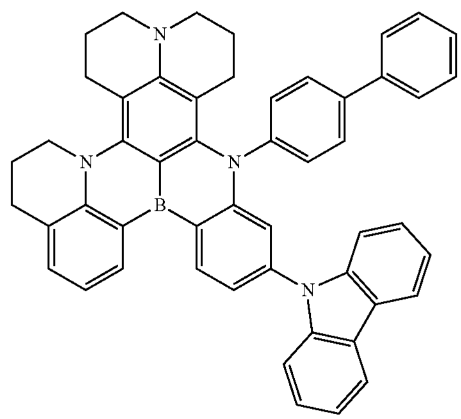
16
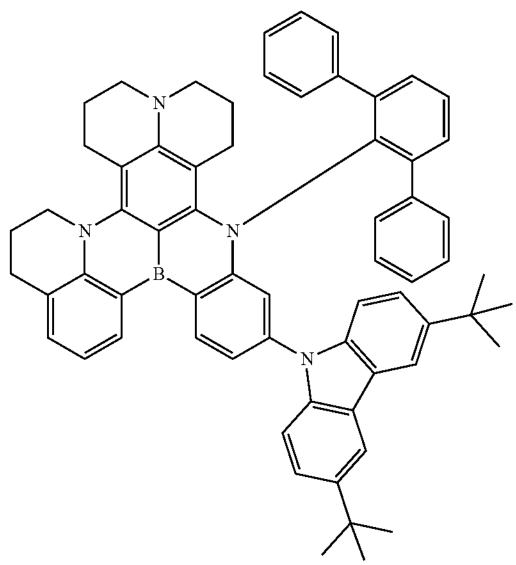
17
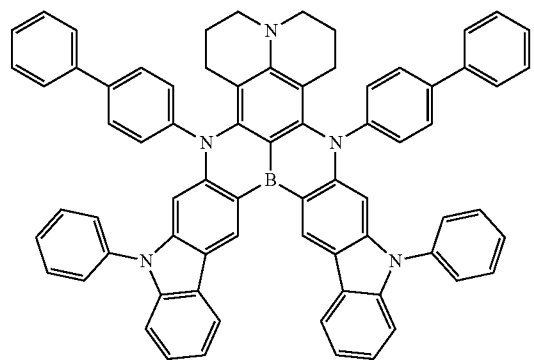
18
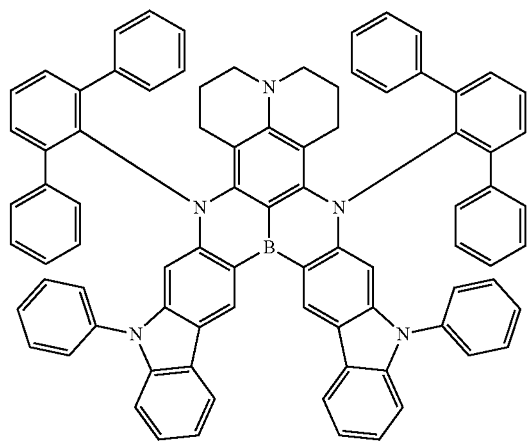
19
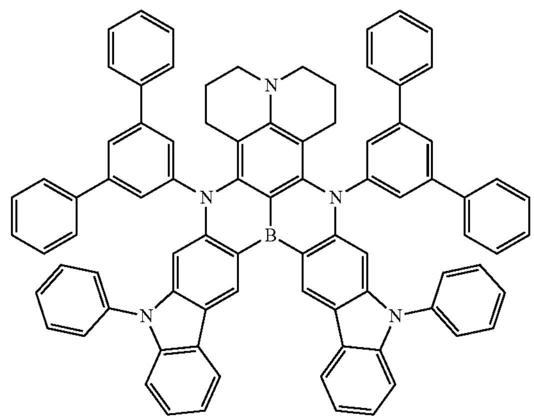

-continued
20
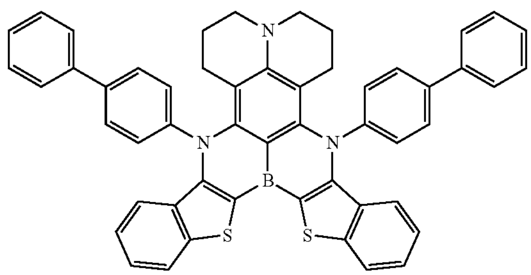
21
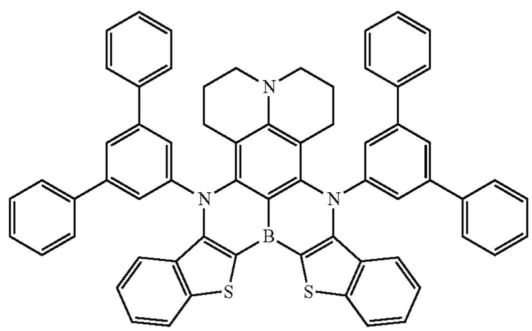
22
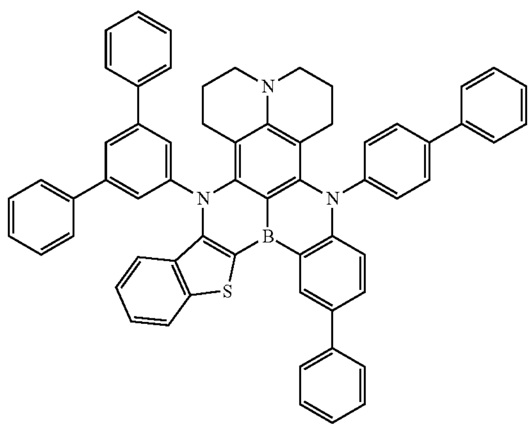
23
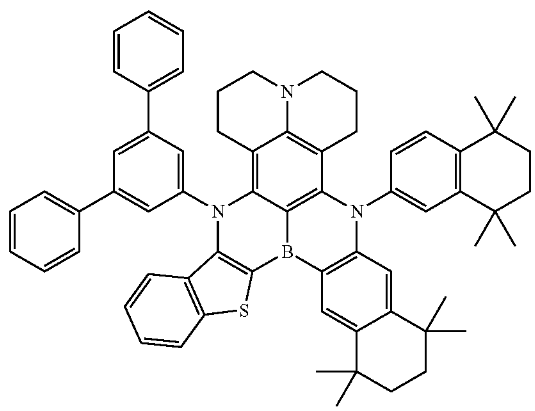
24
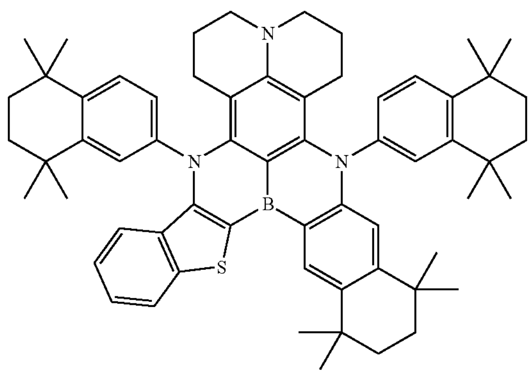

-continued
25
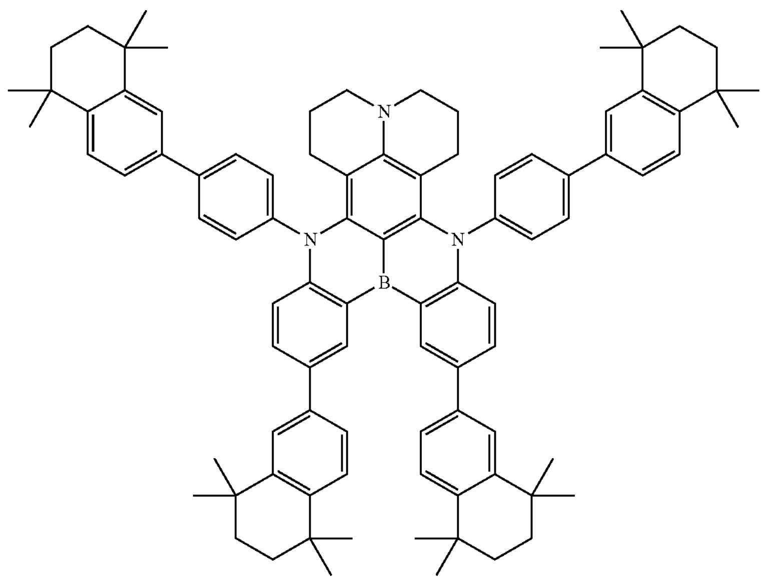
26
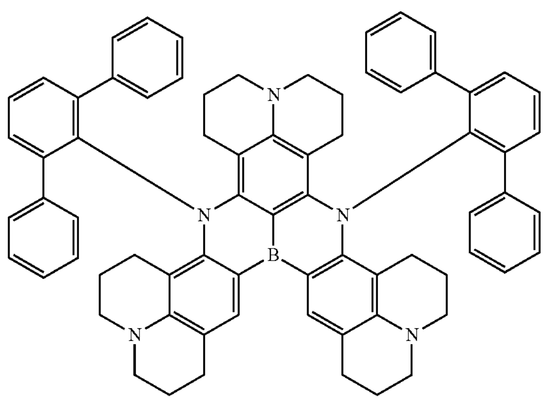
27
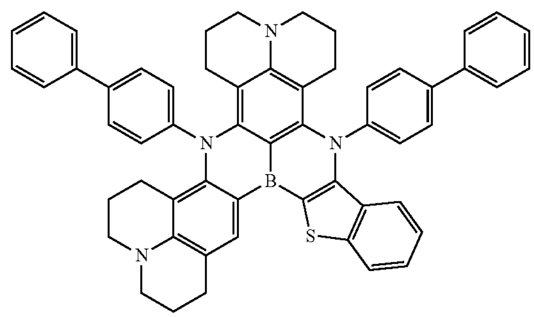
28
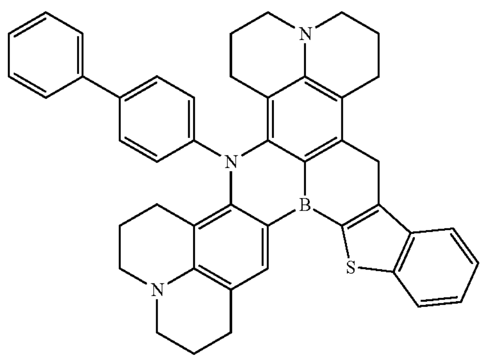
29
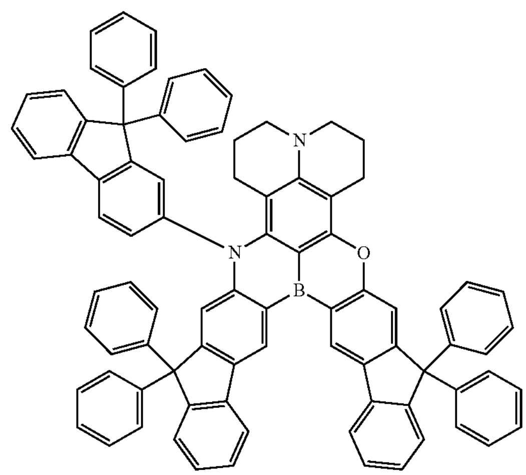

21. A display apparatus comprising a display panel, the display panel comprising at least one light emitting device, the light emitting device, comprising:

a first electrode;

a second electrode facing the first electrode; and an emission layer disposed between the first electrode and the second electrode, the emission layer comprising a fused polycyclic compound, the fused polycyclic compound comprising at least one selected from Compound Group 1:

[Compound Group 1]

1

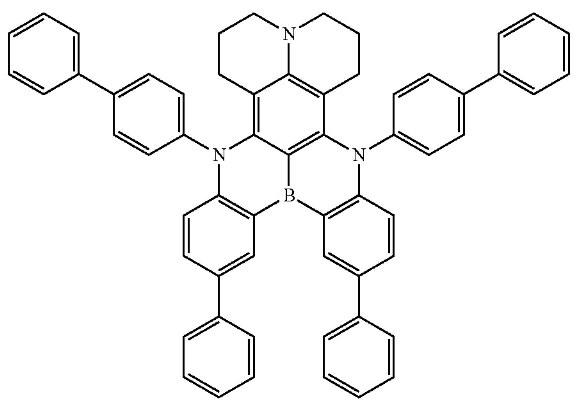

2

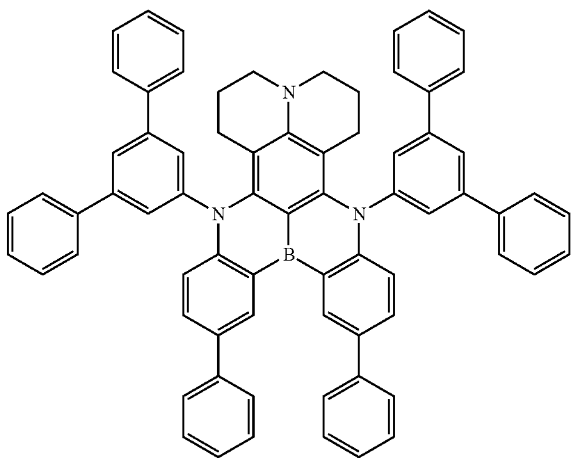

3

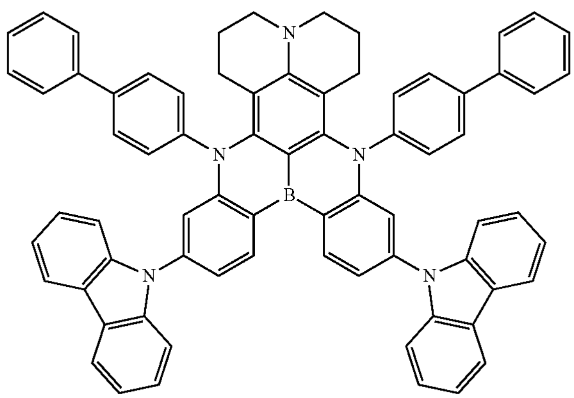

-continued

4

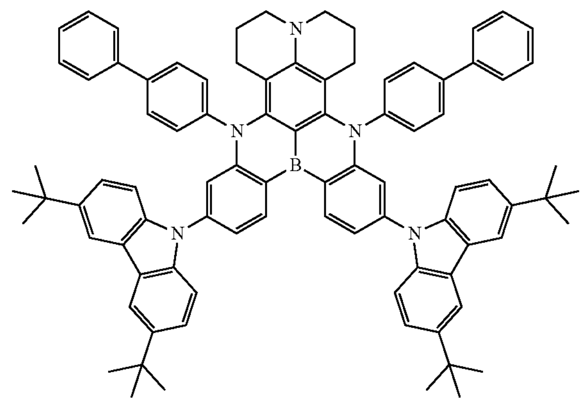

5

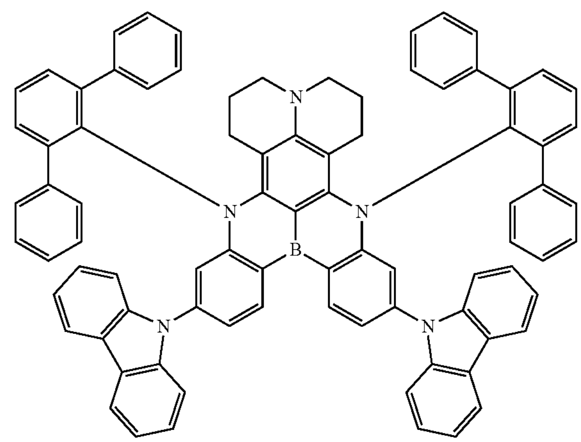

6

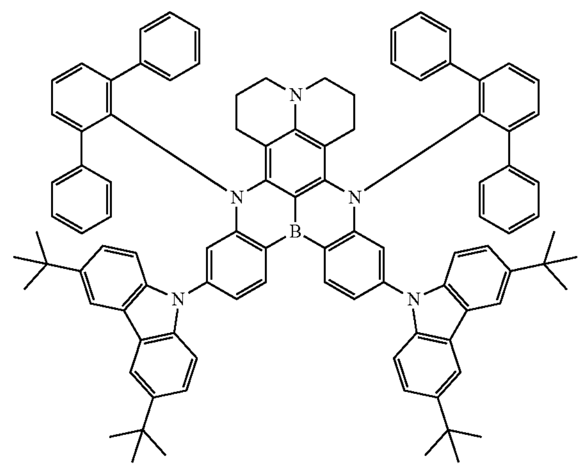

-continued
7
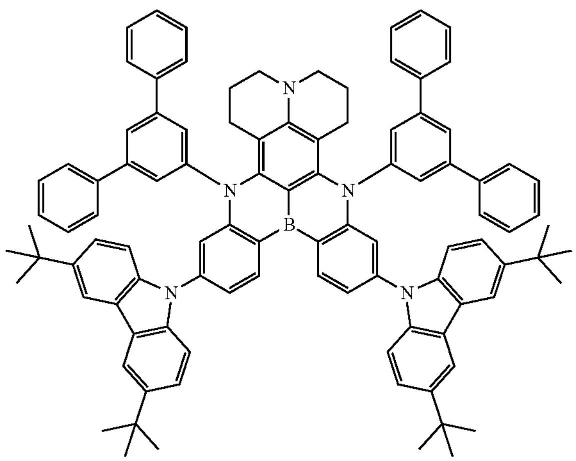
8
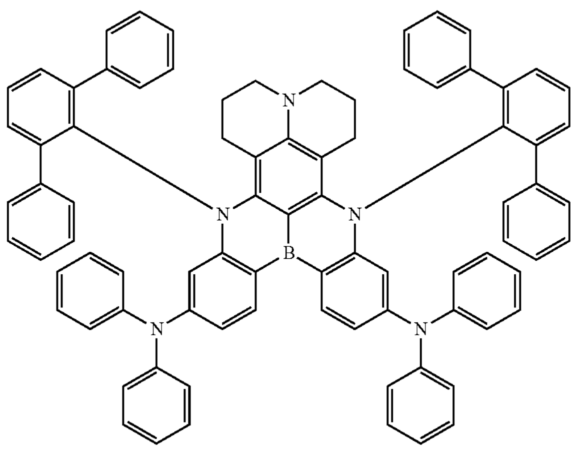
9
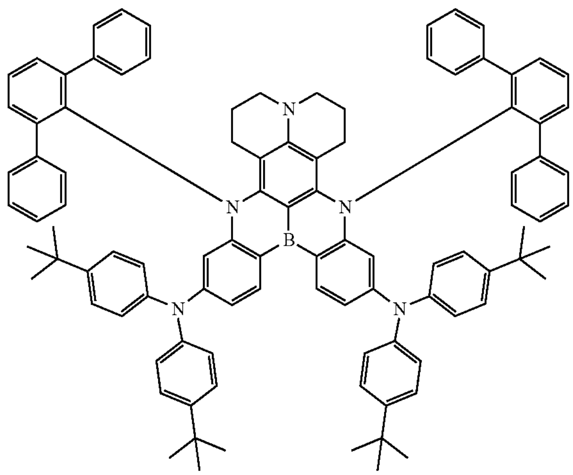
-continued
10
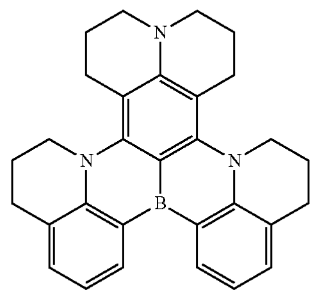
11
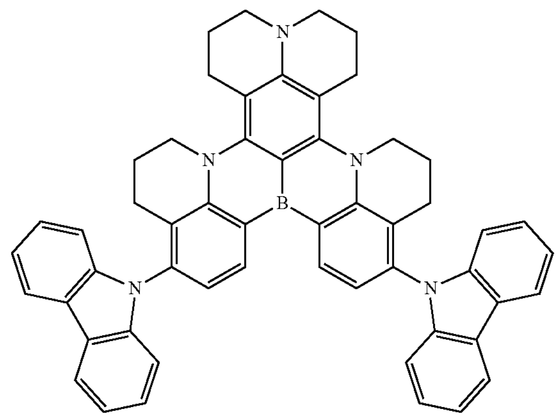
12
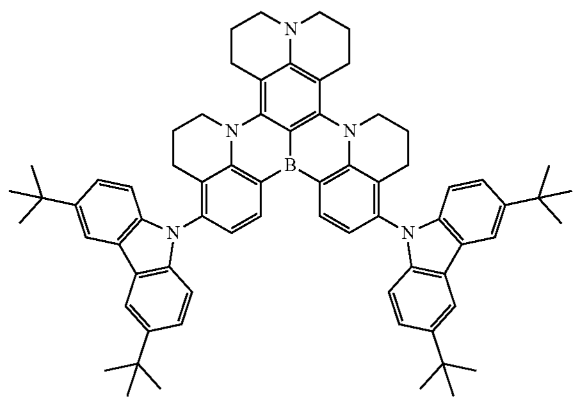
13
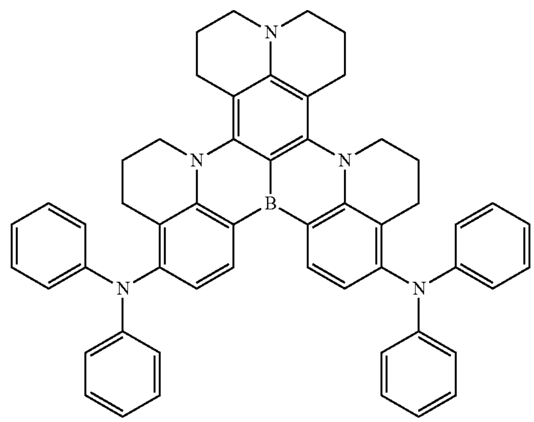

-continued
14
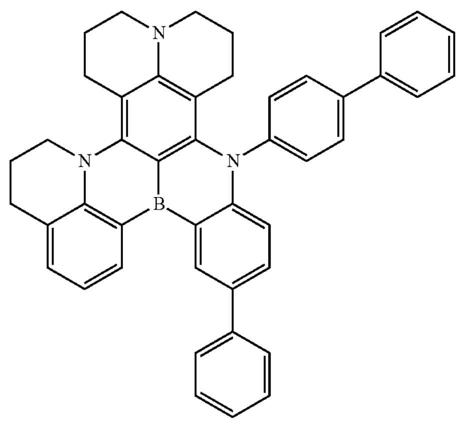
15
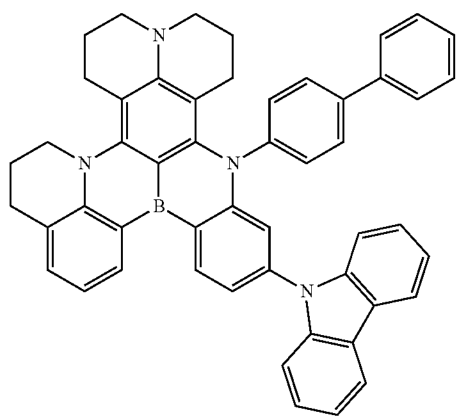
16
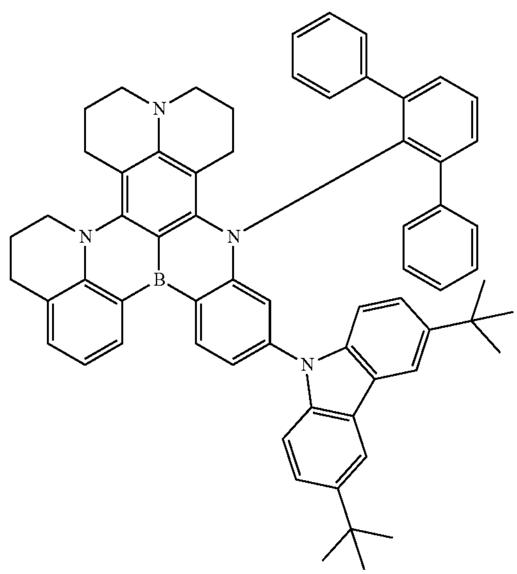
-continued
17
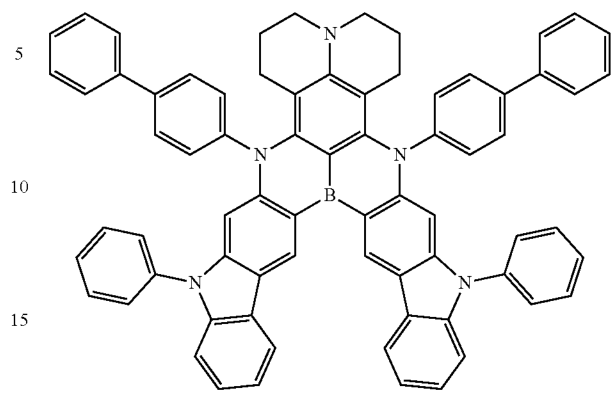
18
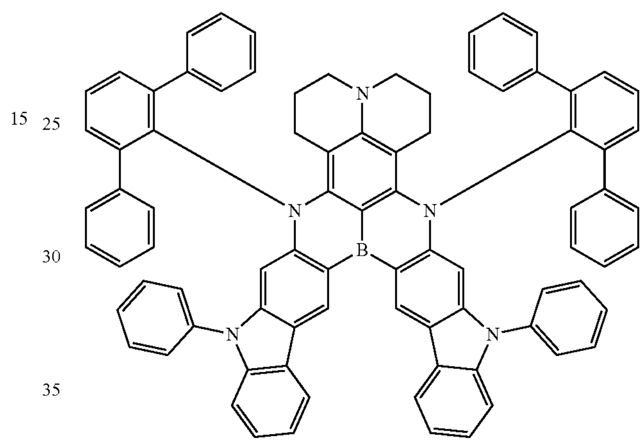
19
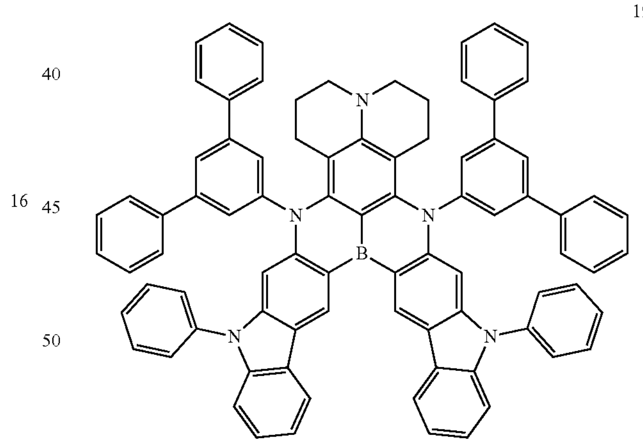
20
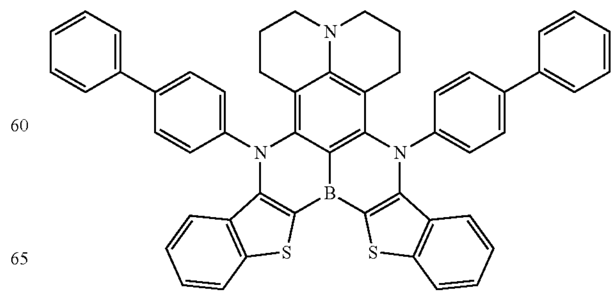

-continued
21
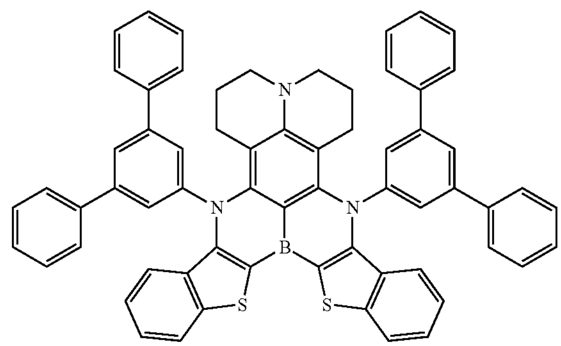
22
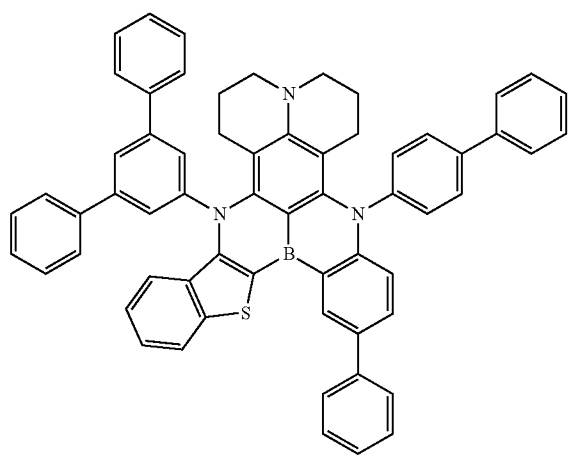
23
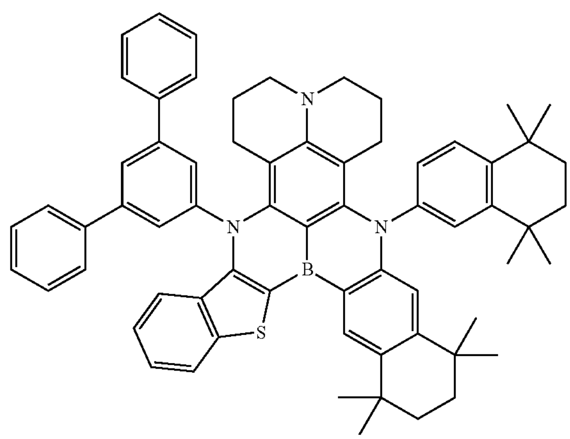
-continued
24
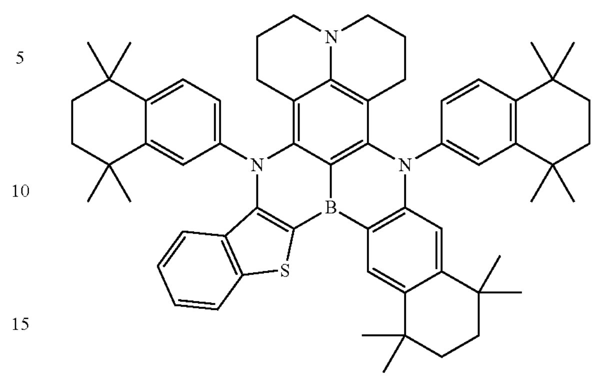
25
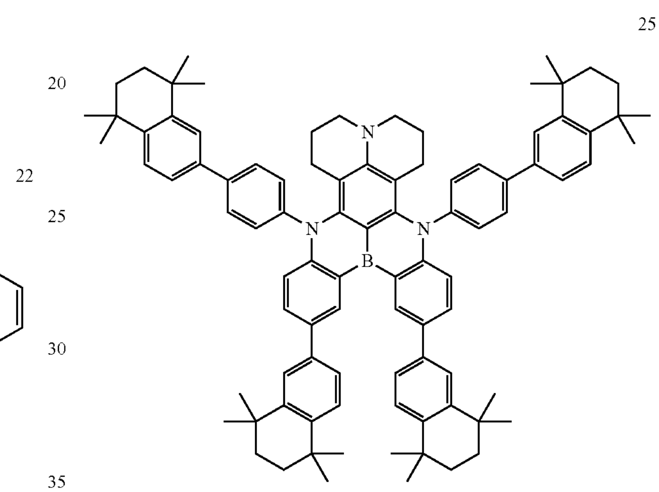
26
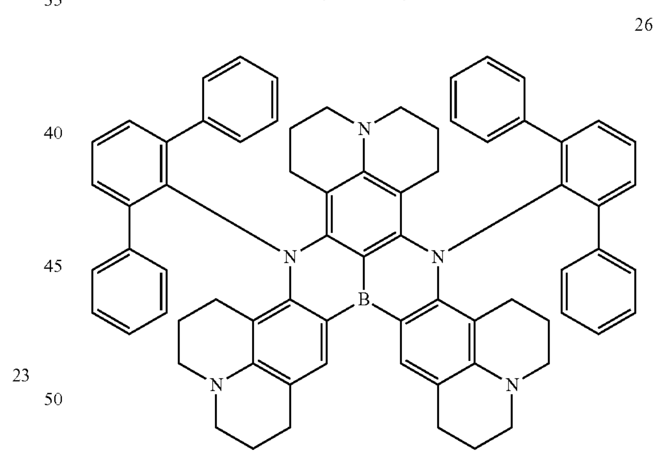
27
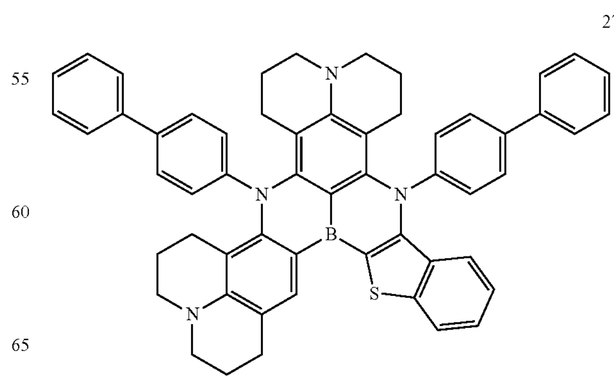

-continued

28

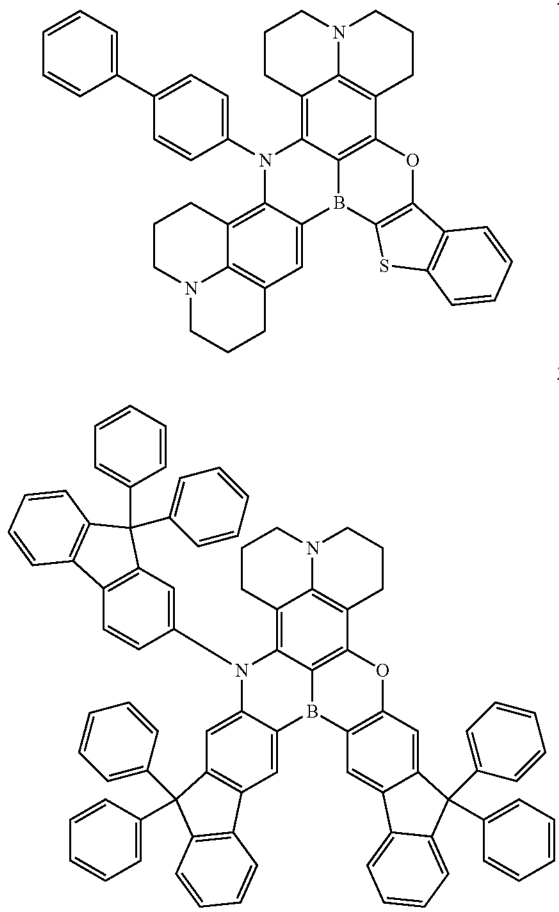

29

22. A display apparatus comprising:

a light emitting device, comprising:

a first electrode;

a hole transport region disposed on the first electrode;

an emission layer disposed on the hole transport region;

an electron transport region disposed on the emission layer; and a second electrode disposed on the electron transport region, wherein the emission layer comprises a fused polycyclic compound represented by Formula 1, and the hole transport region comprises a compound represented by Formula H-a:

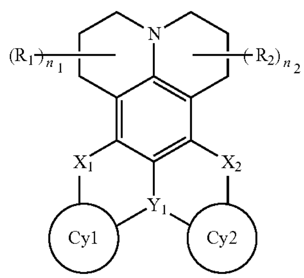

wherein in Formula 1, $X_1$ and $X_2$ are each independently N ($R_3$), O, or S, when $X_1$ is S then $X_2$ is N ($R_3$) and when $X_2$ is S then $X_1$ is N ($R_3$), $Y_1$ is B, $R_1$ and $R_2$ are each independently a hydrogen atom, a deuterium atom, a halogen atom, a cyano group, a substituted or unsubstituted amine group, a substituted or unsubstituted alkyl group of 1 to 30 carbon atoms, a substituted or unsubstituted aryl group of 6 to 60 ring-forming carbon atoms, or a substituted or unsubstituted heteroaryl group of 2 to 60 ring-forming carbon atoms, $R_3$ is a hydrogen atom, a deuterium atom, a halogen atom, a substituted or unsubstituted alkyl group of 1 to 30 carbon atoms, a substituted or unsubstituted aryl group of 6 to 60 ring-forming carbon atoms, or a substituted or unsubstituted heteroaryl group of 2 to 60 ring-forming carbon atoms, or is combined with an adjacent group to form a ring, $n_1$ and n2 are each independently an integer from 0 to 6, and Cy1 and Cy2 are each independently a substituted or unsubstituted aromatic hydrocarbon ring of 6 to 60 ring-forming carbon atoms, or a substituted or unsubstituted aromatic heterocycle of 2 to 60 ring-forming carbon atoms, or are combined with an adjacent group to form a ring:

[Formula H-a]

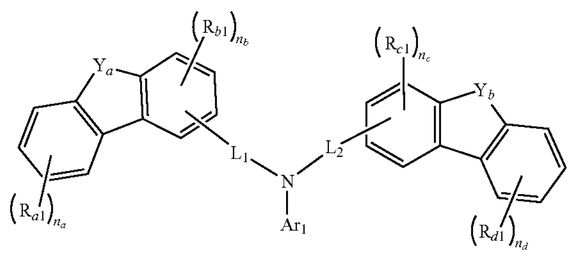

wherein in Formula H-a, $Y_a$ and $Y_b$ are each independently C ($R_{e1}$) ($R_{f1}$), N ($R_{g1}$), O, or S, $Ar_1$ is a substituted or unsubstituted aryl group of 6 to 30 ring-forming carbon atoms, or a substituted or unsubstituted heteroaryl group of 2 to 30 ring-forming carbon atoms, $L_1$ and $L_2$ are each independently a direct linkage, a substituted or unsubstituted arylene group of 6 to 30 ring-forming carbon atoms, or a substituted or unsubstituted heteroarylene group of 2 to 30 ring-forming carbon atoms, $R_{a1}$ to $R_{g1}$ are each independently a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, na and nd are each independently an integer from 0 to 4, and nb and nc are each independently an integer from 0 to 3.

* * * * *